(12) United States Patent
Hashimoto et al.

(10) Patent No.: US 9,660,119 B2
(45) Date of Patent: May 23, 2017

(54) POLYESTER FILM, METHOD FOR PRODUCING THE SAME, BACK SHEET FOR SOLAR CELL, AND SOLAR CELL MODULE

(71) Applicant: FUJIFILM Corporation, Tokyo (JP)

(72) Inventors: Kiyokazu Hashimoto, Shizuoka (JP); Yohei Aritoshi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 472 days.

(21) Appl. No.: 14/169,616

(22) Filed: Jan. 31, 2014

(65) Prior Publication Data

US 2014/0130867 A1 May 15, 2014

Related U.S. Application Data

(63) Continuation of application No. PCT/JP2012/069362, filed on Jul. 30, 2012.

(30) Foreign Application Priority Data

Aug. 25, 2011 (JP) .................................. 2011-184150
Feb. 3, 2012 (JP) .................................. 2012-021456

(51) Int. Cl.
*B32B 27/36* (2006.01)
*H01L 31/049* (2014.01)
(Continued)

(52) U.S. Cl.
CPC ............ *H01L 31/0487* (2013.01); *B29D 7/01* (2013.01); *C08J 5/18* (2013.01); *C08L 67/03* (2013.01);
(Continued)

(58) Field of Classification Search
None
See application file for complete search history.

(56) References Cited

U.S. PATENT DOCUMENTS 5,731,071 A * 3/1998 Etchu .................. B29C 55/12
174/110 SR
8,518,523 B2 * 8/2013 Hashimoto ............ B29C 47/00
264/176.1
(Continued)

FOREIGN PATENT DOCUMENTS

CN 101177491 A 5/2008
JP 2007268710 A 10/2007
(Continued)

OTHER PUBLICATIONS

Office action issued by SIPO on Nov. 14, 2014 in connection with corresponding Chinese Patent Application No. 201280040421.6.
(Continued)

*Primary Examiner* — Vivian Chen
(74) *Attorney, Agent, or Firm* — Edwards Neils LLC; Jean Edwards, Esq.

(57) ABSTRACT

A polyester film has excellent resistance to hydrolysis, excellent heat resistance in high temperatures and low humidity, and mechanical strength. The polyester film satisfies a stress heat resistant coefficient f(125)≥3 and a wet thermo retention (=100×S(120)/S(0)) of 30% or more. f(125) is a value obtained by substituting t=125° C. in an approximation represented by f(t); t represents a temperature (° C.) at thermo processing; f(t) represents a stress heat resistant coefficient f at the thermo temperature t and represents an approximation to a straight line obtained by linear approximation by a least squares method of values plotted from a relationship between the thermo temperature t and a logarithm (log T(t)) of time T at which a rupture stress is 50% when t is 150° C., 160° C., 170° C., or 180° C.; T(t) is a time (hr) at which the maximum stress in a tensile test after thermo processing at t° C. and 0% RH is 50% of the maximum stress in a tensile test before thermo processing;
(Continued)

S(120) is breaking elongation (%) after aging for 100 hours at 120° C. and 100% RH, and S(0) represents a breaking elongation (%) before aging.

9 Claims, 1 Drawing Sheet

(51) Int. Cl.
| | | |
|---|---|---|
| C08L 67/03 | (2006.01) | |
| C08G 63/127 | (2006.01) | |
| C08G 63/16 | (2006.01) | |
| C08G 63/181 | (2006.01) | |
| C08J 5/18 | (2006.01) | |
| H01L 31/048 | (2014.01) | |
| B29D 7/01 | (2006.01) | |
| B32B 27/06 | (2006.01) | |

(52) U.S. Cl.
CPC ............ *H01L 31/049* (2014.12); *B32B 27/06* (2013.01); *B32B 27/36* (2013.01); *B32B 2307/54* (2013.01); *B32B 2307/558* (2013.01); *B32B 2367/00* (2013.01); *B32B 2457/12* (2013.01); *C08G 63/127* (2013.01); *C08G 63/16* (2013.01); *C08G 63/181* (2013.01); *C08J 2367/02* (2013.01); *Y02E 10/50* (2013.01); *Y10T 428/31786* (2015.04)

(56) References Cited

U.S. PATENT DOCUMENTS

| | | | | |
|---|---|---|---|---|
| 8,609,255 B2* | 12/2013 | Aoyama | ............... | H01L 31/048 428/213 |
| 8,637,764 B2* | 1/2014 | Nozawa | ............... | H01L 31/049 136/256 |
| 8,642,715 B2* | 2/2014 | Hashimoto | ............... | C08J 5/18 428/480 |
| 8,658,285 B2* | 2/2014 | Hinton | ................. | B29C 55/065 264/165 |
| 8,981,212 B2* | 3/2015 | Aoyama | .................... | C08J 5/18 136/259 |
| 8,987,440 B2* | 3/2015 | Shoji | .................... | C07D 498/10 540/469 |
| 2009/0065055 A1* | 3/2009 | Fujii | ....................... | B32B 27/20 136/259 |
| 2010/0000603 A1* | 1/2010 | Tsuzuki | ............ | B32B 17/10018 136/259 |
| 2012/0080089 A1* | 4/2012 | Aoyama | .................... | C08J 5/18 136/256 |
| 2012/0178897 A1* | 7/2012 | Nozawa | ................ | H01L 31/049 528/308.1 |
| 2012/0192944 A1* | 8/2012 | Aoyama | ............... | H01L 31/048 136/256 |
| 2013/0012665 A1* | 1/2013 | Nozawa | ................. | C08G 63/85 525/437 |
| 2013/0319525 A1* | 12/2013 | Nakai | ..................... | B29C 55/14 136/259 |
| 2013/0340830 A1* | 12/2013 | Aritoshi | ................. | B32B 27/36 136/259 |
| 2014/0190562 A1* | 7/2014 | Teshima | ............. | H01L 31/0487 136/256 |

FOREIGN PATENT DOCUMENTS

| | | | |
|---|---|---|---|
| JP | 2010003900 A | | 1/2010 |
| JP | 2010-212272 | * | 9/2010 |
| JP | 2010-235824 | * | 10/2010 |
| JP | 2010-235824 A | * | 10/2010 |
| JP | 2010-248492 | * | 11/2010 |
| JP | 2010-248492 A | * | 11/2010 |
| JP | 2010-248492 A | | 11/2010 |
| JP | 2010-260903 | * | 11/2010 |
| JP | 2010-260903 A | | 11/2010 |
| JP | 2010-260903 A | * | 11/2010 |
| JP | 2011-021180 | * | 2/2011 |
| JP | 2011021180 A | | 2/2011 |
| JP | 4678073 B1 | | 4/2011 |
| JP | 2012-041425 | * | 3/2012 |
| WO | 2007105306 A1 | | 9/2007 |
| WO | WO 2010-140611 | * | 12/2010 |
| WO | WO 2011-030896 | * | 3/2011 |
| WO | WO 2011-087043 | * | 7/2011 |

OTHER PUBLICATIONS

International Search Report issued in PCT/JP2012/069362 on Oct. 16, 2012.
Written Opinion issued in PCT/JP2012/069362 on Oct. 16, 2012.
Third Party Submission in Japanese Application No. 2012-153763 on Oct. 26, 2015 received by Applicants Nov. 4, 2015.
Third Party Submission presented to JPO on Apr. 18, 2014, in connection with corresponding Japanese Patent Application No. 2012-153763.
HP of Mitsui Chemical Analysis & Consulting Service, Inc.; "Measurement of Crystallization Degree of Polymer by X-ray Diffraction Analysis"; http://goo.gl/CCNFUY.
Handbook of Saturated Polyester Resins; edited by Kazuo Yugi; 1989; pp. 217-228; First Edition; Nikkan Kogyo Shinbun, Ltd.
Third Party Submission in Japanese Application No. 2012-153763 on Jul. 22, 2015 received by Applicants Aug. 18, 2015.

* cited by examiner

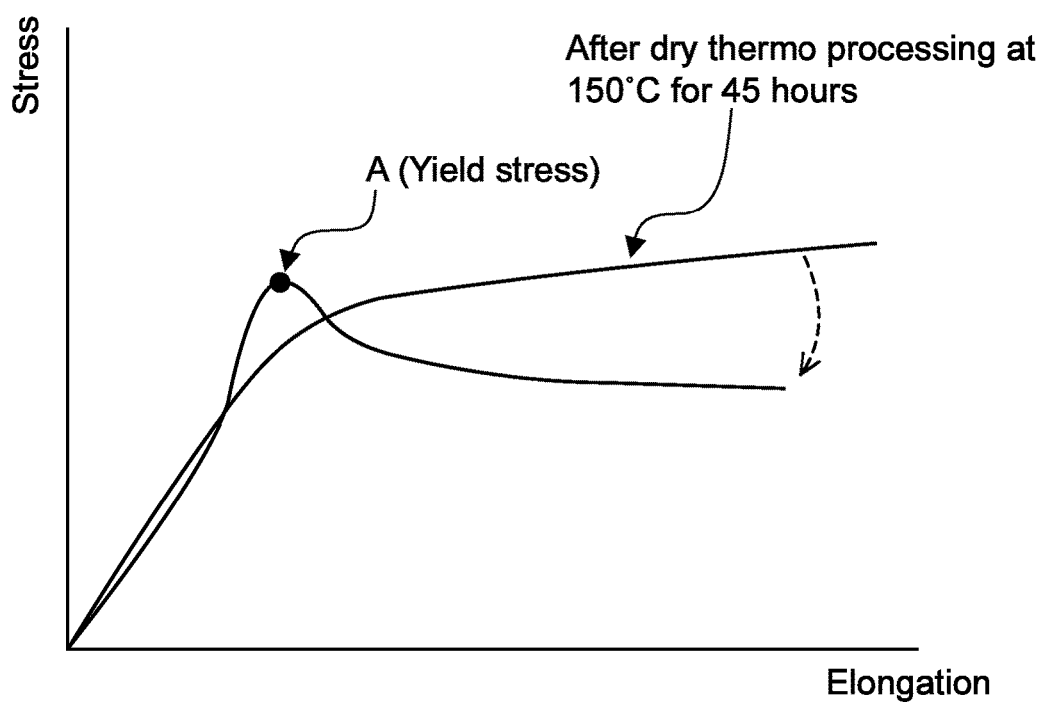

POLYESTER FILM, METHOD FOR PRODUCING THE SAME, BACK SHEET FOR SOLAR CELL, AND SOLAR CELL MODULE

CROSS-REFERENCE TO RELATED APPLICATION

This application is a continuation application of, and claims priority to, International Application No. PCT/JP2012/069362, filed Jul. 30, 2012, which is incorporated herein by reference, and which was published under PCT Article 21(2) in Japanese. Further, this application claims priority from Japanese Patent Application Nos. 2011-184150, filed Aug. 25, 2011, and 2012-021456, filed Feb. 3, 2012, which are incorporated herein by reference.

BACKGROUND OF THE INVENTION

Technical Field

The present invention relates to a polymer film, a method for producing a polymer film, a back sheet for a solar cell, and a solar cell module.

Background Art

Polyesters have been used for various applications such as electric insulation applications or optical applications. As electric insulation applications, solar cell applications in particular, such as a back face protective sheet (a "back sheet") for a solar cell, have recently attracted much attention.

Further, polyesters generally have large numbers of carboxyl groups or hydroxyl groups on the surfaces thereof, which may result in frequent occurrence of hydrolysis reactions in an environment where moisture is present and in the degradation of polyesters over time. For example, solar cell modules are generally used in environments that are constantly exposed to wind and rain, such as outdoor environments; that is, solar cell modules are exposed to environments where hydrolysis reactions readily proceed. Therefore, in cases in which polyesters are used for solar cell applications, an important task is to suppress the hydrolyzability of polyesters.

As a technique for enhancing hydrolysis resistance and improving resistance to climatic conditions and heat resistance, a polyester film for a solar cell, which is obtained by adding an ultraviolet absorbent to a polyester obtained by polymerization using polycondensation catalysts including an aluminum-containing compound and a phosphorus-containing compound, and in which a prescribed carboxyl terminal concentration and IV are regulated, has been disclosed, for example (see, for example, Japanese Patent Application Laid-Open (JP-A) No. 2011-21180). In addition, a polyester resin sheet for a solar cell, in which a layer of a polyester resin having a prescribed number average molecular weight and a $TiO_2$ layer are provided (see, for example, International Publication No. (WO) 2007/105306 pamphlet), a polyester film having a prescribed X-ray diffraction intensity ratio (see, for example, JP-A No. 2007-268710), a polyester film for a solar cell back face protective film, the polyester film being formed from a polyester containing an ethylene terephthalate unit and a polyester containing a butylene naphthalate unit, and having a prescribed intrinsic viscosity and plane orientation coefficient (see, for example, JP-A No. 2010-3900), and a hydrolysis resistant polyester film which includes a hindered phenol structural unit and has a prescribed acid value and intrinsic viscosity (see, for example, Japanese Patent No. 4678073), have been disclosed.

In all of these techniques, the breaking elongation after heating has attracted attention, and there have attempts to enhance the light resistance or heat resistance by improving this property.

Further, in the Patent Document (JP-A No. 2011-91303), the use of a PET for a back sheet, the PET having a relative temperature index of 100° C. and improved hydrolysis resistance, is described; however, the heat resistance thereof is resistance to temperatures not higher than 105° C. and the resistance to climatic conditions is insufficient, such that the improvements are essentially insufficient.

Moreover, from the viewpoint of hydrolysis resistance, the molecular weight of polyester is liable to be lowered significantly due to a hydrolysis reaction in a high humidity environment ("wet thermo conditions"), and since the lowering of molecular weight directly causes embrittlement, it is important to increase the breaking elongation of the polyester.

SUMMARY OF INVENTION

According to an aspect of the present invention, a polyester film which has excellent resistance to hydrolysis, excellent heat resistance in high temperatures and low humidity, and mechanical strength, and a method for producing such a polyester film are provided. The polyester film satisfies a stress heat resistant coefficient $f(125) \geq 3$ and has a wet thermo retention $(=100 \times S(120)/S(0))$ of 30% or more. $f(125)$ is a value obtained by substituting $t=125°$ C. in an approximation represented by $f(t)$; t represents a temperature (° C.) at thermo processing; $f(t)$ represents a stress heat resistant coefficient f at the thermo temperature t and represents an approximation to a straight line obtained by linear approximation by a least squares method of values plotted from a relationship between the thermo temperature t and a logarithm (log T(t)) of time Tat which a rupture stress is 50% when t is 150° C., 160° C., 170° C., or 180° C.; T(t) is a time (hr) at which the maximum stress in a tensile test after thermo processing at t° C. and 0% RH is 50% of the maximum stress in a tensile test before thermo processing; S(120) is breaking elongation (%) after aging for 100 hours at 120° C. and 100% RH, and S(0) represents a breaking elongation (%) before aging.

Technical Problem

However, in the case of using a polyester for, for example, solar cell applications such as a back face protective sheet (back sheet) of a solar cell or the like, solar cells may generally be placed in the open-air such as on a roof, or in a desert region, and may be exposed to high temperatures of 80° C. or higher. In such a dry environment, thermal decomposition or oxidation decomposition easily occurs, rather than hydrolysis. Therefore, in the polyester, denaturation of molecules proceeds more easily than lowering of molecular weight.

Accordingly, although embrittlement (breaking elongation) does not change significantly, changes in the higher-order structure easily occur in conjunction with denaturation, and therefore, the mechanical strength (maximum stress) is vulnerable to being easily lowered. As described above, in the conventional techniques, an effect can be expected to a certain extent in terms of suppression of the lowering of the breaking elongation; however, in a high temperature environment (a dry thermo environment), the maximum stress of polyester is reduced significantly, and the desired mechanical strength cannot be retained.

The present invention has been made in view of the above-noted circumstances, particularly in view of resistance in a dry thermo environment related to heat resistance and, specifically, by focusing on the maximum stress of polyester.

Namely, an object of the invention is to provide a polyester film which has excellent resistance to hydrolysis in a high temperatures and high humidity environment (a wet thermo environment) as well as having excellent heat resistance in a high temperature and low humidity environment (a dry thermo environment), and has a mechanical strength that is stably retained over a long period of time, a method for producing the same, a back sheet for a solar cell, the back sheet having excellent long-term durability, and a solar cell module, with which stable power generation performance is obtained over a long period of time. The task of the invention is to accomplish the above object.

Solution to Problem

The present inventors have found that in a polyester which exhibits mechanical strength (maximum stress) due to the crystal structure or constrained non-crystal (a structure between crystal and non-crystal), which is similar to the crystal structure, when the polyester molecule is denatured by oxidation, thermal decomposition, or the like, the regularity is lowered, and the constrained non-crystal is reduced, and based on this finding, the invention has been accomplished.

Specific means for addressing the above problems are as follows.

<1> A polyester film, having a stress heat resistant coefficient f(125) that satisfies the following Equation (1) and a wet thermo retention represented by the following Equation (2) of 30% or higher:

[A] stress heat resistant coefficient $f(125) \geq 3$    Equation (1)

[B] wet thermo retention(%)=$100 \times S(120)/S(0)$    Equation (2)

wherein, in Equation (1), f(125) is a value obtained by substituting t=125° C. in an approximation represented by f(t); t represents a temperature (° C.) at a time of heat treatment (thermo processing); f(t) represents a stress heat resistant coefficient f at a thermo temperature t and represents an approximation to a straight line obtained by linear approximation by a least squares method of values plotted from a relationship between the thermo temperature t and a logarithm (log T(t)) of time T at which a rupture stress is 50% when the thermo temperature t is 150° C., 160° C., 170° C., or 180° C.;

T(150) is a time (hr) at which the maximum stress in a tensile test after thermo processing at 150° C. and 0% RH is 50% of the maximum stress in a tensile test before thermo processing;

T(160) is a time (hr) at which the maximum stress in a tensile test after thermo processing at 160° C. and 0% RH is 50% of the maximum stress in a tensile test before thermo processing;

T(170) is a time (hr) at which the maximum stress in a tensile test after thermo processing at 170° C. and 0% RH is 50% of the maximum stress in a tensile test before thermo processing;

T(180) is a time (hr) at which the maximum stress in a tensile test after thermo processing at 180° C. and 0% RH is 50% of the maximum stress in a tensile test before thermo processing; and S(120) represents a breaking elongation (%) after aging for 100 hours at 120° C. and 100% RH, and S(0) represents a breaking elongation (%) before aging at 120° C. and 100% RH.

<2> The polyester film according to the item <1>, wherein the maximum stress in a tensile test after dry thermo processing for 48 hours at 150° C. and 0% RH is in a range of from 180 MPa to 230 MPa.

<3> The polyester film according to the item 1 or the item <2>, wherein a yield stress in a tensile test after dry thermo processing for 100 hours at 180° C. and 0% RH is in a range of from 95 MPa to 120 MPa.

<4> The polyester film according to any one of the items <1> to <3>, wherein a half-value stress period, at which the maximum stress in the tensile test after dry thermo processing at 180° C. and 0% RH reaches 50% of the maximum stress in the tensile test before dry thermo processing, is 500 hours or more.

<5> The polyester film according to any one of the items <1> to <4>, wherein the polyester film includes a polyester having an intrinsic viscosity (IV) in a range of from 0.65 dL/g to 0.9 dL/g and a terminal carboxyl group content (AV) of 20 eq/ton or less.

<6> A method for producing a polyester film containing a polyester having an intrinsic viscosity (IV) in a range of from 0.65 dL/g to 0.9 dL/g and a terminal carboxyl group content (AV) of 20 eq/ton or less, the method including:
  an extruding process including:
    adding a polyester fine particle, having a crystallization degree higher by 5% to 20% than a crystallization degree of a raw material polyester resin, to a raw material polyester resin at an amount of from 0.001% by mass to 0.1% by mass with respect to an amount of the raw material polyester resin;
    melt-extruding the polyester raw material included with the polyester fine particle into a sheet form by melt-kneading; and
    cooling the polyester in the sheet form on a casting drum to form a polyester sheet;
  a stretching process including subjecting the molded polyester sheet to longitudinal stretching in a longitudinal direction and horizontal stretching in a width direction perpendicular to the longitudinal direction, to form a film; and
  a heat setting process including, after the stretching process, heating the polyester film to perform crystallization, thereby performing heat setting.

<7> The method for producing a polyester film according to the item <6>, wherein a crystallization degree of the polyester in sheet form is in a range of from 0.5% to 10%.

<8> The method for producing a polyester film according to the item <6> or the item <7>, further including adding an end cap agent in an amount of 0.1% by weight to 10% by weight with respect to a total amount of the raw material polyester resin.

<9> The method for producing a polyester film according to any one of the items <6> to <8>, further including reacting the end cap agent with a terminal carboxyl group of the polyester.

<10> The method for producing a polyester film according to the item <8> or the item <9>, wherein the end cap agent includes a carbodiimide group and a cyclic structure in which the first nitrogen atom and the second nitrogen atom of the carbodiimide group are connected with a connecting group.

<11> The method for producing a polyester film according to any one of the items <1> to <10>, wherein the polyester film includes at least one layer including a CHDM-based polyester resin which contains a structural unit derived from 1,4-cyclohexanedimethanol (CHDM) in an amount of from 0.1% by mole to 100% by mole with respect to a total amount of structural units derived from a diol compound.

<12> The method for producing a polyester film according to the item <11>, wherein the layer including the CHDM-based polyester resin contains a structural unit derived from 1,4-cyclohexanedimethanol (CHDM) in an amount of from 0.1% by mole to 20% by mole or from 80% by mole to 100% by mole, with respect to a total amount of structural units derived from a diol compound.

<13> The method for producing a polyester film according to any one of the items <6> to <12> wherein a neck-in length, when the polyester sheet is longitudinally stretched, is in a range of from 10% to 35%.

<14> The method for producing a polyester film according to any one of the items <6> to <138>, wherein the longitudinal stretching is performed such that a surface temperature of the polyester sheet becomes higher by from 1° C. to 10° C. from an inlet side toward an outlet side in a region to be longitudinally stretched.

<15> The method for producing a polyester film according to any one of the items <6> to <14>, wherein the heat setting is performed at a heat setting temperature in a range of from 180° C. to 210° C. and heating is performed while applying temperature modulation within a range of from 1° C. to 20° C., at the time of heat setting.

<16> The method for producing a polyester film according to any one of the items <6> to <15>, wherein a crystallization degree of the raw material polyester resin is in a range of from 30% to 50%.

<17> The method for producing a polyester film according to any one of the items <6> to <16>, wherein an addition amount of the polyester fine particle is in a range of 0.002% by mass to 0.05% by mass with respect to a mass of the raw material polyester resin.

<18> A polyester film produced by the method for producing a polyester film according to any one of the items <6> to <17>.

<19> A back sheet for a solar cell including the polyester film according to any one of the items <1> to <5> or <18>, or including the polyester film produced by the method for producing a polyester film according to any one of the items <6> to <17>.

<20> A solar cell module, including: a transparent front substrate through which sunlight enters; a cell structural portion including a solar cell element and a sealing material that seals the solar cell element, the cell structural portion being disposed on the front substrate; and the back sheet for a solar cell according to the item <19>, the back sheet being disposed at an opposite side from a side at which the front substrate is disposed with respect to the cell structural portion.

ADVANTAGEOUS EFFECTS OF INVENTION

According to the invention, a polyester film which has excellent resistance to hydrolysis in a high temperature and high humidity environment (wet thermo environment) as well as has excellent heat resistance in a high temperature and low humidity environment (dry thermo environment) and has a mechanical strength that is stably retained over a long period of time, and a method for producing the polyester film may be provided.

Further, according to the invention, a solar cell back sheet having excellent long-term durability may be provided.

Moreover, according to the invention, a solar cell module, with which stable power generation performance is obtained over a long period of time, may be provided.

BRIEF DESCRIPTION OF DRAWINGS

The FIGURE is an explanatory drawing showing yield stress.

DESCRIPTION OF EMBODIMENTS

Hereinafter, a polyester film of the present invention, a method for producing the same, a solar cell back sheet using the same, and a solar cell module are described in detail.
<Polyester Film and Method for Producing the Same>

A polyester film of the invention is configured such that the stress heat resistant coefficient f(125) described below satisfies the following Equation (1) and that the wet thermo retention represented by the following Equation (2) is 30% or higher.

[A] Stress heat resistant coefficient $f(125) \geq 3$     Equation (1)

[B] Wet thermo retention(%)=$100 \times S(120)/S(0)$     Equation (2)

In Equation (1) above, f(125) is the value obtained by substituting t=125° C. in the approximation represented by f(t), and t represents the temperature (° C.; in the present specification, referred to as "thermo temperature") at the time of heat treatment (thermo processing).

Here, f(t) above represents the stress heat resistant coefficient f at the thermo temperature t, and represents an approximation to a straight line obtained by linear approximation by the least squares method of the values plotted from the relationship between the thermo temperature t and the logarithm (log T(t)) of time T at which the rupture stress is 50% when the thermo temperature t is 150° C., 160° C., 170° C., or 180° C.

The time T at which the rupture stress is 50% at the thermo temperature t in each of the above temperatures is as follows:
  T(150): the time (hr) at which the maximum stress in a tensile test after thermo processing at 150° C. and 0% RH is 50% of the maximum stress in a tensile test before thermo processing.
  T(160): the time (hr) at which the maximum stress in a tensile test after thermo processing at 160° C. and 0% RH is 50% of the maximum stress in a tensile test before thermo processing.
  T(170): the time (hr) at which the maximum stress in a tensile test after thermo processing at 170° C. and 0% RH is 50% of the maximum stress in a tensile test before thermo processing.
  T(180): the time (hr) at which the maximum stress in a tensile test after thermo processing at 180° C. and 0% RH is 50% of the maximum stress in a tensile test before thermo processing.

In Equation (2), S(120) represents the breaking elongation (%) after aging for 100 hours at 120° C. and 100% RH, and S(0) represents the breaking elongation (%) before aging at 120° C. and 100% RH.

For example, a solar cell is used by further pasting a back face protective sheet (a so-called back sheet), which is prepared by using a polyester film or the like, to a cell side substrate which is obtained by disposing a solar battery cell embedded in a sealing agent, such as EVA, on a glass substrate or the like. In such a laminate structure, for example, in a case in which the solar cell is placed in the open-air such as on a roof, a desert region, or the like, when the usage environment of the solar cell reaches a temperature range exceeding 80° C., the sealing agent layer of EVA or the like undergoes thermal expansion and get loose, and moreover, the elasticity of the EVA or the like is lowered, and thus self-supportability is reduced. Accordingly, in a case in which the self-supportability of the sealing agent layer is reduced, it is necessary for the polyester film, which constitutes the back sheet, to support the laminate structure. From the viewpoint of supporting the weight in this case, the maximum stress of the polyester film becomes important. In a usage environment as described above, since the temperature exceeds the glass transition temperature (Tg) of polyester, the mechanical strength is easily lowered, so that it is necessary to increase the maximum stress in advance in order to retain the desired shape. As described above, in the high temperature environment condition exceeding Tg, lowering of the maximum stress, rather than lowering of the breaking elongation, easily causes a significant problem.

Conventionally, various studies have been made from the viewpoint of breaking elongation, namely, from the viewpoint of wet heat resistance, as described above, but a technique which further enables to control the retention of mechanical strength, namely, suppression of lowering of stress relating to heat resistance, has not yet been established, and establishment of a technique which enables to stably maintain the shape or the like, even in a high temperature environment, by supplying the mechanical strength, has been required.

In the invention, in view of the above circumstances, while particularly paying attention to the stability when exposed to a high temperature and high humidity environment (in this specification, also referred to as "wet thermo environment") as the wet heat resistance, as well as the stability when exposed to a high temperature and low humidity environment (in this specification, also referred to as "dry thermo environment") as the heat resistance, the stress heat resistant coefficient (f125) is 3 or more and the wet thermo retention is 30% or higher, when the maximum temperature is taken as 125° C. on the assumption of being placed, for example, in the open-air such as on a roof, in a desert region, or the like. Thus, a polyester film in which wet heat resistance is maintained, and which has excellent heat resistance (dry thermo resistance) in a dry thermo environment is provided.

[A] Stress Heat Resistant Coefficient

The polyester film of the invention satisfies the following Equation (1).

$$\text{Stress heat resistant coefficient } f(125) \geq 3 \quad \text{Equation (1)}$$

Here, f(125) is the value obtained by substituting t=125° C. in the approximation represented by stress heat resistant coefficient f(t), when the thermo temperature is taken as t.

The stress heat resistant coefficient is an index that represents the degree of drop in stress after a high temperature treatment. The stress heat resistant coefficient f(125) being 3 or more indicates having heat resistance such that the time (hr), at which the maximum stress in a tensile test after performing heat treatment in an environment of 125° C. (0% RH) is 50% of the maximum stress in a tensile test before heat treatment, is 1000 hours or more. Namely, it means that, assuming the maximum temperature being 125° C. on the assumption of being placed, for example, in an open-air such as on a roof, in a desert region, or the like, lowering of maximum stress in a tensile test in an environment of being exposed to this high temperature is suppressed, and excellent heat resistance is exhibited.

f(t) is an approximation to a straight line obtained by linear approximation by the least squares method of the values plotted from the relationship between the thermo temperature t and the logarithm (log T(t)) of the time T at which the rupture stress is 50% when the thermo temperature t is 150° C., 160° C., 170° C., or 180° C. Specifically, for example, when the respective values of log T(t) at 150° C., 160° C., 170° C., and 180° C. are plotted on a two-dimensional graph which shows thermo temperature t on the horizontal axis and logarithm (log T(t)) of the time T at which the rupture stress is 50% at the thermo temperature t on the vertical axis, f(t) is an approximation to a straight line obtained by linear approximation by the least squares method of the values thus plotted.

The rupture stress is a value determined as the maximum stress in a tensile test at break when a sample to be measured is stretched until the sample breaks under the conditions of a distance between chucks of 12.5 cm and a tensile rate of 1.25 cm/min.

When the stress heat resistant coefficient f(125) is less than 3, in a solar cell prepared by pasting a sealing material of EVA or the like, for example, when exposed to a high temperature of 100° C. or higher, the polyester film may sag under the weight of the EVA or the like, resulting in causing disconnection of wiring which is wired inside the solar cell, thereby causing a breakdown. Further, when f(125) is less than the range according to the invention, ill effects may occur in the film forming method, breakage may occur easily, and as a result, the heat resistance is deteriorated.

In the invention, the stress heat resistant coefficient f(125) is more preferably a value that satisfies the following Equation (1-2), and is still more preferably a value that satisfies the following Equation (1-3), from the viewpoint of more stably retaining the mechanical strength for supporting the constituent part of the solar cell in a case in which the self-supportability of a constituent part, such as a sealing agent layer, in a solar cell is lowered.

$$5 \geq f(125) \geq 3.1 \quad \text{Equation (1-2)}$$

$$4 \geq f(125) \geq 3.2 \quad \text{Equation (1-3)}$$

Next, a method of determining the stress heat resistant coefficient is explained.

(i) A sample film is prepared as a measuring object, and this film is cut such that the size in the lengthwise direction (MD: machine direction), which is the longitudinal direction, and in the crosswise direction (TD: transverse direction), which is the width direction perpendicular to the longitudinal direction, is 2.5 cm in width×25 cm in length.

(ii) The film piece obtained by cutting is subjected to humidification for 2 days in an environment of 23° C. and 55% RH, and then subjected to pre-thermo processing (preliminary heating) for 48 hours (hr) at 150° C. and 0% RH. Here, the pre-thermo processing is so-called dry thermo processing, and by performing the pre-thermo processing, the residual strain of the film is cancelled and the stress is adjusted to the initial state.

In this process, the maximum stress in a tensile test after dry thermo processing at 150° C. for 48 hr is preferably from 180 MPa to 230 MPa, in both MD and TD, more preferably from 185 MPa to 225 MPa, and still more preferably from 190 MPa to 220 MPa.

The rupture stress in the case of 150° C. and 48 hr is the initial stress in the measurement of the stress resistant time. Generally, the initial stress of a polyester, which is reputed to have resistance to climatic conditions, is 250 MPa or more. In contrast, the polyester film of the invention is characterized in that the initial stress thereof is from 180 MPa to 230 MPa, and that the initial stress is lower than that of a generally used polyester film. The reason is as follows.

Namely, in the case of a polyester film having a high initial stress, not only the crystals but also the amorphous structures inside the polyester are all strongly oriented, and thus, the molecules do not have sags (rooms) and the breaking elongation is small (the polyester film is liable to be embrittled). When such a film is damaged (molecular disconnection) due to thermo processing, embrittlement proceeds still more easily, and as a result, the film breaks, and the stress heat resistance is liable to be deteriorated.

The maximum stress in the tensile test after dry thermo processing at 150° C. for 48 hr being 180 MPa or more is effective, since the absolute strength can be maintained high, and when integrated into a solar cell, the disconnection of wiring inside the solar cell, which easily occurs when sag is generated in the sealing agent layer of EVA or the like because of its own weight, is more effectively avoided.

(iii) Plural sheets of film piece described above are prepared, and are again subjected to humidification for 2 days in an environment of 23° C. and 55% RH. Thereafter, the film pieces are each put in an oven with the thermo temperature being set at 150° C., 160° C., 170° C., and 180° C., respectively.

(iv) In this process, the film piece is taken out every 1000 hours in the case of 150° C., every 500 hours in the case of 160° C., every 200 hours in the case of 170° C., and every 100 hours in the case of 180° C., and the tensile stress is measured under the following conditions.

Also regarding the film pieces which are only subjected to the pre-thermo processing, the tensile stress is measured as blank.

Measurement of the tensile stress can be conducted by the following method.

The film piece is subjected to humidification for 2 days in an environment of 23° C. and 55% RH, and thereafter, in the same temperature and humidity, the film piece is stretched under the measurement conditions of a distance between chucks of 12.5 cm, a film width of 2.5 cm, and a tensile rate of 1.25 cm/min, thereby determining the maximum stress in the tensile test. The measurement is carried out five times, n=5, and the average value is determined, which is designated as the tensile stress.

(v) Subsequently, with regard to the respective film pieces that has been thermo-treated at a temperature of 150° C., 160° C., 170° C., or 180° C., using thermo time to enter the horizontal axis, the values of maximum stress retention in the tensile test, the values being determined from the following formula, are plotted on the vertical axis.

Maximum stress retention (%)=100×(Maximum stress in the tensile test at each thermo time)/ (Maximum stress in the tensile test after pre-thermo processing)

(vi) The time T (t) at which the maximum stress retention reaches 50% at the thermo temperature t (t=150° C., 160° C., 170° C., or 180° C.) is determined.

T(150): the time (hr) at which the maximum stress in the tensile test after thermo processing at 150° C. and 0% RH reaches 50% of the maximum stress in the tensile test before thermo processing.

T(160): the time (hr) at which the maximum stress in the tensile test after thermo processing at 160° C. and 0% RH reaches 50% of the maximum stress in the tensile test before thermo processing.

T(170): the time (hr) at which the maximum stress in the tensile test after thermo processing at 170° C. and 0% RH reaches 50% of the maximum stress in the tensile test before thermo processing.

T(180): the time (hr) at which the maximum stress in the tensile test after thermo processing at 180° C. and 0% RH reaches 50% of the maximum stress in the tensile test before thermo processing.

(vii) Using thermo time (t) to enter the horizontal axis, logarithm (log T(t)) of T(t) is plotted on the vertical axis, and the values thus plotted are linearly approximated by using the least squares method. The approximation thus obtained is taken as f(t).

(viii) The values obtained by substituting t=125° C. in f(t) are determined for MD and TD, respectively, and the lower value is designated as the stress heat resistant coefficient.

In the polyester film of the invention, the yield stress after dry thermo processing at 180° C. and 0% RH for 100 hours (hr) is preferably from 95 MPa to 120 MPa in both MD and TD.

The yield stress is a critical stress at which a film finishes showing elastic deformation, and as shown in the FIGURE, when the stress reaches point A, the strain gets larger and the stress gradually lowers, and the maximum stress in this tensile test is shown. Namely, in the range exceeding the yield stress, plastic deformation occurs, and after the deformation, the shape does not return back. Therefore, by heightening the yield stress in advance, the maximum stress of the film itself at the time of heating in the tensile test is heightened, and the heat resistance is enhanced.

When the yield stress is 95 MPa or higher, a high heat resistance is obtained, and the stress heat resistant time described above can be achieved. When the yield stress is 120 MPa or lower, the molecule (tie chain) that bridges between the crystals does not develop too much, and the heat resistance can be heightened while suppressing embrittlement. Thereby, concerns about ill effects that easily occur when prepared into a film are also reduced.

In the invention, the yield stress is more preferably in a range of from 100 MPa to 117 MPa, and still more preferably in a range of from 100 MPa to 112 MPa.

As described above, in order to let the stress heat resistant coefficient of the polyester film of the invention satisfy the above Equation (1), for example, it is thought that formation of a molecule (hereinafter, referred to as "tie chain") that bridges between crystals (and exists between two or more crystals) in the polyester film is effective. Polyester crystals themselves have high heat resistance, but by linking the crystal molecules together with a tie chain, still higher heat resistance (stress heat resistant time) can be achieved.

The amount of tie chain that exists can be expressed as an index of the yield stress. Examples of a method for forming the tie chain include a method of adding a polyester fine particle having a high crystallization degree (preferably having a crystallization degree higher by 5% to 20% than that of the raw material polyester resin) during melt kneading of polyester, as described below, and the like.

By bonding the crystals with a tie chain, a flow (plastic deformation) of crystal is suppressed, and therefore, plastic deformation of polyester film is suppressed, and thus elasticity of the film can be increased.

In the polyester film of the invention, the half-value stress period at which the maximum stress in the tensile test after thermo processing at 180° C. and 0% RH reaches 50% of the maximum stress in the tensile test before thermo processing is preferably 500 hours or more. Above all, the half-value stress period is more preferably from 600 hours to 3,000 hours, and still more preferably from 700 hours to 2,000 hours.

When the half-value stress period is 500 hours or more, embrittlement accompanying disconnection of polyester molecules due to heat decomposition may be suppressed, and in the case of being prepared into a solar cell by pasting with a sealing agent such as EVA or the like, breakage (separating) of polyester film caused by a stress (elastic stress) due to difference in the amount of expansion due to difference in heat expansion coefficient between the two is less likely to occur, and it is effective to prevent disconnection of wiring which is wired inside the solar cell. When the half-value stress period is 3,000 hours or less, crystallization never proceeds too much, and the heat resistance can be enhanced while suppressing the embrittlement.

In order to let the half-value stress period fall within the above range, one of preferable methods is a method of forming a tie chain as described above.

The half-value stress period according to the invention is determined from the maximum stress (tensile stress) determined by stretching under the tensile test measurement conditions described below.

[Tensile Test Measurement Conditions]

Distance between chucks in the tensile test machine: 12.5 cm

Film width: 2.5 cm

Tensile rate: 1.25 cm/min

[B] Wet Thermo Retention

In the polyester film of the invention, in addition to the above, the wet thermo retention represented by Equation (2) below is 30% or higher. The wet thermo retention is a retention ratio when exposed to a high temperature and high humidity environment, and specifically, refers to a ratio of a certain state after aging for 100 hours at 120° C. and 100% RH, relative to the state before aging.

In the invention, the polyester film has durability (the above-described stress heat resistance) in the dry thermo environment, and also has a favorable resistance to the hydrolysis reactions which are easily accelerated when placed in the open air or the like and exposed to rain or the like.

Wet thermo retention(%)=100×S(120)/S(0)  Equation (2)

In Equation (2) above, S(120) represents the breaking elongation (%) after aging for 100 hours at 120° C. and 100% RH, and S(0) represents the breaking elongation (%) before aging at 120° C. and 100% RH.

The breaking elongation (%) is an elongation percentage (%) at break when a sample piece having a size of 1 cm×20 cm is cut out from a polyester film and this sample piece is stretched under the conditions of a distance between chucks of 5 cm and a tensile rate of 20%/min.

When the wet thermo retention in the invention is less than 30%, hydrolysis easily proceeds when exposed to a high humidity environment due to rain or the like, and wet heat resistance is significantly deteriorated.

In the invention, the wet thermo retention is preferably from 40% to 100%, and more preferably from 50% to 95%. The wet thermo retention being higher than 100% means that the breaking elongation is increased during thermo processing, and indicates that the structure of film is not strong, namely, the growth of crystal or the like is insufficient and fluid, and thus, the structure deforms easily and, as a result, lowering of the stress heat resistance described above is caused. Therefore, the upper limited of the wet thermo retention is preferably 100%.

The hydrolysis resistance of a polyester film can be evaluated in accordance with the wet thermo retention which utilizes the change in breaking elongation retention. This is determined from the lowering of the breaking elongation when hydrolysis is accelerated by compulsory placing in a high temperature and high humidity environment to perform wet heat treatment (wet thermo processing).

In the polyester film of the invention, it is preferable that the intrinsic viscosity (which is also called IV, intrinsic viscosity) is from 0.65 dL/g to 0.9 dL/g, and the terminal carboxyl group content (AV) is 20 eq/ton or less, from the viewpoint of obtaining wet thermo durability. Above all, the case in which IV is from 0.68 dL/g to 0.85 dL/g and AV is from 2 eq/ton to 17 eq/ton is more preferable, and the case in which IV is from 0.7 dL/g to 0.82 dL/g and AV is from 5 eq/ton to 15 eq/ton is still more preferable.

When IV is 0.65 dL/g or more, the molecular weight of the polyester is maintained and a tie chain between crystals is easily formed, and thus, the yield stress can be more effectively exhibited. Thereby, the maximum stress in the tensile test of polyester can be stably maintained at a high level, and the heat resistance is enhanced. When IV is 0.9 dL/g or less, the molecular weight does not become too large, and the mobility of polyester molecule is retained. Thereby, crystal formation is easily carried out, and a tie chain between crystals can be more effectively formed, so that the maximum stress in the tensile test of polyester can be maintained high, and the heat resistance is enhanced.

IV is a value obtained by extrapolating the value obtained by dividing the specific viscosity ($\eta_{sp}=\eta_r-1$), which is obtained by subtracting 1 from the ratio $\eta_r$ ($=\eta/\eta_0$; relative viscosity) of the solution viscosity ($\eta$) to the solvent viscosity ($\eta_0$), by the concentration, so that the concentration becomes zero. IV is determined from the solution viscosity at 25° C., using a Ubbelohde viscometer, and dissolving the polyester in a mixed solvent of 1,1,2,2-tetrachloroethane/phenol (=2/3 [mass ratio]).

As for AV, polyester is completely dissolved in a mixed solution of benzyl alcohol/chloroform (=2/3; volume ratio), and the solution is titrated with a standard solution (0.025 N KOH-methanol mixed solution), using phenol red as an indicator, and from the titer, the terminal carboxyl group amount (eq/ton) is calculated.

AV indicates the amount of terminal carboxylic acid in polyester, and the existence of a terminal carboxylic acid shows a catalytic reaction with respect to the hydrolysis reaction of polyester. Accordingly, when AV is 20 eq/ton or less, the durability (wet heat resistance) in the wet thermo environment can be enhanced.

When the lower limit of AV is 2 eq/ton or more, the amount of carboxylic acid in the polyester is not too small, so that proceeding of oxidation reaction in the dry thermo environment can be suppressed. Thereby, tie chains are efficiently formed in the film, and the heat resistance is enhanced.

Note that, "equivalents (eq)/ton" represents molar equivalents per 1 ton.

The above AV and IV can be achieved by carrying out solid phase polymerization with respect to the polyester that has been synthesized or, as described below, by adding a polyester fine particle having a high crystallization degree.

Namely, above all, the solid phase polymerization is suitably carried out by performing heat treatment in a vacuum or in an inert gas stream (for example, $N_2$), under the temperature condition of preferably from 180° C. to 230° C., more preferably from 190° C. to 220° C., and still more preferably from 195° C. to 215° C., for a period of preferably from 10 hours to 100 hours, more preferably from 14 hours to 50 hours, and still more preferably from 17 hours to 30 hours.

By carrying out heat treatment for solid phase polymerization, IV is increased, and AV is decreased; however, when heat treatment is carried out at a high temperature for a short time, or at a low temperature for a long time, the oxidation reactions proceed easily, and AV is increased easily. In this case, although IV is maintained, AV is increased easily.

Further, in the case of adding a polyester fine particle, the raw material resin (pellets or the like) is melt-kneaded in a melt extruder; however, shear heat is generated due to the friction between the raw material resins (for example, pellets), which causes decomposition or disconnection of polyester molecule, and brings about decrease in IV and increase in AV. Therefore, when a polyester fine particle having a high crystallization degree exists in the raw material polyester resin at the time of melt-kneading, the fine particle functions as a slipping material, and thus, the increase in AV and the decrease in IV are suppressed. The polyester fine particle itself melts quickly, and it is hard to continue the effects of the invention; however, when a substance having a high crystallization degree is used, the substance functions as a lubricant in a resin for a long time during melt-kneading, and effectively works for preventing the increase in AV and the decrease in IV.

The method for producing a polyester film of the invention is not particularly limited as long as the method satisfies Equation (1) described above, and can make the wet thermo retention represented by Equation (2) equal to or higher than 30%, but the polyester film of the invention can be most preferably produced by the method for producing a polyester film of the invention, which is described below.

The method for producing a polyester film of the invention is a method for producing a polyester film that includes a polyester having a terminal carboxyl group content (AV) of 20 eq/ton or less and an intrinsic viscosity (IV) of from 0.65 to 0.9.

Specifically, the method is configured to include an original sheet formation process (extrusion and casting process) in which a polyester fine particle having a crystallization degree higher by 5% to 20% than that of the raw material polyester resin is added to a raw material polyester resin at an amount of from 0.001% by mass to 0.1% by mass with respect to the amount of the raw material polyester resin, and the polyester raw material added with the polyester fine particle through melt-kneading is melt-extruded in the form of sheet and cooled on a casting drum to form a polyester sheet (original sheet); a stretching process in which the polyester film thus formed is subjected to longitudinal stretching in the longitudinal direction, and horizontal stretching in the width direction perpendicular to the longitudinal direction, to form a film; and a heat setting process in which the polyester film that has been subjected to longitudinal stretching and horizontal stretching is heated to perform crystallization, thereby performing heat setting.

The method for producing a polyester film of the invention may further include other processes such as a heat relaxation process, a cooling process, or a collecting process, if necessary.

In the invention, it is preferable that an end cap agent is further contained in the polyester in an amount of from 0.1% by weight to 10% by weight, more preferably from 0.2% by weight to 5% by weight, and still more preferably from 0.3% by weight to 2% by weight.

Thereby, the formation of tie chain is accelerated, and it is possible to make it easier to satisfy Equation (1) above. The reason is guessed as follows.

The tie chain is a molecule that exists as a bridge between crystals, and when a carboxylic acid exists at the terminal of the molecule, the polarity is too strong, and thus, the tie chain is less likely to be incorporated in crystals. Therefore, when the carboxylic acid terminal is reacted (sealed) with the end cap agent, the polarity of the terminal is lowered, and the tie chain between crystals is likely to be formed.

When the amount of the end cap agent is less than the above range, the above effect is not realized, whereas when the amount exceeds the above range, the end cap agent becomes a foreign matter in the polyester, which suppresses the formation of crystal, and it becomes difficult to form a tie chain.

The end cap agent is an additive that reacts with the terminal carboxyl group of the polyester resin, and thereby reducing the amount of terminal carboxyl groups of the polyester resin.

Examples of the end cap agent include a carbodiimide compound, an oxazoline compound, an epoxy compound, and a carbonate compound. It is preferable that the polyester film of the invention contains at least one end cap agent selected from an isocyanate compound, a carbodiimide compound, or an epoxy compound, and it is more preferable that the polyester film of the invention contains two kinds of carbodiimide compounds.

The "end cap agents" may be used singly, or may be used in combination.

The end cap agent is more effective when the end cap agent is added together with the polyester resin at the time of film formation, since the reaction between the end cap agent and the terminal carboxyl group of the polyester proceeds together with the melt kneading of the polyester resin. It is preferable to use a carbodiimide compound. As a matter of course, solid phase polymerization and the end cap agent may be utilized at the same time. Alternatively, as long as the purposes or effects of the invention are not impaired, the end cap agent may be added in another process in the method for producing a polyester film of the invention. Further, separately, another process for promoting the reaction between the end cap agent and the terminal carboxyl group of the polyester may be provided. A more preferable end cap agent is a polycarbodiimide compound having the structure described below. This is because carbodiimide has high reactivity and efficiently reacts with the polyester terminal.

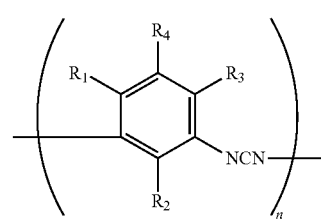

Formula (I)

wherein, in Formula (I), each of $R_1$, $R_2$, $R_3$ and $R_4$ independently represents a hydrogen atom or an alkyl group having 1 to 7 carbon atoms. n represents a number of the repeating unit.

Polycarbodiimide is a compound having a structure (a carbodiimido group) represented by (—N═C═N—), and can be produced, for example, by heating an organic isocyanate, in the presence of an appropriate catalyst, to perform decarboxylation reaction. In the synthesis process according to the invention, a first polycarbodiimide having a number average molecular weight of from 1,000 to 4,000 and a second polycarbodiimide having a number average molecular weight of 18,000 or more are used. As the number average molecular weight of polycarbodiimide, a number average molecular weight in terms of polystyrene standards may be used, which is obtained by dissolving polycarbodiimide powder in a solvent selected from chloroform, tetrahydrofuran (THF), N-methyl-2-pyrrolidone (NMP), or hexafluoroisopropanol (HFIP), and measuring the curve of the molecular weight distribution curve using GPC.

The above polycarbodiimide can be selected from compounds obtained by polymerizing aliphatic diisocyanate, alicyclic diisocyanate, aromatic diisocyanate, or any mixture thereof. Specific examples of the polycarbodiimide may include poly(1,6-hexamethylenecarbodiimide), poly[4,4'-methylenebis(cyclohexylcarbodiimide)], poly(1,3-cyclohexylenecarbodiimide), poly(1,4-cyclohexylenecarbodiimide), poly(4,4'-dicyclohexylmethanecarbodiimide), poly(4,4'-diphenylmethanecarbodiimide), poly(3,3'-dimethyl-4,4'-diphenylmethanecarbodiimide), poly(naphthylenecarbodiimide), poly(p-phenylenecarbodiimide), poly(m-phenylenecarbodiimide), poly(tolylcarbodiimide), poly(diisopropylcarbodiimide), poly(methyl-diisopropylphenylenecarbodiimide), poly(1,3,5-triisopropylbenzene)polycarbodiimide, poly(1,3,5-triisopropylbenzene and 1,5-diisopropylbenzene)polycarbodiimide, poly(triethylphenylenecarbodiimide), and poly(triisopropylphenylenecarbodiimide). Further, as a commercially available product, "STABAXOL" (trade name, manufactured by Rhein Chemie Japan Ltd.), or the like can be used. Specifically, as the first polycarbodiimide, examples include STABAXOL P (trade name, manufactured by Rhein Chemie Japan Ltd.; molecular weight: 3,000 to 4,000) and LA-1 (trade name, manufactured by Nisshinbo Chemical Inc., molecular weight: about 2,000). As the second polycarbodiimide, examples may include STABAXOL P400 (trade name, manufactured by Rhein Chemie Japan Ltd.; molecular weight: about 20,000) and STABILIZER 9000 (trade name, manufactured by Rhein Chemie Corporation, molecular weight: about 20,000)

Above all, the polycarbodiimide above is preferably a compound obtained by polymerizing aromatic diisocyanate, and is preferably a polycarbodiimide having a unit structure represented by the following Formula (I).

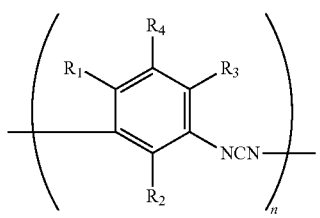

Formula (I)

wherein, in Formula (I), each of $R_1$, $R_2$, $R_3$ and $R_4$ independently represents a hydrogen atom or an alkyl group having 1 to 7 carbon atoms. n represents a number of the repeating unit.

As the polycarbodiimide which is obtained by polymerizing aromatic diisocyanate and has a unit structure represented by Formula (1) above, poly(1,3,5-triisopropylphenylene-2,4-carbodiimide), poly(1,5-diisopropylphenylene-2,4-carbodiimide), and any copolymer thereof may preferably be used.

The first polycarbodiimide and the second polycarbodiimide can be synthesized by heating diisocyanate (for example, 2,4,6-triisopropylphenyl 1,3-dicyanate) and phospholene oxide (for example, 3-methyl-1-phenyl-2-phospholene oxide). The number average molecular weight of polycarbodiimide can be controlled by selecting the addition amount of the respective materials or the reaction time.

Further, a cyclic carbodiimide compound including a cyclic structure having one carbodiimido group whose first nitrogen atom and second nitrogen atom are linked together by a linking group, is preferable.

—Cyclic Carbodiimide Compound—

Cyclic carbodiimide compounds are compounds including a cyclic structure having one carbodiimido group whose first nitrogen and second nitrogen are linked together by a linking group.

Here, the first nitrogen indicates one nitrogen atom of the two nitrogen atoms that the carbodiimido group (—N═C═N—) possesses, and the second nitrogen indicates the other nitrogen atom.

Since the cyclic carbodiimide compound seals the terminal carboxyl group of polyester, as an end cap agent, when the polyester film of the invention includes a cyclic carbodiimide compound, resistance to climatic conditions of the polyester film, especially, wet heat durability, can be improved.

It is thought that the reason why the resistance to climatic conditions of polyester film is improved by the use of a cyclic carbodiimide compound is as follows.

By using a carbodiimide compound having a cyclic structure, formation of tie chain in the polyester can be further accelerated, as described below.

Cyclic carbodiimide is cleaved and reacts with a terminal carboxylic acid of a polyester (which is referred to as PET-1).

The other end of the cleaved carbodiimide becomes an isocyanato group and reacts with a terminal hydroxyl group of another polyester (which is referred to as PET-2).

Since the cyclic carbodiimide compound has a cyclic structure, the moiety reacted with the hydroxyl group and the moiety reacted with the carboxylic acid are linked together. As a result, a tie chain structure is formed, in which the two PET molecular chains (PET-1 and PET-2) are linked via the cyclic carbodiimide.

It is preferable to use the cyclic carbodiimide compound in a proportion of from 0.05% by mass to 20% by mass, with respect to the raw material polyester resin.

Hereinafter, the cyclic carbodiimide compound is described in detail.

The weight average molecular weight (Mw) of the cyclic carbodiimide compound is preferably 400 or more, and more preferably from 500 to 1,500.

Further, the cyclic carbodiimide compound may have plural cyclic structures.

Specifically, the cyclic structure of the cyclic carbodiimide compound has one carbodiimido group (—N═C═N—) whose first nitrogen and second nitrogen are linked together by a linking group. One cyclic structure has only one carbodiimide. However, needless to say, for example, in a case in which plural cyclic structures exist in a molecule, such as a spiro ring, plural carbodiimido groups may exist in the compound, as long as each of the cyclic structures that bond to the spiro atom has one carbodiimido group. The number of atoms contained in the cyclic structure is preferably from 8 to 50, more preferably from 10 to 30, still more preferably from 10 to 20, and particularly preferably from 10 to 15.

Here, the number of atoms contained in the cyclic structure means the number of atoms that directly constitute the cyclic structure. For example, in the case of a 8-membered ring, the number of atoms is 8, and in the case of a 50-membered ring, the number of atoms is 50. When the number of atoms contained in the cyclic structure is less than 8, the stability of the cyclic carbodiimide compound may be lowered, and there are cases in which the storage or use of the cyclic carbodiimide compound is difficult. There is no particular limitation as to the upper limit value of the number of members of the ring from the viewpoint of reactivity; however, it is difficult to synthesize a cyclic carbodiimide compound having more than 50 atoms and the cost may rise significantly. From this point of view, the number of atoms contained in the cyclic structure is preferably in a range of from 10 to 30, more preferably from 10 to 20, and particularly preferably from 10 to 15.

The cyclic structure is preferably a structure represented by the following Formula (1):

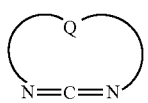
(1)

In Formula (1), Q (hereinafter, may also be referred to as "linking group Q") represents a divalent to tetravalent linking group selected from an aliphatic group, an alicyclic group, or an aromatic group, or a divalent to tetravalent linking group which is a combination of two or more groups selected from the group consisting of an aliphatic group, an alicyclic group, and an aromatic group. The combination of two or more groups may be a combination of groups of the same kind, such as a combination of an aromatic group and an aromatic group.

The aliphatic group, the alicyclic group, or the aromatic group, which constitutes Q, may, each independently, contain a heteroatom or a monovalent substituent. In this case, the heteroatom refers to O, N, S, or P. Two of the valences of the linking group are used for forming the cyclic structure. In a case in which Q is a trivalent or tetravalent linking group, the cyclic structure is bonded to a polymer or another cyclic structure through a single bond, a double bond, an atom, or an atomic group.

The linking group Q is preferably a divalent to tetravalent aliphatic group having from 1 to 20 carbon atoms, a divalent to tetravalent alicyclic group having from 3 to 20 carbon atoms, a divalent to tetravalent aromatic group having from 5 to 15 carbon atoms, or a combination of two or more groups selected from the group consisting of a divalent to tetravalent aliphatic group having from 1 to 20 carbon atoms, a divalent to tetravalent alicyclic group having from 3 to 20 carbon atoms, and a divalent to tetravalent aromatic group having from 5 to 15 carbon atoms.

Examples of the combination which constitutes the linking group Q and is a combination of two or more groups selected from the group consisting of an aliphatic group, an alicyclic group, and an aromatic group include a structure such as an alkylene-arylene group in which an alkylene group and an arylene group are bonded together, and the like.

The linking group Q is preferably a divalent to tetravalent linking group represented by the following Formula (1-1), Formula (1-2), or Formula (1-3).

(1-1)

(1-2)

(1-3)

In Formula (1-1), each of $Ar^1$ and $Ar^2$ independently represents a divalent to tetravalent aromatic group having from 5 to 15 carbon atoms. $Ar^1$ and $Ar^2$ may, each independently, further contain a heteroatom or a monovalent substituent.

Examples of the aromatic group represented by $Ar^1$ or $Ar^2$ include an arylene group having from 5 to 15 carbon atoms, an arenetriyl group having from 5 to 15 carbon atoms, and an arenetetrayl group having from 5 to 15 carbon atoms. Examples of the arylene group (divalent) include a phenylene group and a naphthalenediyl group. Examples of the arenetriyl group (trivalent) include a benzenetriyl group and a naphthalenetriyl group. Examples of the arenetetrayl group (tetravalent) include a benzenetetrayl group and a naphthalenetetrayl group. These aromatic groups may be substituted.

Examples of the monovalent substituent which may be possessed by the aromatic group include an alkyl group having from 1 to 20 carbon atoms, an aryl group having from 6 to 15 carbon atoms, a halogen atom, a nitro group, an amido group, a hydroxyl group, an ester group, an ether group, and an aldehyde group.

In Formula (1-2), each of $R^1$ and $R^2$ independently represents a divalent to tetravalent aliphatic group having from 1 to 20 carbon atoms, a divalent to tetravalent alicyclic group having from 3 to 20 carbon atoms, a combination of a divalent to tetravalent aliphatic group having from 1 to 20 carbon atoms and a divalent to tetravalent alicyclic group having from 3 to 20 carbon atoms, or a combination of two or more groups selected from the group consisting of a divalent to tetravalent aliphatic group having from 1 to 20 carbon atoms, a divalent to tetravalent alicyclic group having from 3 to 20 carbon atoms, and a divalent to tetravalent aromatic group having from 5 to 15 carbon atoms. The aliphatic group, the alicyclic group, or the aromatic group, which constitutes $R^1$ or $R^2$, may, each independently, further contain a heteroatom or a monovalent substituent.

Examples of the aliphatic group represented by $R^1$ or $R^2$ include an alkylene group having from 1 to 20 carbon atoms, an alkanetriyl group having from 1 to 20 carbon atoms, and an alkanetetrayl group having from 1 to 20 carbon atoms. Examples of the alkylene group include a methylene group, an ethylene group, a propylene group, a butylene group, a pentylene group, a hexylene group, a heptylene group, an octylene group, a nonylene group, a decylene group, a dodecylene group, and a hexadecylene group. Examples of the alkanetriyl group include a methanetriyl group, an ethanetriyl group, a propanetriyl group, a butanetriyl group, a pentanetriyl group, a hexanetriyl group, a heptanetriyl group, an octanetriyl group, a nonanetriyl group, a decanetriyl group, a dodecanetriyl group, and a hexadecanetriyl group. Examples of the alkanetetrayl group include a methanetetrayl group, an ethanetetrayl group, a propanetetrayl group, a butanetetrayl group, a pentanetetrayl group, a hexanetetrayl group, a heptanetetrayl group, an octanetetrayl group, a nonanetetrayl group, a decanetetrayl group, a dodecanetetrayl group, and a hexadecanetetrayl group. These aliphatic groups may be substituted.

Examples of the monovalent substituent which may be possessed by the aliphatic group include an alkyl group having from 1 to 20 carbon atoms, an aryl group having from 6 to 15 carbon atoms, a halogen atom, a nitro group, an amido group, a hydroxyl group, an ester group, an ether group, and an aldehyde group.

Examples of the alicyclic group include a cycloalkylene group having from 3 to 20 carbon atoms, a cycloalkanetriyl group having from 3 to 20 carbon atoms, and a cycloalkanetetrayl group having from 3 to 20 carbon atoms. Examples of the cycloalkylene group include a cyclopropylene group, a cyclobutylene group, a cyclopentylene group, a cyclohexylene group, a cycloheptylene group, a cyclooctylene group, a cyclononylene group, a cyclodecylene group, a cyclododecylene group, and a cyclohexadecylene group. Examples of the cycloalkanetriyl group include a cyclopropanetriyl group, a cyclobutanetriyl group, a cyclopentanetriyl group, a cyclohexanetriyl group, a cycloheptanetriyl group, a cyclooctanetriyl group, a cyclononanetriyl group, a cyclodecanetriyl group, a cyclododecanetriyl group, and a cyclohexadecanetriyl group. Examples of the cycloalkanetetrayl group include a cyclopropanetetrayl group, a cyclobutanetetrayl group, a cyclopentanetetrayl group, a cyclohexanetetrayl group, a cycloheptanetetrayl group, a cyclooctanetetrayl group, a cyclononanetetrayl group, a cyclodecanetetrayl group, a cyclododecanetetrayl group, and a cyclohexadecanetetrayl group. These alicyclic groups may be substituted.

Examples of the monovalent substituent which may be possessed by the alicyclic group include an alkyl group having from 1 to 20 carbon atoms, an aryl group having from 6 to 15 carbon atoms, a halogen atom, a nitro group, an amido group, a hydroxyl group, an ester group, an ether group, and an aldehyde group.

Examples of the aromatic group include an arylene group having from 5 to 15 carbon atoms, an arenetriyl group having from 5 to 15 carbon atoms, and an arenetetrayl group having from 5 to 15 carbon atoms, each of which may have a heterocyclic structure by including a heteroatom. Examples of the arylene group include a phenylene group and a naphthalenediyl group. Examples of the arenetriyl group (trivalent) include a benzenetriyl group and a naphthalenetriyl group. Examples of the arenetetrayl group (tetravalent) include a benzenetetrayl group and a naphthalenetetrayl group. These aromatic groups may be substituted.

Examples of the monovalent substituent which may be possessed by the aromatic group include an alkyl group having from 1 to 20 carbon atoms, an aryl group having from 6 to 15 carbon atoms, a halogen atom, a nitro group, an amido group, a hydroxyl group, an ester group, an ether group, and an aldehyde group.

In Formula (1-1) and Formula (1-2) above, each of $X^1$ and $X^2$ independently represents a divalent to tetravalent aliphatic group having from 1 to 20 carbon atoms, a divalent to tetravalent alicyclic group having from 3 to 20 carbon atoms, a divalent to tetravalent aromatic group having from 5 to 15 carbon atoms, or a combination of two or more groups selected from the group consisting of a divalent to tetravalent aliphatic group having from 1 to 20 carbon atoms, a divalent to tetravalent alicyclic group having from 3 to 20 carbon atoms, and a divalent to tetravalent aromatic group having from 5 to 15 carbon atoms. The aliphatic group, the alicyclic group, or the aromatic group, which constitutes $X^1$ or $X^2$, may, each independently, further contain a heteroatom or a monovalent substituent.

Examples of the aliphatic group include an alkylene group having from 1 to 20 carbon atoms, an alkanetriyl group having from 1 to 20 carbon atoms, and an alkanetetrayl group having from 1 to 20 carbon atoms. Examples of the alkylene group include a methylene group, an ethylene group, a propylene group, a butylene group, a pentylene group, a hexylene group, a heptylene group, an octylene group, a nonylene group, a decylene group, a dodecylene group, and a hexadecylene group. Examples of the alkanetriyl group include a methanetriyl group, an ethanetriyl group, a propanetriyl group, a butanetriyl group, a pentanetriyl group, a hexanetriyl group, a heptanetriyl group, an octanetriyl group, a nonanetriyl group, a decanetriyl group, a dodecanetriyl group, and a hexadecanetriyl group. Examples of the alkanetetrayl group include a methanetetrayl group, an ethanetetrayl group, a propanetetrayl group, a butanetetrayl group, a pentanetetrayl group, a hexanetetrayl group, a heptanetetrayl group, an octanetetrayl group, a nonanetetrayl group, a decanetetrayl group, a dodecanetetrayl group, and a hexadecanetetrayl group. These aliphatic groups may be substituted.

Examples of the monovalent substituent which may be possessed by the aliphatic group include an alkyl group having from 1 to 20 carbon atoms, an aryl group having from 6 to 15 carbon atoms, a halogen atom, a nitro group, an amido group, a hydroxyl group, an ester group, an ether group, and an aldehyde group.

Examples of the alicyclic group include a cycloalkylene group having from 3 to 20 carbon atoms, a cycloalkanetriyl group having from 3 to 20 carbon atoms, and a cycloalkanetetrayl group having from 3 to 20 carbon atoms. Examples of the cycloalkylene group include a cyclopropylene group, a cyclobutylene group, a cyclopentylene group, a cyclohexylene group, a cycloheptylene group, a cyclooctylene group, a cyclononylene group, a cyclodecylene group, a cyclododecylene group, and a cyclohexadecylene group. Examples of the cycloalkanetriyl group include a cyclopropanetriyl group, a cyclobutanetriyl group, a cyclopentanetriyl group, a cyclohexanetriyl group, a cycloheptanetriyl group, a cyclooctanetriyl group, a cyclononanetriyl group, a cyclodecanetriyl group, a cyclododecanetriyl group, and a cyclohexadecanetriyl group. Examples of the cycloalkanetetrayl group include a cyclopropanetetrayl group, a cyclobutanetetrayl group, a cyclopentanetetrayl group, a cyclohexanetetrayl group, a cycloheptanetetrayl group, a cyclooctanetetrayl group, a cyclononanetetrayl group, a cyclodecanetetrayl group, a cyclododecanetetrayl group, and a cyclohexadecanetetrayl group. These alicyclic groups may be substituted.

Examples of the monovalent substituent which may be possessed by the alicyclic group include an alkyl group having from 1 to 20 carbon atoms, an aryl group having from 6 to 15 carbon atoms, a halogen atom, a nitro group, an amido group, a hydroxyl group, an ester group, an ether group, and an aldehyde group.

Examples of the aromatic group include an arylene group having from 5 to 15 carbon atoms, an arenetriyl group having from 5 to 15 carbon atoms, and an arenetetrayl group having from 5 to 15 carbon atoms, each of which may have a heterocyclic structure by including a heteroatom. Examples of the arylene group include a phenylene group and a naphthalenediyl group. Examples of the arenetriyl group (trivalent) include a benzenetriyl group and a naphthalenetriyl group. Examples of the arenetetrayl group (tetravalent) include a benzenetetrayl group and a naphthalenetetrayl group. These aromatic groups may be substituted.

Examples of the monovalent substituent which may be possessed by the aromatic group include an alkyl group having from 1 to 20 carbon atoms, an aryl group having from 6 to 15 carbon atoms, a halogen atom, a nitro group, an amido group, a hydroxyl group, an ester group, an ether group, and an aldehyde group.

In Formula (1-1) and Formula (1-2) above, each of s and k independently represents an integer from 0 to 10, more preferably an integer from 0 to 3, and still more preferably an integer from 0 to 1.

When s and k exceed 10, it is difficult to synthesize the cyclic carbodiimide compound and the cost may rise significantly. From this point of view, the integer is preferably in a range of from 0 to 3. When s or k is 2 or more, $X^1$ or $X^2$ as a repeating unit may be different from other $X^1$ or $X^2$.

In Formula (1-3) above, $X^3$ represents a divalent to tetravalent aliphatic group having from 1 to 20 carbon atoms, a divalent to tetravalent alicyclic group having from 3 to 20 carbon atoms, a divalent to tetravalent aromatic group having from 5 to 15 carbon atoms, or any combination thereof.

The aliphatic group, the alicyclic group, or the aromatic group, which constitutes $X^3$, may further contain a heteroatom or a monovalent substituent.

Examples of the aliphatic group include an alkylene group having from 1 to 20 carbon atoms, an alkanetriyl group having from 1 to 20 carbon atoms, and an alkanetetrayl group having from 1 to 20 carbon atoms. Examples of the alkylene group include a methylene group, an ethylene group, a propylene group, a butylene group, a pentylene group, a hexylene group, a heptylene group, an octylene group, a nonylene group, a decylene group, a dodecylene group, and a hexadecylene group. Examples of the alkanetriyl group include a methanetriyl group, an ethanetriyl group, a propanetriyl group, a butanetriyl group, a pentanetriyl group, a hexanetriyl group, a heptanetriyl group, an octanetriyl group, a nonanetriyl group, a decanetriyl group, a dodecanetriyl group, and a hexadecanetriyl group. Examples of the alkanetetrayl group include a methanetetrayl group, an ethanetetrayl group, a propanetetrayl group, a butanetetrayl group, a pentanetetrayl group, a hexanetetrayl group, a heptanetetrayl group, an octanetetrayl group, a nonanetetrayl group, a decanetetrayl group, a dodecanetetrayl group, and a hexadecanetetrayl group. These aliphatic groups may contain a monovalent substituent.

Examples of the monovalent substituent which may be possessed by the aliphatic group include an alkyl group having from 1 to 20 carbon atoms, an aryl group having from 6 to 15 carbon atoms, a halogen atom, a nitro group, an amido group, a hydroxyl group, an ester group, an ether group, and an aldehyde group.

Examples of the alicyclic group include a cycloalkylene group having from 3 to 20 carbon atoms, a cycloalkanetriyl group having from 3 to 20 carbon atoms, and a cycloalkanetetrayl group having from 3 to 20 carbon atoms. Examples of the cycloalkylene group include a cyclopropylene group, a cyclobutylene group, a cyclopentylene group, a cyclohexylene group, a cycloheptylene group, a cyclooctylene group, a cyclononylene group, a cyclodecylene group, a cyclododecylene group, and a cyclohexadecylene group. Examples of the cycloalkanetriyl group include a cyclopropanetriyl group, a cyclobutanetriyl group, a cyclopentanetriyl group, a cyclohexanetriyl group, a cyclo-heptanetriyl group, a cyclooctanetriyl group, a cyclononanetriyl group, a cyclodecanetriyl group, a cyclododecanetriyl group, and a cyclohexadecanetriyl group. Examples of the cycloalkanetetrayl group include a cyclopropanetetrayl group, a cyclobutanetetrayl group, a cyclopentanetetrayl group, a cyclohexanetetrayl group, a cycloheptanetetrayl group, a cyclooctanetetrayl group, a cyclononanetetrayl group, a cyclodecanetetrayl group, a cyclododecanetetrayl group, and a cyclohexadecanetetrayl group. These alicyclic groups may contain a monovalent substituent.

Examples of the monovalent substituent which may be possessed by the alicyclic group include an alkyl group having from 1 to 20 carbon atoms, an aryl group having from 6 to 15 carbon atoms, a halogen atom, a nitro group, an amido group, a hydroxyl group, an ester group, an ether group, and an aldehyde group.

Examples of the aromatic group include an arylene group having from 5 to 15 carbon atoms, an arenetriyl group having from 5 to 15 carbon atoms, and an arenetetrayl group having from 5 to 15 carbon atoms, each of which may have a heterocyclic structure by including a heteroatom. Examples of the arylene group include a phenylene group and a naphthalenediyl group. Examples of the arenetriyl group (trivalent) include a benzenetriyl group and a naphthalenetriyl group. Examples of the arenetetrayl group (tetravalent) include a benzenetetrayl group and a naphthalenetetrayl group. These aromatic groups may be substituted.

Examples of the monovalent substituent which may be possessed by the aromatic group include an alkyl group having from 1 to 20 carbon atoms, an aryl group having from 6 to 15 carbon atoms, a halogen atom, a nitro group, an amido group, a hydroxyl group, an ester group, an ether group, and an aldehyde group.

Further, $Ar^1$, $Ar^2$, $R^1$, $R^2$, $X^1$, $X^2$, and $X^3$ may contain a heteroatom. When Q is a divalent linking group, all of $Ar^1$, $Ar^2$, $R^1$, $R^2$, $X^1$, $X^2$, and $X^3$ are divalent linking groups.

When Q is a trivalent linking group, one of $Ar^1$, $Ar^2$, $R^1$, $R^2$, $X^1$, $X^2$, and $X^3$ is a trivalent group. When Q is a tetravalent group, one of $Ar^1$, $Ar^2$, $R^1$, $R^2$, $X^1$, $X^2$, and $X^3$ is a tetravalent group, or two of them are trivalent groups.

Examples of the cyclic carbodiimide compound include cyclic carbodiimide compounds (a) to (c) described below.

[Cyclic Carbodiimide Compound (a)]

Cyclic carbodiimide compound (a) is a compound represented by the following Formula (2).

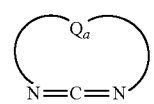

(2)

In Formula (2), $Q_a$ represents a divalent linking group selected from an aliphatic group, an alicyclic group, or an aromatic group, or a divalent linking group which is a combination of two or more groups selected from the group consisting of an aliphatic group, an alicyclic group, and an aromatic group, and may further contain a heteroatom. The aliphatic group, the alicyclic group, and the aromatic group are the same as those explained in Formula (1). However, in the compounds of Formula (2), all of the aliphatic group, the alicyclic group, and the aromatic group are divalent. $Q_a$ is preferably a divalent linking group represented by the following Formula (2-1), Formula (2-2), or Formula (2-3).

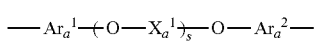 (2-1)

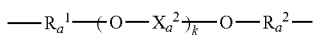 (2-2)

 (2-3)

In Formula (2-1) to Formula (2-3), $Ar_a^1$, $Ar_a^2$, $R_a^1$, $R_a^2$, $X_a^1$, $X_a^2$, $X_a^3$, s, and k have the same definitions as $Ar^1$, $Ar^2$, $R^1$, $R^2$, $X^1$, $X^2$, $X^3$, s, and k in Formula (1-1) to Formula (1-3), respectively. However, all of them are divalent.

Examples of the cyclic carbodiimide compound (a) include the compounds shown below.

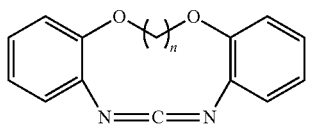

(n = an integer of 1 to 6)

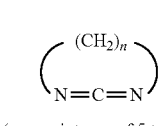

(n = an integer of 5 to 20)

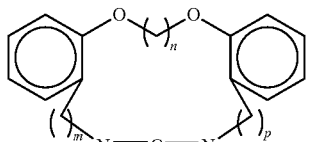

(m, n, p = an integer of 1 to 6 respectively)

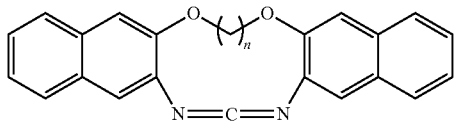

(n = an integer of 1 to 6)

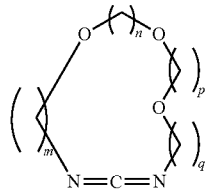

(m, n, p, q = an integer of 1 to 6 respectively)

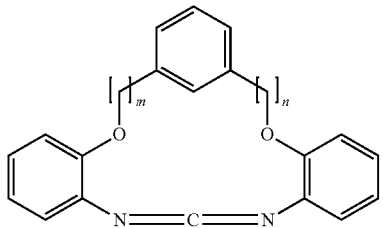

(m, n = an integer of 0 to 3 respectively)

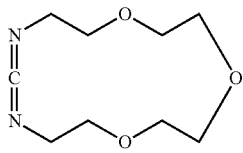

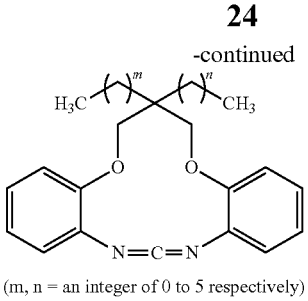

(m, n = an integer of 0 to 5 respectively)

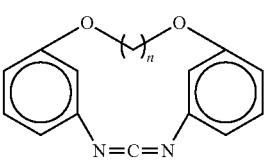

(n = an integer of 1 to 6)

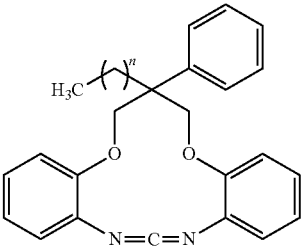

(n = an integer of 0 to 5)

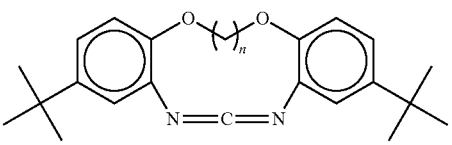

(n = an integer of 1 to 6)

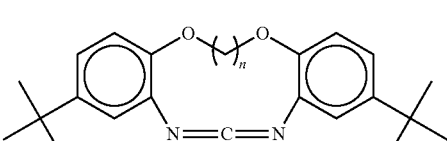

(m, n = an integer of 0 to 3 respectively)

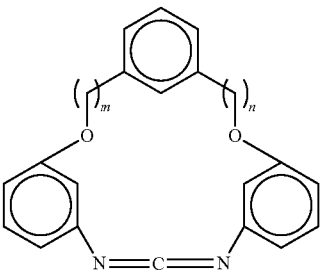

(m, p = an integer of 1 to 5 respectively
n = an integer of 1 to 6)

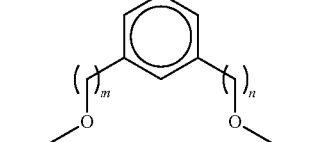

(n = an integer of 1 to 6)

[Cyclic Carbodiimide Compound (b)]

Cyclic carbodiimide compound (b) is a compound represented by the following Formula (3).

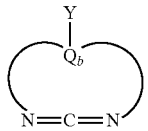

(3)

In Formula (3), $Q_b$ represents a trivalent linking group selected from an aliphatic group, an alicyclic group, or an aromatic group, or a trivalent linking group which is a combination of two or more groups selected from the group consisting of an aliphatic group, an alicyclic group, and an aromatic group, and may further contain a heteroatom. The aliphatic group, the alicyclic group, and the aromatic group are the same as those explained in Formula (1). However, in the compounds of Formula (3), one of the groups constituting $Q_b$ is trivalent.

In Formula (3), Y represents a carrier that supports the cyclic structure of the cyclic carbodiimide compound.

$Q_b$ is preferably a trivalent linking group represented by the following Formula (3-1), Formula (3-2), or Formula (3-3).

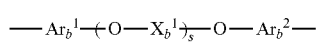 (3-1)

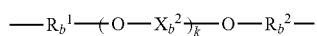 (3-2)

 (3-3)

In Formula (3-1) to Formula (3-3), $Ar_b^1$, $Ar_b^2$, $R_b^1$, $R_b^2$, $X_b^1$, $X_b^2$, $X_b^3$, s, and k have the same definitions as $Ar^1$, $Ar^2$, $R^1$, $R^2$, $X^1$, $X^2$, $X^3$, s, and k in Formula (1-1) to Formula (1-3), respectively. However, one of them is a trivalent group.

Y is preferably a single bond, a double bond, an atom, an atomic group, or a polymer. Y is a binding portion, and plural cyclic structures bond together via Y, to form a structure represented by Formula (3).

Examples of the cyclic carbodiimide compound (b) include the compounds shown below.

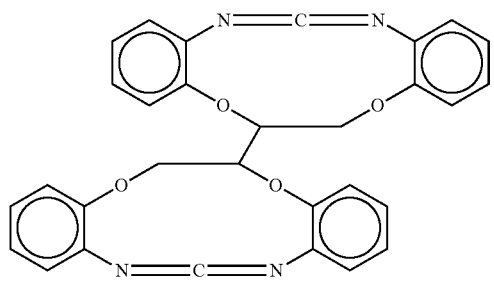

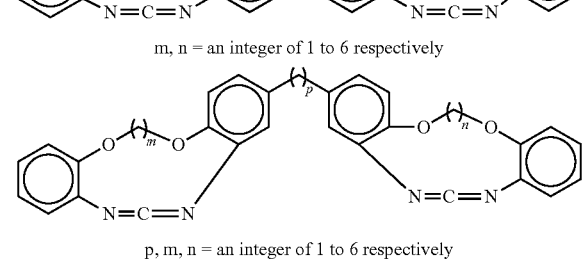

m, n = an integer of 1 to 6 respectively p, m, n = an integer of 1 to 6 respectively

[Cyclic Carbodiimide Compound (c)]

Cyclic carbodiimide compound (c) is a compound represented by the following Formula (4).

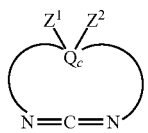

(4)

In the formula, $Q_c$ represents a tetravalent linking group selected from an aliphatic group, an alicyclic group, or an aromatic group, or a tetravalent linking group which is a combination of two or more groups selected from the group consisting of an aliphatic group, an alicyclic group, and an aromatic group, and may further contain a heteroatom. $Z^1$ and $Z^2$ each represent a carrier that supports the cyclic structure. $Z^1$ and $Z^2$ may bond to each other to form a cyclic structure.

The aliphatic group, the alicyclic group, and the aromatic group are the same as those explained in Formula (1). However, in the compounds of Formula (4), $Q_c$ is tetravalent. Therefore, one of these groups is a tetravalent group, or two of them are trivalent groups.

$Q_c$ is preferably a tetravalent linking group represented by the following Formula (4-1), Formula (4-2), or Formula (4-3).

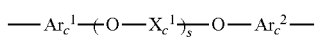 (4-1)

 (4-2)

 (4-3)

In Formula (4-1) to Formula (4-3), $Ar_c^1$, $Ar_c^2$, $R_c^1$, $R_c^2$, $X_c^1$, $X_c^2$, $X_c^3$, s, and k have the same definitions as $Ar^1$, $Ar^2$, $R^1$, $R^2$, $X^1$, $X^2$, $X^3$, s, and k in Formula (1-1) to Formula (1-3), respectively. However, one of $Ar_c^1$, $Ar_c^2$, $R_c^1$, $R_c^2$, $X_c^1$, $X_c^2$, $X_c^3$, s and k is a tetravalent group or two of them are trivalent groups. It is preferable that each of $Z^1$ and $Z^2$ independently represents a single bond, a double bond, an atom, an atomic group, or a polymer. $Z^1$ and $Z^2$ are each a binding portion, and plural cyclic structures bond together via $Z^1$ and $Z^2$, to form a structure represented by Formula (4).

Examples of the cyclic carbodiimide compound (c) include the compounds shown below.

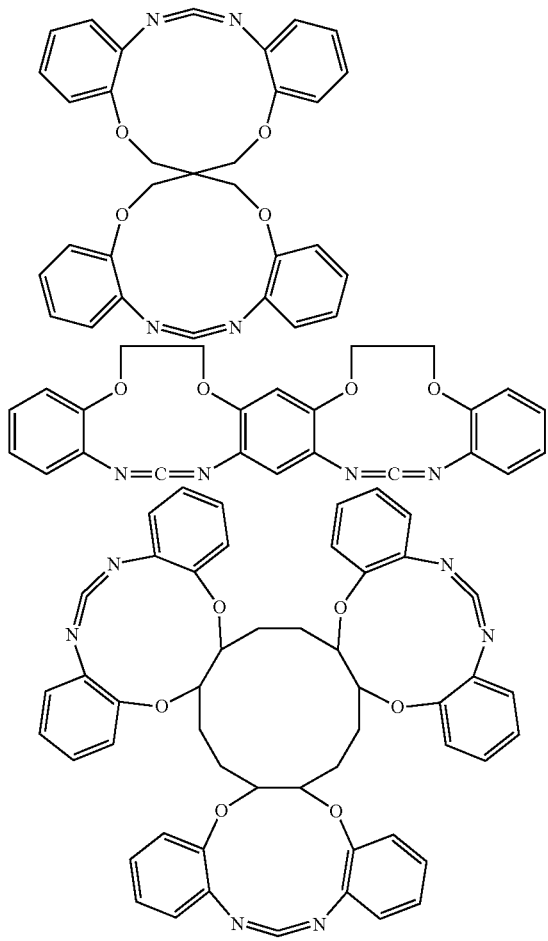

(Method for Producing Cyclic Carbodiimide Compound)

Cyclic carbodiimide compounds can be synthesized according to the methods described in paragraphs [0153] to [0159] of JP-A No. 2011-153209, paragraph [0075] of JP-A No. 2011-256337, and the like.

Preferable examples of the epoxy compound include a glycidyl ester compound and a glycidyl ether compound.

Specific examples of the glycidyl ester compound include glycidyl benzoate, glycidyl t-butyl-benzoate, glycidyl p-toluate, glycidyl cyclohexanecarboxylate, glycidyl pelargonate, glycidyl stearate, glycidyl laurate, glycidyl palmitate, glycidyl behenate, glycidyl versatate, glycidyl oleate, glycidyl linoleate, glycidyl linolenate, glycidyl behenolate, glycidyl stearolate, diglycidyl terephthalate, diglycidyl isophthalate, diglycidyl phthalate, diglycidyl naphthalenedicarboxylate, diglycidyl methylterephthalate, diglycidyl hexahydrophthalate, diglycidyl tetrahydrophthalate, diglycidyl cyclohexanedicarboxylate, diglycidyl adipate, diglycidyl succinate, diglycidyl sebacate, diglycidyl dodecanedionate, diglycidyl octadecanedicarboxylate, triglycidyl trimellitate, and tetraglycidyl pyromellitate. These compounds may be used singly or in combination of two or more kinds thereof.

Specific examples of the glycidyl ether compound include phenyl glycidyl ether, o-phenyl glycidyl ether, 1,4-bis(β,γ-epoxypropoxy)butane, 1,6-bis(β,γ-epoxypropoxy)hexane, 1,4-bis(β,γ-epoxypropoxy)benzene, 1-(β,γ-epoxypropoxy)-2-ethoxyethane, 1-(β,γ-epoxypropoxy)-2-benzyloxyethane, 2,2-bis-[p-(β,γ-epoxypropoxy)phenyl]propane, and bisglycidyl polyether obtained by a reaction between bisphenol, such as 2,2-bis(4-hydroxyphenyl)propane or 2,2-bis(4-hydroxyphenyl)methane, and epichlorohydrin. These compounds may be used singly or in combination of two or more kinds thereof.

The oxazoline compound is preferably a bisoxazoline compound, and specific examples may include 2,2'-bis(2-oxazoline), 2,2'-bis(4-methyl-2-oxazoline), 2,2'-bis(4,4-dimethyl-2-oxazoline), 2,2'-bis(4-ethyl-2-oxazoline), 2,2'-bis(4,4-diethyl-2-oxazoline), 2,2'-bis(4-propyl-2-oxazoline), 2,2'-bis(4-butyl-2-oxazoline), 2,2'-bis(4-hexyl-2-oxazoline), 2,2'-bis(4-phenyl-2-oxazoline), 2,2'-bis(4-cyclohexyl-2-oxazoline), 2,2'-bis(4-benzyl-2-oxazoline), 2,2'-p-phenylene-bis(2-oxazoline), 2,2'-m-phenylene-bis(2-oxazoline), 2,2'-o-phenylene-bis(2-oxazoline), 2,2'-p-phenylene-bis(4-methyl-2-oxazoline), 2,2'-p-phenylene-bis(4,4-dimethyl-2-oxazoline), 2,2'-m-phenylene-bis(4-methyl-2-oxazoline), 2,2'-m-phenylene-bis(4,4-dimethyl-2-oxazoline), 2,2'-ethylene-bis(2-oxazoline), 2,2'-tetramethylene-bis(2-oxazoline), 2,2'-hexamethylene-bis(2-oxazoline), 2,2'-octamethylene-bis(2-oxazoline), 2,2'-decamethylene-bis(2-oxazoline), 2,2'-ethylene-bis(4-methyl-2-oxazoline), 2,2'-tetramethylene-bis(4,4-dimethyl-2-oxazoline), 2,2'-9,9'-diphenoxyethane-bis(2-oxazoline), 2,2'-cyclohexylene-bis(2-oxazoline), and 2,2'-diphenylene-bis(2-oxazoline). Among them, 2,2'-bis(2-oxazoline) is most preferably used from the viewpoint of the reactivity with polyester. The above-described bisoxazoline compounds may be used singly or in combination of two or more thereof, as long as the purpose of the invention is achieved.

As described above, in the invention, the raw material polyester resin (for example, pellets or the like) is melt-extruded and casted to prepare an original sheet, and this sheet is subjected to longitudinal stretching and horizontal stretching, and thereafter, the sheet is subjected to heat setting and heat relaxation, thereby forming a film. In this procedure, particularly, in the original sheet formation process (extrusion and casting process), for melt extrusion, a polyester fine particle (hereinafter, may also be referred to as, simply, "polyester fine particle" or "polyester fine particle with a high crystallization degree") having a crystallization degree higher by 5% to 20% than that of the raw material polyester resin is contained in an amount of from 0.001% by mass to 0.1% by mass, in addition to the raw material polyester resin (pellets or the like).

Thus, in the process of melt kneading the raw material polyester resin, a polyester fine particle having a crystallization degree higher than that of the raw material resin is added. This fine particle does not melt thoroughly in the process of melt kneading, and the resultant serves as a nucleus for the formation of crystal in the succeeding stretching process or heat setting process, and accelerates the formation of tie chain between crystals. By using the method for producing a polyester film of the invention, a polyester film which satisfies Equation (1) above, and has a wet thermo retention represented by Equation (2) above of 30% or higher can be suitably produced.

—Original Sheet Formation Process (Extrusion and Casting Process)—

In the extruding process in the invention, a polyester fine particle having a crystallization degree higher by 5% to 20% than that of the raw material polyester resin is added to the raw material polyester resin at an amount that falls within the range of from 0.001% by mass to 0.1% by mass with respect to the raw material polyester resin. The raw material polyester resin in which the polyester fine particle is contained through melt kneading is melt-extruded in the form of sheet, and cooled on a casting drum, to form a polyester sheet.

Here, the polyester sheet formed through melt extrusion in the form of sheet is an original sheet before stretching.

As the polyester fine particle, a substance having a crystallization degree higher by 5% to 20% than the crystallization degree of the raw material polyester resin is selected. When the difference of the crystallization degree of the polyester fine particle relative to the crystallization degree of the raw material polyester resin is less than 5%, the difference in crystallization degree between the polyester fine particle and the polyester raw material is too small, and thus, the particle melts into the raw material resin during melt kneading, so that it is hard for the particle to be a nucleus for the formation of crystal. As a result, it is difficult to form a tie chain between the crystals.

When the difference of the crystallization degree of the polyester fine particle relative to the crystallization degree of the raw material polyester resin exceeds 20%, the polyester fine particle does not melt thoroughly in the melt extruder, and the polyester fine particle having a high crystallization degree functions as an initiation point (stress concentrated point) to make it easier to proceed breakage, as a result of which, the maximum stress in the tensile test is lowered and the heat resistance is deteriorated.

The content of the polyester fine particle is in a range of from 0.001% by mass to 0.1% by mass with respect to the raw material polyester resin. When the content of the polyester fine particle is lower than 0.001% by mass, since it is hard to obtain a nucleus for the formation of crystal as described above, and therefore, a tie chain is less likely to be formed, Equation (1) is not satisfied, and further, the fine particle cannot function as a lubricant, generation of shear heat due to the friction between pellets inside the extruder cannot be suppressed, IV decreases, and AV easily increases, and it is difficult to obtain a polyester film in which the wet thermo retention represented by Equation (2) above is 30% or higher. When the content of the polyester fine particle exceeds 0.1% by mass, the polyester fine particle does not melt thoroughly in the extruder, and the polyester fine particle having a high crystallization degree functions as an initiation point (stress concentrated point) to make it easier to proceed breakage, as a result of which, the maximum stress in the tensile test is lowered and the heat resistance is deteriorated.

Above all, from the reason as described above, the content of the polyester fine particle is preferably from 0.002% by mass to 0.05% by mass, and more preferably from 0.003% by mass to 0.03% by mass.

The polyester fine particle having a high crystallization degree can be obtained by crushing a pellet of polyester or the like, and the resultant is heat treated in a nitrogen gas flow or in a vacuum, preferably under the conditions of a temperature of from 190° C. to 220° C., for a period of from 12 hours to 72 hours (more preferably from 15 hours to 48 hours, and still more preferably from 18 hours to 25 hours). Specifically, the raw material, such as a pellet or the like, is crushed, and the resultants are put through a sieve to select substances having a desired size described below, and the substances are heat treated, for example, at 200° C. By changing the treatment time, it is possible to control the degree of crystallization to the desired value.

In this process, the pellet of polyester or the like, which is used for preparing the polyester fine particle, may be the same as the raw material polyester resin to be melt-kneaded, or a polyester different from the polyester raw material may be used.

The size of the polyester fine particle having a high degree of crystallization is preferably from 100 μm to 1 mm, more preferably from 200 μm to 0.7 mm, and still more preferably from 300 μm to 0.5 mm. The size being 100 μm or more is advantageous in that a nucleus for the formation of crystal is easily obtained, and the size being 1 mm or less is advantageous in that the above-described effects of fine particle can be effectively exhibited (the number of particles per unit weight can be increased).

The crystallization degrees of the polyester fine particle and the raw material resin (pellets or the like) can be determined by utilizing a gradient tube density method.

Namely, a density gradient tube containing carbon tetrachloride and n-hexane is prepared, and reference substances with a known specific gravity are introduced into this tube to prepare a calibration curve, and then a sample is introduced and the specific gravity is measured. The specific gravity of complete non-crystal is taken as 1.335, and the specific gravity of complete crystal is taken as 1.501, and the crystallization degree is determined from the following Equation (1X).

$$Xc(\%) = (\sigma s - \sigma nc)/(\sigma c - \sigma nc) \quad \text{Equation (1X)}$$

Here, Xc (%) represents the crystallization degree (%), σs represents the specific gravity of the sample, σnc represents the specific gravity of complete non-crystal, and σc represents the specific gravity of complete crystal.

The crystallization degree of the raw material polyester resin (pellets or the like) in the invention is preferably in a range of from 30% to 50%, more preferably from 33% to 47%, and still more preferably from 36% to 44%. When the crystallization degree is 30% or more, formation of tie chain by the addition of the polyester fine particle having a high crystallization degree may proceed favorably. When the crystallization degree is 50% or less, the crystallization degree after extrusion does not become too high, and thus, the increase in the amount of tie chain between crystals is suppressed as appropriate, and a characteristic of being hard to break is likely to be obtained. Thus, the maximum stress in the tensile test can be maintained high and the heat resistance is enhanced.

As described above, also in the raw material polyester resin (pellets or the like) which is the main constituent, from the viewpoint of the formation of tie chain, the crystallization degree is preferably set within a relatively low range, such as from 30% to 50%. By further adding a polyester fine particle having a high crystallization degree to the raw material polyester resin in an amount within the above range, a tie chain can be formed more suitably. That is, when the crystallization degree in the whole is made high by the raw material polyester resin such as pellets or the like, the network by the tie chain becomes too much, and rather, there are cases in which embrittlement is caused. Accordingly, as in the invention, by using a raw material polyester resin having a relatively low crystallization degree, and adding a polyester fine particle having a high crystallization degree to the raw material polyester resin, a tie chain can be formed more favorably. However, when the crystallization degree of the raw material polyester resin is too low, even though a polyester fine particle having a high crystallization degree is added, it is difficult to form a tie chain. For this reason, the crystallization degree of the raw material polyester resin (pellets or the like) is preferably 30% or higher.

The raw material polyester resin (pellets or the like) having such a crystallization degree can be achieved by solid phase polymerization. Namely, by making the time longer in the temperature range described above, the crystallization degree can be made higher. On the other hand, as to the temperature, the crystal formation speed is slow at the lower temperature side, and the crystal begins to melt at the higher temperature side. Therefore, by setting the temperature at near 210° C., the crystallization degree is easily heightened. The amount of crystal is easily decreased at both the higher temperature side and the lower temperature side.

The crystallization degree of a polyester sheet (original sheet) before stretching, the polyester sheet having been cooled and fixed after melt extrusion in the extruding process in the invention, is preferably from 0.5% to 10%. Above all, the crystallization degree is more preferably from 1% to 7%, and still more preferably from 1.5% to 5%.

As described above, when a crystal exists in the original sheet before stretching, crystal formation due to stretch orientation occurs easily by using this crystal as a nucleus, in the succeeding stretching process. As a result, it is advantageous in that a tie chain between crystals is easily formed. Accordingly, when the degree of crystallization is 0.5% or more, a tie chain is easily formed between crystals, and as a result, a polyester film in which the above-described stress heat resistant coefficient f(125) satisfies Equation (1) above and which exhibits excellent heat resistance is obtained. Further, when the crystallization degree is 10% or less, the formation of tie chain is moderately suppressed such that the amount thereof does not become too much, and the embrittlement, which is caused by becoming hard to stretch or the like, can be prevented. Thereby, the maximum stress in the tensile test is increased and the heat resistance is heightened.

A polyester sheet (non-stretched original sheet) having a crystallization degree as described above can be suitably prepared as follows. Namely, (a) A polyester fine particle having a crystallization degree higher by 5% to 20% than that of the raw material polyester resin is added to the raw material polyester resin (pellets or the like), and then melt extrusion is performed.

(b) The temperature of the inlet of the melt extruder is made lower by 5° C. to 50° C. than the temperature of the outlet of the melt extruder in order to shorten the time of being exposed to a high temperature such that the fine crystal of the polyester fine particle is not crushed or melted during melt extrusion. The quantity of temperature difference in this process is more preferably from 7° C. to 45° C., and still more preferably from 10° C. to 40° C. By gradually heating from the inlet, heat is effectively applied and useless heat is not applied, and as a result, formation of fine crystal is suppressed. When the quantity of temperature difference is less than this range, the formation of fine crystal is reduced, and the breaking strength retention is lowered. Meanwhile, when the quantity of temperature difference exceeds this range, poor melt is caused at the lower temperature region, and at the higher temperature region, a foreign substance due to thermal decomposition is generated, and this foreign substance becomes a stress concentrated point and, as a result, breakage is liable to occur and the heat resistance is lowered.

(c) A biaxial extruder is used.

In a monoaxial extruder, a resin is conveyed by the friction between the screw and the barrel, and therefore, a high shear is applied to the resin, and fine crystals are easily crushed. On the other hand, in a biaxial extruder, particularly in a co-directionally rotating engagement type biaxial extruder, a resin is conveyed by being placed on the screw, and therefore, an excess shear is less likely to be applied to the resin, and fine crystals are less likely to be crushed.

Next, the raw material polyester resin is described.

(Raw Material Polyester Resin)

The raw material polyester resin is not particularly limited, as long as it is a raw material of a polyester film and is a material including polyester, and may include, other than polyester, slurry of an inorganic particle or organic particle. Further, the raw material polyester resin may further include a titanium element derived from a catalyst.

There is no particular limitation as to the kind of polyester contained in the raw material polyester resin.

The polyester contained in the raw material polyester resin may be synthesized using a dicarboxylic acid component and a diol component. Alternatively, a commercially available polyester may be used.

In the case of synthesizing the polyester, for example, the polyester can be obtained by subjecting (A) a dicarboxylic acid component and (B) a diol component to an esterification reaction and/or transesterification reaction, according to a known method.

Examples of (A) the dicarboxylic acid component include dicarboxylic acids such as aliphatic dicarboxylic acids including malonic acid, succinic acid, glutaric acid, adipic acid, suberic acid, sebacic acid, dodecanedioic acid, dimer acid, eicosanedioic acid, pimelic acid, azelaic acid, methylmalonic acid, and ethylmalonic acid, alicyclic dicarboxylic acids including adamantane dicarboxylic acid, norbornene dicarboxylic acid, isosorbide, cyclohexane dicarboxylic acid, and decalin dicarboxylic acid, and aromatic dicarboxylic acids including terephthalic acid, isophthalic acid, phthalic acid, 1,4-naphthalene dicarboxylic acid, 1,5-naphthalene dicarboxylic acid, 2,6-naphthalene dicarboxylic acid, 1,8-naphthalene dicarboxylic acid, 4,4'-diphenyl dicarboxylic acid, 4,4'-diphenylether dicarboxylic acid, 5-sodium sulfoisophthalic acid, phenylindane dicarboxylic acid, anthracene dicarboxylic acid, phenanthrene dicarboxylic acid, and 9,9'-bis(4-carboxyphenyl) fluorene acid, and ester derivatives thereof.

Examples of (B) the diol component include diol compounds such as aliphatic diols such as ethylene glycol, 1,2-propane diol, 1,3-propane diol, 1,4-butane diol, 1,2-butane diol, or 1,3-butane diol; alicyclic diols such as 1,4-cyclohexane dimethanol, spiro glycol, or isosorbide; and aromatic diols such as bisphenol A, 1,3-benzene dimethanol, 1,4-benzene dimethanol, or 9,9'-bis(4-hydroxyphenyl) fluorene.

As (A) the dicarboxylic acid component, at least one kind of aromatic dicarboxylic acid is preferably used. It is more preferable to include an aromatic dicarboxylic acid as a main component in the dicarboxylic acid component. Preferable examples of the aromatic dicarboxylic acids include terephthalic acid (TPA) and 2,6-naphthalene dicarboxylic acid (2,6-NDCA), and acids containing either of them as a main component are preferred. Meanwhile, the "main component" refers to the fact that the ratio of an aromatic dicarboxylic acid in the dicarboxylic acid component is respectively 80% by mass or more. Dicarboxylic acids other than the 2,6-NDCA and TPA may be included. More preferable examples of the dicarboxylic acids other than the 2,6-NDCA and TPA include isophthalic acid. A content of the isophthalic acid is preferably in a range of from 0% by mole to 15% by mole, more preferably in a range of from 0% by mole to 12% by mole, and even more preferably in a range of from 0% by mole to 9% by mole with respect to a total mole of dicarboxylic acids.

As (B) the diol component, at least one kind of aliphatic diol is preferably used. As the aliphatic diol, ethyleneglycol or 1,4-cyclohexane dimethanol may be included, and it is preferable to include ethyleneglycol or 1,4-cyclohexane dimethanol as a main component.

As used herein, the "main component" refers to the fact that the proportion of the sum of ethylene glycol and 1,4-cyclohexanedimethanol in the diol component is 80% by mass or more.

In the case of polycyclohexanedimethylene terephthalate (PCT) having a 1,4-cyclohexanedimethanol structure, the content of the structure derived from 1,4-cyclohexanedimethanol in the diol component (in the whole diol) is preferably from 0.1 mol % to 20 mol % or from 80 mol % to 100 mol %, more preferably from 0.5 mol % to 16 mol % or from 83 mol % to 98 mol %, and particularly preferably from 1 mol % to 12 mol % or from 86 mol % to 96 mol %. The reason why the preferable content of the structure derived from CHDM has two regions of a low region (from 0.1 mol % to 20 mol %) and a high region (from 80 mol % to 100 mol %) as described above is because crystals are easily formed in the above region, and the non-crystal which is entrapped between the crystals forms a "tie chain" that serves as a bridge. In a region in which the content of the structure derived from CHDM is more than 20 mol % but less than 60%, CHDM and EG are present as a mixture and thus, regularity is lowered, a crystal is less likely to be formed, and a tie chain is less likely to be formed.

By the existence of such CHDM, the orientation property of the polyester molecules is increased, and the formation of tie chain is accelerated. The reason is as follows.

Since CHDM has a cyclic structure, CHDM hardly bends like EG, and is rigid.

Therefore, CHDM is easily orientated by an external force such as stretching.

The orientated molecules easily form a crystal, and easily form a tie chain.

A preferable amount of an aliphatic diol component (for example, ethyleneglycol or 1,4-cyclohexane dimethanol) used is in a range of from 1.015 mol to 1.50 mol with respect to one mol of the dicarboxylic acid component [in particular the aromatic dicarboxylic acid (for example, terephthalic acid) and an optional ester derivative thereof. The amount used is more preferably in a range of from 1.02 mol to 1.30 mol, and still more preferably in a range of from 1.025 mol to 1.10 mol. If the amount used is in a range of 1.015 mol or more, the esterification reaction proceeds satisfactorily, and if the amount used is in a range of 1.50 mol or less, generation of diethyleneglycol by the dimerization of ethyleneglycol and the like are suppressed, and therefore many properties such as melting point, glass transition temperature, crystallinity, heat resistance, hydrolysis resistance, and weather resistance can be maintained satisfactorily.

It is possible to use a conventionally known reaction catalyst for the esterification reaction or transesterification reaction. Examples of the reaction catalyst can include an alkali metal compound, an alkali earth metal compound, a zinc compound, a lead compound, a manganese compound, a cobalt compound, an aluminum compound, an antimony compound, a titanium compound, and a phosphorous compound. Normally, it is preferable to add an antimony compound, a germanium compound, or a titanium compound as a polymerization catalyst in an arbitrary step before completing the production method of the polyester. In such a method, if, for example, a germanium compound is taken as an example, it is preferable to add the germanium compound powder as it is.

For example, in an esterification reaction process, an aromatic dicarboxylic acid and an aliphatic diol are polymerized in the presence of a catalyst including a titanium compound. In this esterification reaction process, it is preferable to use an organic chelate titanium complex having an organic acid as a ligand as a titanium compound that is a catalyst, and add at least an organic chelate titanium complex, a magnesium compound, and a pentavalent phosphoric acid ester which does not have an aromatic ring as a substituent in this order.

In the beginning, an aromatic dicarboxylic acid and an aliphatic diol are mixed with a catalyst including an organic chelate titanium complex that is a titanium compound before adding a magnesium compound and a phosphorous compound. Since a titanium compound, such as an organic chelate titanium complex, has a high catalyst activity even with respect to esterification reaction, it is possible to perform esterification reaction satisfactorily. At this time, it is possible to add a titanium compound in the mixture of the dicarboxylic acid component and the diol component, or to mix the diol component (or the dicarboxylic acid component) after the dicarboxylic acid component (or the diol component) and a titanium compound are mixed. It is also possible to mix the dicarboxylic acid component, the diol component, and a titanium compound at the same time. The mixing method is not particularly limited, and a conventionally-known method can be used.

More preferable examples of polyester include polyethylene terephthalate (PET), polyethylene-2,6-naphthalate (PEN), polycyclohexanedimethylene terephthalate (PCT) containing a structure derived from 1,4-cyclohexane dimethanol, and a still more preferable example is PET.

The polyester in the invention is preferably polymerized by using one kind or two kinds or more of catalysts selected from a group consisting of germanium (Ge) catalysts, antimony (Sb) catalysts, aluminum (Al) catalysts and titanium (Ti) catalysts, and more preferably Ti catalysts.

The Ti catalyst has a high reaction activity, and can lower the polymerization temperature. For this reason, it is possible to suppress the generation of COOH due to thermal decomposition of polyester, particularly during the polymerization reaction. Namely, by using a Ti catalyst, the amount of terminal carboxylic acid in polyester, which contributes to thermal decomposition, can be reduced, and the formation of foreign substance can be suppressed. By reducing the amount of terminal carboxylic acid in polyester, thermal decomposition of the polyester film can also be suppressed, after producing a polyester film.

Examples of the Ti catalysts can include an oxide, a hydroxide, an alkoxide, a carboxylic acid salt, a carbonate, an oxalate, an organic chelate titanium complex, and a halide. The Ti catalysts may be used in combination of two or more kinds of titanium compounds as long as they do not deteriorate the effects of the present invention.

Examples of the Ti catalysts include a titanium alkoxide, such as tetra-n-propyl titanate, tetra-i-propyl titanate, tetra-n-butyl titanate, tetra-n-butyl titanate tetramer, tetra-t-butyl titanate, tetracyclohexyl titanate, tetraphenyl titanate, and tetrabenzyl titanate, a titanium oxide obtained by the hydrolysis of a titanium alkoxide, a titanium-silicon or zirconium composite oxide obtained by the hydrolysis of a mixture of a titanium alkoxide and a silicon alkoxide or a zirconium alkoxide, titanium acetate, titanium oxalate, potassium titanium oxalate, sodium titanium oxalate, potassium titanate, sodium titanate, a mixture of titanic acid and aluminum hydroxide, titanium chloride, a mixture of titanium chloride and aluminum chloride, titanium acetylacetonate, and an organic chelate titanium complex having an organic acid as a ligand.

In the case of carrying out polymerization of polyester, it is preferable to carry out polymerization by using the titanium (Ti) compound as a catalyst in an amount of from 1 ppm to 50 ppm, more preferably from 2 ppm to 30 ppm, and still more preferably from 3 ppm to 15 ppm, in terms of titanium element content. In this case, 1 ppm to 50 ppm of titanium element is contained in the raw material polyester resin.

When the amount of titanium element contained in the raw material polyester resin is 1 ppm or more, the weight average molecular weight (Mw) of the polyester is increased, and thermal decomposition is less likely to occur. As a result, the amount of foreign substance inside the extruder is reduced. When the amount of titanium element contained in the raw material polyester resin is 50 ppm or less, the Ti catalyst is less likely to become a foreign substance, and stretching unevenness is reduced at the time of stretching of the polyester sheet.

<Titanium Compound>

It is preferable that as a titanium compound which is a catalyst component, at least one kind of an organic chelate titanium complex having an organic acid as a ligand is used. Examples of the organic acid include citric acid, lactic acid, trimellitic acid, and malic acid. Among them, an organic chelate complex having citric acid or a citric salt as a ligand is preferable.

For example, in the case of using a chelate titanium complex having citric acid as a ligand, only a small amount of foreign substances, such as fine particles, are generated, and compared with other titanium compounds, a polyester having a satisfactory polymerization activity and color tone can be obtained. Furthermore, in the case of using a citric acid chelate titanium complex, a polyester having a satisfactory polymerization activity and color tone and a small amount of terminal carboxyl groups may be obtained by a method to add the complex in the esterification reaction step, compared with the case of adding the complex after esterification reaction. Regarding this point, it is assumed that, since a titanium catalyst has a catalyst effect in the esterification reaction, the acid value of an oligomer after the completion of esterification reaction is decreased by adding the complex in the esterification step, and therefore the subsequent polycondensation reaction is performed more efficiently; and that a complex having a citric acid as a ligand has a strong hydrolysis resistance, compared with, for example, a titanium alkoxide, and therefore hydrolysis does not occur during an esterification reaction process, so that the titanium catalyst can effectively act as a catalyst for esterification reaction and polycondensation reaction while maintaining its intrinsic activity.

It is known that, generally, as the amount of terminal carboxyl groups increases, hydrolysis resistance deteriorates, but since the amount of terminal carboxyl groups is decreased according to the method described above, improvement in hydrolysis resistance is expected.

The citric acid chelate titanium complex can be easily obtained from a commercially available product, such as VERTEC AC-420 manufactured by Johnson Matthey.

The aromatic dicarboxylic acid and the aliphatic diol can be introduced by preparing a slurry including them and continuously supplying the slurry to the esterification reaction step.

Examples of titanium compounds other than an organic chelate titanium complex include, generally, an oxide, a hydroxide, an alkoxide, a carboxylic acid salt, a carbonate, an oxalate, and a halide. Other titanium compounds may be used together with an organic chelate titanium complex as long as they do not impair the effects of the present invention.

Examples of the titanium compounds include a titanium alkoxide, such as tetra-n-propyl titanate, tetra-i-propyl titanate, tetra-n-butyl titanate, tetra-n-butyl titanate tetramer, tetra-t-butyl titanate, tetracyclohexyl titanate, tetraphenyl titanate, and tetrabenzyl titanate, a titanium oxide obtained by the hydrolysis of a titanium alkoxide, a titanium-silicon or zirconium composite oxide obtained by the hydrolysis of a mixture of a titanium alkoxide and a silicon alkoxide or a zirconium alkoxide, titanium acetate, titanium oxalate, potassium titanium oxalate, sodium titanium oxalate, a potassium titanate, a sodium titanate, a mixture of a titanic acid and an aluminum hydroxide, a titanium chloride, a mixture of a titanium chloride and an aluminum chloride, and titanium acetylacetonate.

In the present invention, it is preferable to prepare a polyester by a production method of a polyester resin including: an esterification reaction step which includes at least polymerizing an aromatic dicarboxylic acid and an aliphatic diol in the presence of a catalyst containing a titanium compound including an organic chelated titanium complex having an organic acid as a ligand, and adding the organic chelated titanium complex, a magnesium compound, and a pentavalent phosphoric acid ester which does not have an aromatic ring as a substituent, in this order; and a polycondensation step of subjecting an esterification reaction product produced by the esterification reaction step to a polycondensation reaction to produce a polycondensation product.

In this case, since an order of addition of adding an organic chelated titanium complex as a titanium compound, adding a magnesium compound, and then adding a specific pentavalent phosphorus compound is employed in the process of the esterification reaction, the reaction activity of the titanium catalyst can be maintained to be appropriately high, the electrostatic applicability can be imparted by magnesium, and the decomposition reaction in the polycondensation can be effectively suppressed. Therefore, as a result, a polyester is obtained which has less coloration and high electrostatic applicability, and exhibits an improvement in yellowing during exposure to high temperature.

Thereby, a polyester may be provided which undergoes less coloration during polymerization and during the subsequent melt film forming, so that the yellow tinge is reduced as compared with the conventional polyesters obtained by antimony (Sb) catalyst systems, which has a color tone and transparency that are comparable to those of the relatively highly transparent polyesters obtained by germanium catalyst systems, and which has excellent heat resistance. Furthermore, a polyester having high transparency and a reduced yellow tinge may be obtained without using a color adjusting material such as a cobalt compound or a colorant.

This polyester may be used for applications where the demand for transparency is high (for example, optical films and industrial lith films), and since there is no need to use expensive germanium-based catalysts, a significant reduction in cost can be made. In addition, because the incorporation of catalyst-induced foreign matter that is easily generated in Sb catalyst systems can also be avoided, the occurrence of failure during the film forming process and quality defects are also reduced, so that cost reduction as a result of yield improvement can be made.

For carrying out the esterification reaction, it is preferable that a process of adding an organic chelated titanium complex, which is a titanium compound, and a magnesium compound and a pentavalent phosphorus compound as additives, in this order, is provided. At this time, the esterification reaction proceeds in the presence of the organic chelated titanium complex, and then the magnesium compound may be added before the addition of the phosphorus compound.

[Phosphorus Compound]

As a pentavalent phosphorous compound, at least one of pentavalent phosphoric acid ester which does not have an aromatic ring as a substituent is used. Examples include phosphoric acid esters [$(OR)_3$—P=O; R=an alkyl group having 1 or 2 carbon atoms] containing a lower alkyl group having 2 or less carbon atoms as a substituent. Specifically, trimethyl phosphate and triethyl phosphate are particularly preferable.

The addition amount of the phosphorus compound is preferably an amount that corresponds to a content of P element of from 50 ppm to 90 ppm. The addition amount of the phosphorus compound is more preferably an amount that corresponds to a content of P element of from 60 ppm to 80 ppm, and even more preferably from 60 ppm to 75 ppm.

<Magnesium Compound>

When a magnesium compound is included in the polyester, electrostatic applicability onto the polyester is enhanced. In this case, coloration is likely to occur; however, according to the invention, coloration is suppressed, and thus excellent color tone and heat resistance can be obtained.

Examples of the magnesium compound include magnesium salts such as magnesium oxide, magnesium hydroxide, magnesium alkoxide, magnesium acetate, and magnesium carbonate. Among them, from the viewpoints of solubility in ethylene glycol, magnesium acetate is most preferable.

In order to impart high electrostatic applicability, the addition amount of the magnesium compound is preferably an amount that corresponds to a content of Mg element of 50 ppm or greater, and more preferably from 50 ppm to 100 ppm. The addition amount of the magnesium compound is, from the viewpoints of imparting electrostatic applicability, preferably an amount that corresponds to a content of Mg element of from 60 ppm to 90 ppm, and even more preferably from 70 ppm to 80 ppm.

In the esterification reaction step, it is particularly preferable to add the titanium compound as the catalyst component and the magnesium compound and phosphorus compound as the additives such that the value Z calculated from the following formula (i) satisfies the following formula (ii) to carry out melt polymerization. Here, the P content is the amount of phosphorus originating from the entirety of phosphorus compounds including the pentavalent phosphoric acid ester which does not have an aromatic ring, and the Ti content is the amount of titanium originating from the entirety of Ti compounds including the organic chelated titanium complex. As such, when a combination of a magnesium compound and a phosphorus compound is selected and used in a catalyst system containing a titanium compound, and the timing of addition and the proportion of addition are controlled, a color tone with less yellow tinge is obtained while the catalytic activity of the titanium compound is maintained to be appropriately high. Thus, a heat resistance can be imparted that does not easily cause yellowing even if the polyester resin is exposed to high temperature during the polymerization reaction or during the subsequent film forming process (during melting).

$$Z=5\times(\text{P content[ppm]/atomic weight of P})-2\times(\text{Mg content[ppm]/atomic weight of Mg})-4\times(\text{Ti content[ppm]/atomic weight of Ti}) \quad (i)$$

$$+0 \leq Z \leq +5.0 \quad (ii)$$

Since the phosphorus compound interacts with the titanium compound as well as the magnesium compound, this value is an index that quantitatively expresses the balance between the three components.

The formula (i) expresses the amount of phosphorus capable of acting on titanium, by subtracting the portion of phosphorus that acts on magnesium, from the total amount of phosphorus capable of reacting. In a case in which the value Z is positive, the system is in a state in which the phosphorus that inhibits titanium is in excess. In a case in which the value is negative, the system is in a state in which phosphorus that is required to inhibit titanium is insufficient. In regard to the reaction, since the respective atoms of Ti, Mg and P are not of equal valence, each of the mole numbers in the formula is weighted by multiplying by the valence.

In the invention, a polyester excellent in color tone and resistance to heat coloration may be obtained, while having a reaction activity necessary for the reaction, by using a titanium compound, a phosphorus compound and a magnesium compound that do not require special synthesis or the like and are easily available at low cost.

In the formula (ii), from the viewpoints of further enhancing the color tone and the resistance to heat coloration while maintaining the polymerization reactivity, it is preferable that $+1.0 \leq Z \leq +4.0$ is satisfied, and it is more preferable that $+1.5 \leq Z \leq +3.0$ is satisfied.

In a preferable embodiment according to the invention, a chelated titanium complex having citric acid or a citric acid salt as a ligand is added in an amount of from 1 ppm to 30 ppm to the aromatic dicarboxylic acid and the aliphatic diol before the esterification reaction is completed, and then in the presence of the chelated titanium complex, a magnesium salt of weak acid is added in an amount of from 60 ppm to 90 ppm (more preferably, from 70 ppm to 80 ppm), and after the addition, a pentavalent phosphoric acid ester which does not have an aromatic ring as a substituent is further added in an amount of from 60 ppm to 80 ppm (more preferably, from 65 ppm to 75 ppm).

In the above embodiment, it is preferable to add the chelate titanium complex (organic chelate titanium complex), the magnesium salt (magnesium compound), and the pentavalent phosphorous compound, each in an amount of 70% by mass or more of the respective total addition amount, in the order described above.

The esterification reaction may be carried out by using a multistage type apparatus having at least two reactors connected in series under the conditions in which ethylene glycol is refluxed, while removing the water or alcohol generated by the reaction from the system.

The esterification reaction described above may be carried out in a single step, or may be carried out in divided multiple stages.

In a case in which the esterification reaction is carried out in a single step, the esterification reaction temperature is preferably 230° C. to 260° C., and more preferably 240° C. to 250° C.

In a case in which the esterification reaction is carried out in divided multiple stages, the temperature of the esterification reaction at the first reaction tank is preferably 230° C. to 260° C., and more preferably 240° C. to 250° C., and the pressure is preferably 1.0 kg/cm² to 5.0 kg/cm², and more preferably 2.0 kg/cm² to 3.0 kg/cm². The temperature of the esterification reaction at the second reaction tank is preferably 230° C. to 260° C., and more preferably 245° C. to 255° C., and the pressure is preferably 0.5 kg/cm² to 5.0 kg/cm², and more preferably 1.0 kg/cm² to 3.0 kg/cm². Furthermore, in a case in which the esterification reaction is carried out in divided three or more stages, the conditions for the esterification reaction in the middle stages are preferably established to be intermediate between the conditions at the first reaction tank and the conditions at the final reaction tank.

—Polycondensation—

In the polycondensation, a polycondensation product is produced by a polycondensation reaction of the esterification reaction product produced in the esterification reaction.

The polycondensation reaction may be carried out in a single stage, or may be carried out in divided multiple stages.

The esterification reaction product such as oligomers produced in the esterification reaction is continuously subjected to a polycondensation reaction. This polycondensation reaction can be preferably carried out by supplying the esterification reaction product to polycondensation reaction tanks of multiple stages.

For example, the polycondensation reaction conditions, in the case of performing the reaction in a three-stage reaction tank, are that the reaction temperature at the first reaction tank is preferably 255° C. to 280° C., and more preferably 265° C. to 275° C., and the pressure is preferably 100 torr to 10 torr ($13.3 \times 10^{-3}$ MPa to $1.3 \times 10^{-3}$ MPa), and more preferably 50 torr to 20 torr ($6.67 \times 10^{-3}$ MPa to $2.67 \times 10^{-3}$ MPa). The reaction temperature at the second reaction tank is preferably 265° C. to 285° C., and more preferably 270° C. to 280° C., and the pressure is preferably 20 torr to 1 torr ($2.67 \times 10^{-3}$ MPa to $1.33 \times 10^{-4}$ MPa), and more preferably 10 torr to 3 torr ($1.33 \times 10^{-3}$ MPa to $4.0 \times 10^{-4}$ MPa). In the third and final reaction tank, the reaction temperature is preferably 270° C. to 290° C., and more preferably 275° C. to 285° C., and the pressure is preferably 10 torr to 0.1 torr ($1.33 \times 10^{-3}$ MPa to $1.33 \times 10^{-5}$ MPa), and more preferably 5 torr to 0.5 torr ($6.67 \times 10^{-4}$ MPa to $6.67 \times 10^{-5}$ MPa).

Further, for the synthesis of polycyclohexanedimethylene terephthalate (PCT) including a structure of 1,4-cyclohexanedimethylene (CHDM), according to the invention, the method described in, for example, paragraphs 0089 to 0090, and 0120 to 0121 of WO 2009/125701 can also be used, preferably.

Moreover, for the synthesis of polyethylene-2,6-naphthalate (PEN) according to the invention, the method described in, for example, paragraph 0170 of JP-A No. 2011-153209, and paragraph 0046 and 0060 of JP-A No. 2008-39803 can also be used, preferably.

The polyester synthesized as described above may further contain additives such as a light stabilizer, an antioxidant, an ultraviolet absorbent, a flame retardant, a lubricant (fine particles), a nucleating agent (crystallizing agent), or a crystallization inhibitor.

The polyester which is a raw material of a polyester sheet is preferably a solid-phase polymerized pellet.

By further carrying out solid phase polymerization after polymerization through the esterification reaction, a moisture content in a polyester film, a crystallization degree, an acid value of polyester, that is, a concentration of terminal carboxyl groups (acid value; AV) of polyester, and an intrinsic viscosity (IV) can be controlled.

In the solid phase polymerization of polyester, substances obtained by processing the polyester that is polymerized through the esterification reaction described above or a commercially available polyester into small pieces, such as pellets, may be used as a starting material.

The solid phase polymerization of polyester may be a continuous method (a method of filling a resin in a tower, allowing the resin to flow slowly for a predetermined time, while being heated, and then sequentially discharging the resin) or may be a batch method (a method of introducing a resin into a container, and heating the resin for a predetermined time).

The solid phase polymerization is preferably carried out in a vacuum or in a nitrogen atmosphere.

The temperature of the solid phase polymerization of polyester is preferably from 150° C. to 250° C., more preferably from 170° C. to 240° C., and still more preferably from 180° C. to 230° C. When the temperature is within the above range, the acid value (AV) of the polyester may be further reduced, which is thus preferable.

Further, the time of the solid phase polymerization is preferably from 1 hour to 100 hours, more preferably from 5 hours to 100 hours, still more preferably from 10 hours to 75 hours, and particularly preferably from 15 hours to 50 hours. When the time of the solid phase polymerization is within the above range, the acid value (AV) and intrinsic viscosity (IV) of the polyester can be easily controlled to fall within the preferable range.

The temperature of the solid phase polymerization is preferably from 170° C. to 240° C., more preferably from 180° C. to 230° C., and still more preferably from 190° C. to 220° C.

—Extrusion Process—

The obtained polyester pellets are dried under reduced pressure, for example, at a temperature of 180° C. for 3 hours or more, and then, under a nitrogen gas flow or under reduced pressure such that the intrinsic viscosity is not lowered, the resulting pellets are supplied to an extruder which is heated, for example, at a temperature of from 265° C. to 280° C. (more preferably at a temperature of from 270° C. to 275° C.), and extruded from a slit-shaped die.

Thereafter, cooling is performed on a casting roll, thereby obtaining an unstretched film. In this process, it is preferable to use a filter, for example, a filter made of a material such as sintered metal, porous ceramics, sand, or wire net, for removing foreign substances or decomposed polymers. Further, if necessary, a gear pump may be provided in order to enhance the quantitative feeding property.

In the case of layering films one on another, plural kinds of polymers are melt and layered one on another, using two or more extruders and a manifold or a junction block.

In the invention, in the case of using the CHDM based polyester (PCT), it is preferable that the polyester film has a laminate structure. It is enough that the polyester film has at least one layer that contains PCT. The polyester film may be formed of a single layer or may have two or more layers. Namely, the polyester film may be a laminated body of a layer that contains the CHDM based polyester and other layer. Particularly, when the content of the structure derived from CHDM is 80 mol % to 100 mol %, it is preferable to form a laminate structure. This is because, when the proportion of the structure derived from CHDM becomes higher, as compared with polyethylene terephthalate (PET), the heat resistance and resistance to climatic conditions (hydrolysis resistance) are easily enhanced, whereas the bending property and flexibility are easily deteriorated. Thus, when other polyester (for example, PET) is layered together, complement becomes possible, which is preferable.

In a preferable embodiment, the polyester film of the invention has a laminate structure and includes a layer (which is called P1 layer) containing the above CHDM based polyester and a layer (which is called P2 layer) containing a polyester that contains polyethylene terephthalate as a main component.

The P2 layer indicates a layer which has terephthalic acid units in an amount of 95% or more of the dicarboxylic acid units and contains ethylene glycol units in an amount of 95 mol % or more of the diol units.

Further, the IV of the P2 layer is preferably from 0.7 to 0.9, more preferably from 0.72 to 0.85, and still more preferably from 0.74 to 0.82. By having a higher IV as described above, decomposition (reduction in molecular weight) during wet thermo processing or dry thermo processing may be suppressed.

In the polyester film of the invention, the sum of the layer number of P1 layer and the layer number of P2 layer is preferably two or more, more preferably from 2 to 5, and still more preferably from 2 to 4. Above all, a three-layer structure in which P1 layers are put on the two sides of P2 layer, a three-layer structure in which P2 layers are put on the two sides of P1 layer, or a two-layer structure in which P2 layer and P1 layer are layered one on another is preferable.

In the case in which the polyester film of the invention has two or more layers, it is preferable that the sum of the thicknesses of P1 layers accounts for 5% to 40% of the total thickness. The proportion is more preferably from 7% to 38%, and still more preferably from 10% to 35%. When the sum of the thicknesses of P1 layers is more than the above lower limit, a high resistance to climatic conditions is exhibited, and when the sum of the thicknesses of P1 layers is less than the above upper limit, a high mechanical strength is likely to be exhibited.

Such a laminate structure can be prepared by a generally used method, and can be achieved by layering and extruding melts (molten materials of resin) supplied from plural extruder using a mutimanifold die or a feed block die.

The thickness of each layer can be determined by measuring the cross-section of the film using an SIMS, and performing imaging of the fragment of the P1 layer and the fragment of the P2 layer.

The melt (molten material) that has been extruded form the die is cooled and solidified on a casting roll or the like, to obtain an unstretched film. This unstretched film is then subjected to the next stretching process.

—Stretching Process—

In the method for producing a polyester film of the invention, after the extruding process, the polyester sheet that has been molded in the extruding process is longitudinally stretched in the longitudinal direction and also horizontally stretched in the width direction perpendicular to the longitudinal direction, thereby forming a polyester film.

In the stretching process, the longitudinal stretch ratio is preferably 2 times to 5 times, more preferably from 2.5 times to 4.5 times, and still more preferably from 2.8 times to 4 times. Further, the area stretch ratio which is represented by the product of longitudinal stretch ratio by horizontal stretch ratio is preferably 6 times to 18 times the area of the polyester film before stretching, more preferably from 8 times to 17.5 times, and still more preferably from 10 times to 17 times.

The temperature at the time of longitudinal stretching (hereinafter, may also referred to as "longitudinal stretching temperature") is preferably from Tg−20° C. to Tg+50° C., more preferably from Tg−10° C. to Tg+40° C., and still more preferably from Tg to Tg+30° C., in which Tg represents the glass transition temperature of the polyester.

The glass transition temperature (Tg) can be measured according to JIS K7121, ASTM D3418-82, or the like. For example, in the invention, Tg is measured using a differential scanning calorimeter (DSC) manufactured by Shimadzu Corporation.

Specifically, as a sample, 10 mg of a polymer such as polyester is weighed and set in an aluminum pan, and while elevating the temperature from room temperature to the final temperature of 300° C. at a temperature elevating rate of 10° C./min, the heat quantity verses temperature is measured using a DSC device, and the temperature of the peak top of the DSC curve is designated as the glass transition temperature.

Separately from the longitudinal stretching, horizontal stretching is also carried out. Accordingly, in the method for producing a polyester film of the invention, a polyester sheet is stretched at least biaxially, in the longitudinal direction thereof (conveyance direction, MD) and in the width direction (TD: transverse direction) perpendicular to the longitudinal direction. Stretching may be carried out at least once in each of MD and TD.

Note that, the expression "the width direction (TD) perpendicular to the longitudinal direction (MD)" intends a direction that crosses at right angles (90°) to the longitudinal direction (MD) of the polyester sheet, but due to mechanical error or the like, the direction which is considered that the angle with respect to the longitudinal direction (namely, the conveyance direction) is substantially 90° (for example, the direction in which the angle with respect to the MD direction is 90°±5°) is involved.

The method of performing biaxial stretching may be any of a successive biaxial stretching method in which longitudinal stretching and horizontal stretching are carried out separately, or a simultaneous biaxial stretching method in which longitudinal stretching and horizontal stretching are carried out at the same time. The longitudinal stretching and the horizontal stretching, each independently, may be carried out two or more times, and the order of the longitudinal stretching and the horizontal stretching is not limited. Examples of a stretching embodiment include longitudinal stretching→horizontal stretching, longitudinal stretching→horizontal stretching→longitudinal stretching, longitudinal stretching→longitudinal stretching→horizontal stretching, and horizontal stretching→longitudinal stretching. Among them, longitudinal stretching→horizontal stretching is preferable.

In the stretching process, it is preferred that the polyester sheet that has been pre-heated in the pre-heating process is longitudinally stretched in the longitudinal direction (MD) while applying a tension, and further stretched in the width direction (TD) perpendicular to MD, while applying a tension.

In the stretching process, during stretching, the film shrinks in the film width direction when the film is longitudinally stretched, and the width shrinkage ratio in this process is referred to as the neck-in length. Specifically, the width of the polyester sheet before longitudinal stretching is taken as "A" and the width of the polyester film after longitudinal stretching is taken as "B", and the value [%] determined from the following equation is the neck-in length.

$$\text{Neck-in length}(\%) = 100 \times \{(A-B)/A\}$$

In the invention, the neck-in length in the longitudinal stretching is preferably from 10% to 35%. Above all, the neck-in length is more preferably from 12% to 32%, and still more preferably from 15% to 30%. Generally, the neck-in length of a polyester film is set at 5% or less; however, the invention is characterized in that the neck-in length is set at a larger value as described above. When the neck-in length is large, a tie chain between crystals can be formed more easily.

The reason is as follows.

Namely, as the neck-in length at the time of longitudinal stretching gets larger, accordingly, the longitudinal orientation of polyester molecules can be accelerated. That is, since the film is longitudinally stretched in the longitudinal direction, it will shrink in the width direction, which is perpendicular to the longitudinal direction. On the contrary, when the neck-in length is made small, the shrinkage in the width direction is suppressed, and the same result is obtained as the result obtained when stretched in the width direction. As a result, the molecules are less likely to orientate in the longitudinal direction, and the molecules orientate also in the width direction. Thus, by promoting longitudinal orientation, both the crystal and non-crystal orientate in the longitudinal direction (longitudinal stretching direction), and a tie chain that bonds between crystals (an amorphous molecule that bridges between crystals) is likely to be formed.

In the above, when the neck-in length is 10% or more, the embrittlement caused by an excessive increase in the amount of crystals formed can be prevented, the maximum stress in the tensile test becomes high, and the heat resistance is enhanced. Further, it is advantageous in that breakage is less likely to occur during horizontal stretching which is carried out after longitudinal stretching. The neck-in length being 35% or less is advantageous in that lowering of strength due to the embrittlement, which is caused by an excessive increase in the amount of tie chains, never occurs.

In order to achieve the neck-in length as described above, the following method is described.

Generally, longitudinal stretching is achieved by using two or more pairs of nip rolls and increasing the circumferential speed from the upstream toward the downstream. In this process, the interval between the nip rolls is preferably adjusted within a range of from 0.3 times to 5 times the width of the original sheet. In this process, when the distance between the nip rolls is long, it is possible to carry out neck-in in this region. On the contrary, when the distance between the nip rolls is short, the original sheet is restricted by the nip rolls and it is impossible to carry out neck-in.

When the nip roll interval is long, elongation unevenness occurs easily. That is, anywhere in the long region between the nip rolls can be stretched, and when a portion having a higher temperature, even the slightest, exists during stretching, the stretch ratio becomes higher at this portion, and elongation unevenness occurs easily. In order to suppress this action, it is preferable to raise the temperature of the original sheet from the inlet toward the outlet. Thereby, the stretching temperature is raised gradually and it becomes possible to prevent the occurrence of elongation unevenness. Namely, in a case in which the entire region of the sheet is made to have the same temperature, when a portion having a slightly higher temperature exists, stretching may proceeds more easily in that region, and thus, uniformity of temperature over the wide sheet region is needed. In order to avoid this, it is preferable to perform longitudinal stretching such that the surface temperature of the polyester sheet becomes higher by 1° C. to 10° C. from the inlet side toward the outlet side in the region to be longitudinally stretched. When temperature gradient is applied, the sheet region range where the temperature should be uniform may be narrower, and elongation unevenness due to temperature unevenness is hardly caused. Accordingly, breakage is less likely to occur and the heat resistance is enhanced.

When the temperature gradient is 1° C. or more, elongation unevenness is less likely to occur, and breakage is less likely to be caused. When the temperature gradient is 10° C. or less, a region where the stretching temperature is extremely high or a region where the stretching temperature is extremely low is less likely to exist, elongation unevenness is less likely to occur, and thus, breakage is less likely to be caused.

Above all, concerning the surface temperature of the polyester sheet, the temperature gradient from the inlet side toward the outlet side in the region to be longitudinally stretched is more preferably from 1.5° C. to 8° C., and still more preferably from 2° C. to 8° C.

The temperature gradient as described above may be achieved by providing plural reflection type heaters or hot air blow-out ports, in the region between at least two pairs of nip rolls and gradually raising the temperature thereof. Note that, the temperature gradient refers to the difference in temperature of the film between the stretch initiation point and the stretch end point (the most upstream portion and the most downstream portion of nip rolls having a different circumferential speed).

—Heat Setting Process—

In the heat setting process in the invention, after the stretching process, the polyester film that has been subjected to longitudinal stretching and horizontal stretching is heated and crystallized to perform heat setting. The "heat setting" refers to the operation of carrying out crystallization by heating a polyester sheet at a specific temperature, while stretching the polyester sheet by applying tension.

The heat setting temperature refers to the maximum achievable film surface temperature of the polyester film after longitudinal stretching and horizontal stretching, and is preferably in a range of from 180° C. to 210° C. Above all, the heat setting temperature is more preferably from 185° C. to 208° C., and still more preferably from 190° C. to 205° C. When the heat setting temperature is 180° C. or higher, crystal growth proceeds favorably, which is advantageous for the formation of tie chain. When the heat setting temperature is 210° C. or lower, crystal melting is suppressed, which is advantageous for the formation of tie chain. Thereby, the maximum stress in the tensile test is heightened and the heat resistance is enhanced.

The maximum achievable film surface temperature (heat setting temperature) is a value obtained by measuring the surface temperature of the polyester film using a radiation thermometer.

Further, it is preferable that heating is performed while applying temperature modulation within the range of from 1° C. to 20° C., at the time of heat setting. The temperature range for temperature modulation is more preferably from 2° C. to 18° C., and still more preferably from 3° C. to 16° C. By performing temperature modulation within this range, the maximum stress of polyester in the tensile test becomes still higher, and the heat resistance is further enhanced.

The temperature modulation during heat setting may be performed at least once in temperature elevation and temperature drop. That is, by cooling, after melting the crystal by raising the temperature, recrystallization can be accelerated. Thereby, a substance that melts easily (an incomplete substance for crystal structure) is melted and recrystallized, and thus, the degree of completion of crystal is further enhanced and a firm crystal is formed. The tie chain between crystals also becomes firm, and the stress heat resistance can be further enhanced.

In the invention, when the temperature modulation is 1° C. or more, the effect described above is exhibited and the improvement effect in stress heat resistance is expected. When the temperature modulation is 20° C. or less, crystal melting is suppressed at the higher temperature side, as well as crystal formation proceeds favorably at the lower temperature side, and thus the heat resistance can be enhanced still further.

Such temperature modulation can be applied by providing plural hot air blow-out ports in the heat setting zone, or providing a light-concentration type reflection heater capable of partial heating.

Heating of film at the time of heat setting may be carried out from one side of the film, or may be carried out from the two sides of the film.

—Heat Relaxation Process—

In the method for producing a polyester film of the invention, a relaxation process may be provided after the heat setting process. In the relaxation process, the polyester film that has been heat fixed in the heat setting process is heated to relax the tension of the polyester film. Thereby, the residual strain is removed, and dimensional stability of the film is enhanced.

In a preferable embodiment, heat relaxation is applied to the polyester film by heating the polyester film such that the maximum achievable film surface temperature (heat relaxation temperature) of the surface of the polyester film is lower by 5° C. or more than the maximum achievable film surface temperature (heat setting temperature) of the polyester film at the time of heat setting.

By heating at a heat relaxation temperature which is lower by 5° C. or more than the heat setting temperature to relax the tension (to reduce the stretch tension), the dimensional stability of the polyester film can be further enhanced. When the heat relaxation temperature is "heat setting temperature-5° C." or less, the hydrolysis resistance of polyester that constitutes the polyester film is more excellent. Further, it is preferable the heat relaxation temperature is 100° C. or higher, from the viewpoint that the dimensional stability becomes favorable.

Moreover, in the invention, a cooling process of cooling the polyester film that has been heat-relaxed in the heat relaxation process may further be provided. By cooling, the shape of the polyester film is fixed.

After the heat relaxation process or the cooling process, a process in which the polyester film is wound into a roll shape and is collected may be provided.

<Back Sheet for Solar Cells>

The back sheet for solar cells in the invention is constructed by providing the polyester film of the invention as described above, and may be constructed by providing at least one layer of functional layers such as an readily adhesive layer having high adhesiveness, an ultraviolet absorbing layer, and a white layer having light reflectivity, to an object of adhesion. When the polyester film described above is included, the back sheet exhibits durability performance that is stabilized for long-term use.

In the back sheet for solar cells of the invention, for example, functional layers such as described below may be provided by coating on a polyester film after biaxial stretching. For the coating, known coating techniques such as a roll coating method, a knife edge coating method, a gravure coating method and a curtain coating method can be used.

Furthermore, a surface treatment (flame treatment, corona treatment, plasma treatment, ultraviolet treatment, or the like) may also be carried out before coating of these functional layers. Furthermore, pasting of the functional layers by using an adhesive is also preferable.

—Readily Adhesive Layer—

When the polyester film of the invention constitutes a solar cell module, the polyester film preferably has an readily adhesive layer on the side facing the sealing material of the cell-side substrate to which a solar cell element is sealed with a sealant. When an readily adhesive layer exhibiting adhesiveness to an object of adhesion (for example, the surface of the sealant on the cell-side substrate to which a solar cell element is sealed with a sealing material) including a sealant (particularly, an ethylene-vinyl acetate copolymer), high firm adhesion between the back sheet and the sealing material can be attained. Specifically, the readily adhesive layer preferably has an adhesive power of 10 N/cm or greater, and preferably 20 N/cm or greater, particularly with respect to EVA (ethylene-vinyl acetate copolymer) that is used as a sealing material.

Furthermore, the readily adhesive layer is necessary to be such that peeling of the back sheet during the use of a solar cell module does not occur, and for that reason, it is preferable for the readily adhesive layer to have high moisture-heat resistance properties.

(1) Binder

The readily adhesive layer according to the invention can contain at least one binder.

Examples of the binder that can be use include polyester, polyurethane, an acrylic resin, and polyolefin. Among them, from the viewpoint of durability, an acrylic resin and polyolefin are preferable. As an acrylic resin, a composite resin of acrylic and silicone is also preferable. Preferable examples of the binder include the following compounds.

Examples of the polyolefin include CHEMIPEARL S-120 and CHEMIPEARL S-75N (trade names, all manufactured by Mitsui Chemicals, Inc.). Examples of the acrylic resin include JURYMER ET-410 and JURYMER SEK-301 (trade names, all manufactured by Nihon Junyaku Co., Ltd.). Furthermore, examples of the composite resin of acrylic and silicone include CERANATE WSA1060 and CERANATE WSA1070 (trade names, all manufactured by DIC Corp.), and H7620, H7630 and H7650 (trade names, all manufactured by Asahi Kasei Chemicals Corp.).

The amount of the binder is preferably in the range of 0.05 g/m$^2$ to 5 g/m$^2$, and particularly preferably in the range of 0.08 g/m$^2$ to 3 g/m$^2$. When the amount of the binder is 0.05 g/m$^2$ or greater, more satisfactory adhesive power is obtained, and when the amount of the binder is 5 g/m$^2$ or less, a more satisfactory surface state is obtained.

(2) Fine Particles

The readily adhesive layer according to the invention can contain at least one kind of fine particles. The readily adhesive layer preferably contains the fine particles in an amount of 5% by mass or greater relative to the total mass of the layer.

Suitable examples of the fine particles include inorganic fine particles of silica, calcium carbonate, magnesium oxide, magnesium carbonate and tin oxide. Particularly among these, from the viewpoint that a decrease in the adhesiveness is small when exposed to a high temperature and high humidity atmosphere, fine particles of tin oxide and silica are preferable.

The particle size of the fine particles is preferably about 10 nm to 700 nm, and more preferably about 20 nm to 300 nm. When fine particles having a particle size in the range described above are used, satisfactory high adhesiveness can be obtained. There are no particular limitations on the shape of the fine particles, but fine particles having a spherical shape, an indefinite shape, a needle-like shape and the like can be used.

The amount of addition of the fine particles in the readily adhesive layer is preferably 5% to 400% by mass, and more preferably 50% to 300% by mass, based on the binder in the readily adhesive layer. When the amount of addition of the fine particles is 5% by mass or greater, the adhesiveness when the readily adhesive layer is exposed to a high temperature and high humidity atmosphere is excellent. When the amount of addition is 1000% by mass or less, the surface state of the readily adhesive layer is more satisfactory.

(3) Crosslinking Agent

The readily adhesive layer according to the invention can contain at least one crosslinking agent.

Examples of the crosslinking agent include epoxy-based, isocyanate-based, melamine-based, carbodiimide-based, and oxazoline-based crosslinking agents. From the viewpoint of securing adhesiveness after a lapse of time in a high temperature and high humidity atmosphere, among these crosslinking agents, particularly oxazoline-based crosslinking agents are preferable.

Specific examples of the oxazoline-based crosslinking agents include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-ethyl-2-oxazoline, 2,2'-bis(2-oxazoline), 2,2'-methylenebis(2-oxazoline), 2,2'-ethylenebis-(2-oxazoline), 2,2'-trimethylenebis(2-oxazoline), 2,2'-tetramethylenebis(2-oxazoline), 2,2'-hexamethylenebis(2-oxazoline), 2,2'-octamethylenebis(2-oxazoline), 2,2'-ethylenebis-(4,4'-dimethyl-2-oxazoline), 2,2'-p-phenylenebis-(2-oxazoline), 2,2'-m-phenylenebis-(2-oxazoline), 2,2'-m-phenylenebis-(4,4'-dimethyl-2-oxazoline), bis(2-oxazolinylcyclohexane) sulfide, and bis(2-oxazolinylnorbornane) sulfide. Furthermore, (co)polymers of these compounds can also be preferably used.

Furthermore, as a compound having an oxazoline group, EPOCROS K2010E, EPOCROS K2020E, EPOCROS K2030E, EPOCROS WS500, EPOCROS WS700 (trade names, all manufactured by Nippon Shokubai Co., Ltd.), and the like can also be used.

A preferable amount of addition of the crosslinking agent in the readily adhesive layer is preferably 5% to 50% by mass, and more preferably 20% to 40% by mass, based on the binder in the readily adhesive layer. When the amount of addition of the crosslinking agent is 5% by mass or greater, a satisfactory crosslinking effect is obtained, and a decrease in the strength of the reflective layer or adhesion failure does not easily occur. When the amount of addition of the crosslinking agent is 50% by mass or less, the pot life of the coating liquid can be maintained longer.

(4) Additives

The readily adhesive layer according to the invention may further contain, if necessary, a known matting agent such as polystyrene polymethyl methacrylate or silica; a known surfactant such as an anionic surfactant or a nonionic surfactant; and the like.

(5) Method for Forming Readily Adhesive Layer

Examples of the method for forming the readily adhesive layer of the invention include a method of pasting a polymer sheet having high adhesiveness to the polyester film, and a method based on coating. A method based on coating is preferable from the viewpoints of being convenient and capable of forming a highly uniform thin film. As the coating method, for example, a known method of using a gravure coater or a bar coater can be used. The solvent for the coating liquid that is used for coating may be water, or an organic solvent such as toluene or methyl ethyl ketone. One kind of solvent may be used alone, or a mixture of two or more kinds of solvent may also be used.

(6) Properties of Readily Adhesive Layer

The thickness of the readily adhesive layer according to the invention is not particularly limited, but usually, the thickness is preferably 0.05 μm to 8 μm, and more preferably in the range of 0.1 μm to 5 μm. When the thickness of the readily adhesive layer is 0.05 μm or greater, the high adhesiveness that is needed can be easily obtained, and when the thickness is 8 μm or less, the surface state can be more satisfactorily maintained.

Furthermore, the readily adhesive layer according to the invention is preferably transparent from the viewpoint that when a colored layer (particularly a reflective layer) is disposed between the readily adhesive layer and the polyester film, the readily adhesive layer does not impair the effect of the colored layer.

—Ultraviolet Absorption Layer—

The polyester film of the invention may be provided with an ultraviolet absorption layer containing the ultraviolet absorbers described above. The ultraviolet absorption layer can be disposed at any position on the polyester film.

The ultraviolet absorber is preferably used after being dissolved or dispersed together with an ionomer resin, a polyester resin, a urethane resin, an acrylic resin, a polyethylene resin, a polypropylene resin, a polyamide resin, a vinyl acetate resin, a cellulose ester resin and the like, and preferably has a transmittance of 20% or less with respect to light with a wavelength of 400 nm or less.

—Colored Layer—

The polyester film of the invention can be provided with a colored layer. The colored layer is a layer disposed to be in contact with the surface of the polyester film or with another layer interposed therebetween, and can be constructed using a pigment or a binder.

A first function of the colored layer is to increase the power generation efficiency of a solar cell module by reflecting a portion of light in the incident light, which is not used in the power generation at the photovoltaic cell and reaches the back sheet, and returning the portion of light to the photovoltaic cell. A second function is to enhance the decorative properties of the external appearance when the solar cell module is viewed from the front surface side. Generally, when a solar cell module is viewed from the front surface side, the back sheet is seen around the photovoltaic cell. Thus, the decorative properties can be increased by providing a colored layer to the back sheet.

(1) Pigment

The colored layer according to the invention can contain at least one pigment. The pigment is preferably included in an amount in the range of 2.5 $g/m^2$ to 8.5 $g/m^2$. More preferable pigment content is in the range of 4.5 $g/m^2$ to 7.5 $g/m^2$. When the pigment content is 2.5 $g/m^2$ or greater, necessary coloration can be easily obtained, and the light reflectivity or decorative properties can be further improved. When the pigment content is 8.5 $g/m^2$ or less, the surface state of the colored layer can be more satisfactorily maintained.

Examples of the pigment include inorganic pigments such as titanium oxide, barium sulfate, silicon oxide, aluminum oxide, magnesium oxide, calcium carbonate, kaolin, talc, ultramarine blue, Prussian blue, and carbon black; and organic pigments such as phthalocyanine blue and phthalocyanine green. Among these pigments, a white pigment is preferable from the viewpoint of constituting the colored layer as a reflective layer that reflects sunlight incident thereon. Preferable examples of the white pigment include titanium oxide, barium sulfate, silicon oxide, aluminum oxide, magnesium oxide, calcium carbonate, kaolin, and talc.

The average particle size of the pigment is preferably 0.03 μm to 0.8 μm, and more preferably about 0.15 μm to 0.5 μm. When the average particle size is in the range described above, the light reflection efficiency may be lowered.

In the case of constructing the colored layer as a reflective layer that reflects sunlight that has entered, the preferable amount of addition of the pigment in the reflective layer varies with the type or average particle size of the pigment used and cannot be defined briefly. However, the amount of addition of the pigment is preferably 1.5 g/m$^2$ to 15 g/m$^2$, and more preferably about 3 g/m$^2$ to 10 g/m$^2$. When the amount of addition is 1.5 g/m$^2$ or greater, a necessary reflection ratio can be easily obtained, and when the amount of addition is 15 g/m$^2$ or less, the strength of the reflective layer can be maintained at a higher level.

(2) Binder

The colored layer according to the invention can contain at least one binder. When the colored layer contains a binder, the amount of the binder is preferably in the range of 15% to 200% by mass, and more preferably in the range of 17% to 100% by mass, based on the pigment. When the amount of the binder is 15% by mass or greater, the strength of the colored layer can be maintained more satisfactorily, and when the amount is 200% by mass or less, the reflection ratio or decorative properties are lowered.

Examples of the binder suitable for the colored layer include polyester, polyurethane, an acrylic resin, and polyolefin. The binder is preferably an acrylic resin or a polyolefin from the viewpoint of durability. As an acrylic resin, a composite resin of acrylic and silicone is also preferable. Preferable examples of the binder include the following compounds.

Examples of the polyolefin include CHEMIPEARL S-120 and CHEMIPEARL S-75N (trade names, all manufactured by Mitsui Chemicals, Inc.). Examples of the acrylic resin include JURYMER ET-410 and JURYMER SEK-301 (trade names, all manufactured by Nihon Junyaku Co., Ltd.). Furthermore, examples of the composite resin of acrylic and silicone include CERANATE WSA1060 and CERANATE WSA1070 (trade names, all manufactured by DIC Corp.), and H7620, H7630 and H7650 (trade names, all manufactured by Asahi Kasei Chemicals Corp.).

(3) Additives

The colored layer according to the invention may further contain, if necessary, a crosslinking agent, a surfactant, a filler and the like, in addition to the binder and the pigment.

Examples of the crosslinking agent include epoxy-based, isocyanate-based, melamine-based, carbodiimide-based, and oxazoline-based crosslinking agents. The amount of addition of the crosslinking agent in the colored layer is preferably 5% to 50% by mass, and more preferably 10% to 40% by mass, based on the binder in the colored layer. When the amount of addition of the crosslinking agent is 5% by mass or greater, a satisfactory crosslinking effect is obtained, and the strength or adhesiveness of the colored layer can be maintained at a high level. When the amount of addition of the crosslinking agent is 50% by mass or less, the pot life of the coating liquid can be maintained longer.

As the surfactant, a known surfactant such as an anionic surfactant or a nonionic surfactant can be used. The amount of addition of the surfactant is preferably 0.1 mg/m$^2$ to 15 mg/m$^2$, and more preferably 0.5 mg/m$^2$ to 5 mg/m$^2$. When the amount of addition of the surfactant is 0.1 mg/m$^2$ or greater, the occurrence of cissing can be effectively suppressed, and when the amount of addition is 15 mg/m$^2$ or less, excellent adhesiveness is obtained.

Furthermore, the colored layer may also contain a filler such as silica, apart from the pigment described above. The amount of addition of the filler is preferably 20% by mass or less, and more preferably 15% by mass or less, based on the binder in the colored layer. When the colored layer contains a filler, the strength of the colored layer can be increased. Furthermore, when the amount of addition of the filler is 20% by mass or less, the proportion of the pigment can be retained, and therefore, satisfactory light reflectivity (reflection ratio) or decorative properties are obtained.

(4) Method for Forming Colored Layer

Examples of the method for forming a colored layer include a method of bonding a polymer sheet containing a pigment on the polyester film, a method of co-extruding the colored layer during the extruding of the polyester film, and a method based on coating. Among these, the method based on coating is preferable from the viewpoint of being convenient and capable of forming a highly uniform thin film. As the coating method, for example, a known method of using a gravure coater or a bar coater can be used. The solvent for the coating liquid used in the coating may be water, or may be an organic solvent such as toluene or methyl ethyl ketone. However, from the viewpoint of environmental burden, it is preferable to use water as the solvent.

One kind of solvent may be used alone, or mixtures of two or more kinds may also be used.

(5) Properties of Colored Layer

It is preferable that the colored layer contains a white pigment and is constructed as a white layer (light reflective layer). In the case where the colored layer is a reflective layer, the light reflection ratio for light at 550 nm is preferably 75% or greater. When the reflection ratio is 75% or greater, the portion of sunlight that passes through the photovoltaic cell and is not used in power generation can be returned to the cell, and a large effect of increasing the power generation efficiency is obtained.

The thickness of the white layer (light reflective layer) is preferably 1 μm to 20 μm, more preferably 1 μm to 10 μm, and even more preferably about 1.5 μm to 10 μm. When the thickness is 1 μm or greater, necessary decorative properties or a reflection ratio can be easily obtained, and when the thickness is 20 μm or less, the surface state may be deteriorated.

—Undercoat Layer—

The polyester film of the invention can be provided with an undercoat layer. The undercoat layer may be such that, for example, when a colored layer is provided, the undercoat layer may be provided between the colored layer and the polyester film. The undercoat layer can be constructed by using a binder, a crosslinking agent, a surfactant and the like.

Examples of the binder that is included in the undercoat layer include polyester, polyurethane, an acrylic resin, polyolefin and the like. The undercoat layer may contains an epoxy-based, isocyanate-based, melamine-based, carbodiimide-based or oxazoline-based crosslinking agent; an anionic or nonionic surfactant; a filler such as silica; and the like, in addition to the binder.

There are no particular limitations on the method for coating and forming the undercoat layer, or the solvent for the coating liquid used in the method.

As the coating method, for example, a gravure coater or a bar coater can be used. The solvent may be water, or may be an organic solvent such as toluene or methyl ethyl ketone. One kind of solvent may be used alone, or mixtures of two or more kinds of solvent may also be used.

Coating may be carried out such that the undercoat layer may be applied on a polyester film obtained after biaxial stretching, or may be applied on a polyester film obtained after uniaxial stretching. In this case, the polyester film may be further stretched, after applying the undercoat layer, in the direction different from the direction of initial stretching. Furthermore, the undercoat layer may be applied on a polyester film prior to stretching, and then the polyester film may be stretched in two directions.

The thickness of the undercoat layer is preferably 0.05 µm to 2 µm, and more preferably in the range of about 0.1 µm to 1.5 µm. When the layer thickness is 0.05 µm or greater, necessary adhesiveness can be easily obtained, and when the thickness is 2 µm or less, the surface state can be satisfactorily maintained.

—Fluorine-Based Resin Layer and Silicon-Based Resin Layer—

The polyester film of the invention is preferably provided with at least one of a fluorine-based resin (also referred as a fluorocarbon-based resin in some cases) layer and a silicon-based (Si-based) resin layer. When a fluorine-based resin layer or a Si-based resin layer is provided, prevention of contamination of the polyester surface and an enhancement of weather resistance can be promoted. Specifically, it is preferable that the polyester film has a fluorine resin-based coating layer such as those described in JP-A Nos. 2007-35694 and 2008-28294 and WO 2007/063698.

Furthermore, it is also preferable to adhere a fluorine-based resin film such as TEDLAR (trade name, manufactured by DuPont Company) to the polyester film.

The thicknesses of the fluorine-based resin layer and the Si-based resin layer are respectively preferably in the range of from 1 µm to 50 µm, more preferably in the range of from 1 µm to 40 µm, and even more preferably 1 µm to 10 µm.

—Inorganic Layer—

The polyester film of the invention which is further provided with an inorganic layer is also a preferable embodiment. When an inorganic layer is provided, functions such as moisture-proof property that prevents penetration of water or gas into the polyester or gas barrier properties can be imparted. The inorganic layer may be provided on the front surface or back surface of the polyester film, but from the viewpoints of waterproof and moisture-proof, the inorganic layer is suitably provided on the opposite side of the side which faces the cell-side substrate (the surface side where the colored layer or the readily adhesive layer is formed) of the polyester film.

The steam permeation amount (moisture permeability) of the inorganic layer is preferably $10^0$ g/m$^2$·d to $10^{-6}$ g/m$^2$·d, more preferably $10^1$ g/m$^2$·d to $10^{-5}$ g/m$^2$·d, and even more preferably $10^2$ g/m$^2$·d to $10^{-4}$ g/m$^2$·d.

In order to form an inorganic layer having such moisture permeability, a dry method such as described below is suitable.

Here, the moisture permeability may be measured based on JIS Z0208 and the like.

Examples of the method for forming an inorganic layer having gas barrier properties (hereinafter, also referred to as a gas barrier layer) by a dry method include vacuum deposition methods such as resistance heating deposition, electron beam deposition, induction heating deposition, and assisted methods using a plasma or an ion beam; sputtering methods such as a reactive sputtering method, an ion beam sputtering method, and an ECR (electron cyclone resonance) sputtering method; physical vapor deposition methods (PVD methods) such as an ion plating method; and chemical vapor deposition methods (CVD methods) using heat, light or plasma. Among them, vacuum deposition methods in which a film is formed by a deposition method in a vacuum, are preferable.

Here, when the material that forms the gas barrier layer contains an inorganic oxide, an inorganic nitride, an inorganic oxynitride, an inorganic halide, an inorganic sulfide or the like as main constituent components, a material having the same composition as the gas barrier layer that is to be formed can be directly volatilized and deposited on a substrate. However, in the case of performing this method, the composition changes during volatilization, and as a result, the film thus formed may not exhibit uniform characteristics. For that reason, the following methods may be used: (1) a method of using, as a volatile source, a material having the same composition as that of the barrier layer to be formed, and volatilizing the material while introducing an auxiliary gas into the system, such as oxygen gas in the case of an inorganic oxide; nitrogen gas in the case of an inorganic nitride; a mixed gas of oxygen gas and nitrogen gas in the case of an inorganic oxynitride; a halogen-based gas in the case of an inorganic halide; and a sulfur-based gas in the case of an inorganic sulfide; (2) a method of using a group of inorganic materials as a volatile source, introducing oxygen gas in the case of an inorganic oxide; nitrogen gas in the case of an inorganic nitride; a mixed gas of oxygen gas and nitrogen gas in the case of an inorganic oxynitride; a halogen-based gas in the case of an inorganic halide; and a sulfur-based gas in the case of an inorganic sulfide, into the system while volatilizing the inorganic material group, and performing deposition on the substrate surface while allowing the inorganic materials and the introduced gas to react with each other; and (3) a method of using an inorganic material group as a volatile source, forming a layer of the inorganic material group by volatilizing the inorganic material group, subsequently maintaining the layer in an oxygen gas atmosphere in the case of an inorganic oxide; in a nitrogen gas atmosphere in the case of an inorganic nitride; in a mixed gas atmosphere of oxygen gas and nitrogen gas in the case of an inorganic oxynitride; in a halogen-based gas atmosphere in the case of an inorganic halide; and in a sulfur-based gas atmosphere in the case of an inorganic sulfide, and thereby allowing the inorganic material layer and the introduced gas to react with each other.

Among these, from the viewpoint that it is easier to volatilize from the volatile source, the method (2) or (3) is preferably used. Furthermore, from the viewpoint that control of the film quality is easier, the method (2) is more preferably used. When the barrier layer is an inorganic oxide, a method of using an inorganic material group as a volatile source, volatilizing this material group to form a layer of the inorganic material group, and then leaving the layer to stand in air to naturally oxidize the inorganic material group, is also preferable from the viewpoint that the layer formation is facilitated.

Furthermore, it is also preferable to paste an aluminum foil and to use it as a barrier layer. The thickness is preferably from 1 µm to 30 µm. When the thickness is 1 µm or greater, it is difficult for water to penetrate into the polyester film during a lapse of time (thermo), and hydrolysis does not easily occur. When the thickness is 30 µm or less, the thickness of the barrier layer does not increase excessively, and deposits do not occur on the film due to the stress of the barrier layer.

<Solar Cell Module>

The solar cell module of the present invention includes the above-described polyester film of the invention, a polyester film produced by the above-described PET method for producing a polyester film, or the back sheet for a solar cell of the invention. In a preferable form of the invention, the solar cell module is constituted such that a solar cell element that converts the light energy of sunlight to electrical energy is disposed between a transparent front substrate, through which sunlight enters, and the above-described back sheet for a solar cell of the invention, and the solar cell element is sealed and adhered between the front substrate and the back sheet, using a sealing material such as an ethylene-vinyl acetate sealing material. That is, a cell structural portion having a solar cell element and a sealing material that seals the solar cell element is provided between the front substrate and the back sheet.

The details of the solar cell module, the photovoltaic cell, and members other than the back sheet are described in, for example, "Constituent Materials for Photovoltaic Power Generation System" (edited by Eiichi Sugimoto, Kogyo Chosakai Publishing Co., Ltd. published in 2008).

The transparent substrate may desirably have light transmitting properties by which sunlight can be transmitted, and can be appropriately selected from base materials that transmit light. From the viewpoint of power generation efficiency, a base material having higher light transmittance is preferable, and as such a substrate, for example, a glass substrate, a substrate of a transparent resin such as an acrylic resin, and the like can be suitably used.

As the solar cell element, various known solar cell elements such as silicon-based devices such as single crystal silicon, polycrystalline silicon and amorphous silicon; and Group III-V or Group II-VI compound semiconductor-based elements such as copper-indium-gallium-selenium, copper-indium-selenium, cadmium-tellurium and gallium-arsenic, may be applied.

EXAMPLES

Hereinafter, the invention will be more specifically described by way of Examples, but the invention is not intended to be limited to the following Examples as long as the main gist is maintained. In addition, the unit "parts" in the Examples is on a mass basis.

—1-1. Synthesis of Polyethylene Terephthalate—

As described below, a polyester resin (PET sample) was obtained using a continuous polymerization apparatus based on direct esterification method in which terephthalic acid and ethylene glycol are directly reacted with each other, water is distilled off, and after esterification, polycondensation is carried out under reduced pressure.

(1) Esterification Reaction 4.7 tons of high purity terephthalic acid and 1.8 tons of ethylene glycol were mixed over 90 minutes to form a slurry, and the slurry was continuously supplied to a first esterification reaction tank at a flow rate of 3800 kg/h. Furthermore, an ethylene glycol solution of a citric acid chelated titanium complex (VERTEC AC-420, trade name, manufactured by Johnson Matthey Plc.) having Ti metal coordinated with citric acid was continuously supplied, and a reaction was carried out at a temperature inside the reaction tank of 250° C. and for an average retention time of about 4.3 hours with stirring. At this time, the citric acid chelated titanium complex was continuously added such that the addition amount of Ti element was 9 ppm. At this time, the acid value of the oligomer thus obtained was 600 eq/ton.

This reaction product was transferred to a second esterification reaction tank, and with stirring, the reaction product was allowed to react at a temperature inside the reaction tank of 250° C. for an average retention time of 1.2 hours. Thus, an oligomer having an acid value of 200 eq/ton was obtained. The inside of the second esterification reaction tank was divided into three zones, so that the above reaction was conducted at the first zone, and an ethylene glycol solution of magnesium acetate was continuously supplied at the second zone such that the addition amount of Mg element was 75 ppm, and subsequently an ethylene glycol solution of trimethyl phosphate was continuously supplied at the third zone such that the addition amount of P element was 65 ppm.

The esterification reaction product obtained as described above was continuously supplied to a first condensation polymerization reaction tank, and with stirring, condensation polymerization was carried out at a reaction temperature of 270° C. and a pressure inside the reaction tank of $2.67 \times 10^{-3}$ MPa (20 Torr) for an average retention time of about 1.8 hours. Furthermore, the reaction product was transferred to a second condensation polymerization reaction tank, and in this reaction tank, a reaction (condensation polymerization) was carried out with stirring under the conditions of a temperature inside the reaction tank of 276° C. and a pressure inside the reaction tank of $6.67 \times 10^{-4}$ MPa (5.0 Torr) for a retention time of about 1.2 hours.

Subsequently, the reaction product was further transferred to a third condensation polymerization reaction tank, and in this reaction tank, a reaction (condensation polymerization) was carried out under the conditions of a temperature inside the reaction tank of 278° C. and a pressure inside the reaction tank of $2.0 \times 10^{-4}$ MPa (1.5 Torr) for a retention time of 1.5 hours. Thus, a reaction product (polyethylene terephthalate (PET)) was obtained.

The polyethylene terephthalate obtained above was formed in a pellet shape (volume of 12 mm$^3$) which was measured as IV=0.65 dL/g and AV=24 eq/ton.

—1-2. Polymerization of Polyester (PCT) Including CHDM Structure—

First process: using isophthalic acid (IPA) and terephthalic acid (TPA), as the dicarboxylic acid components, and cyclohexanedimethanol (CHDM) and ethylene glycol (EG), as the diol components, after melting magnesium acetate and antimony trioxide, as the catalysts, at 150° C. in a nitrogen atmosphere, the temperature was elevated to 230° C. over 3 hours, while stirring, and ethanol was distilled off, whereby transesterification reaction was finished. In this process, by changing the addition amounts of IPA, TPA, CHDM, and EG, CHDM based polyesters having the composition described below were obtained.

Second process: after finishing the transesterification reaction, an ethylene glycol solution obtained by dissolving phosphoric acid in ethylene glycol was added.

Third process: polymerization reaction was carried out under the conditions of a final achievable temperature of 285° C. and a vacuum degree of 0.1 Ton, to obtain a polyester, and this product was formed into pellets.

—2. Solid Phase Polymerization—

Next, the PET pellets and PCT pellets thus obtained were made to remain in a nitrogen gas atmosphere at 155° C. for 5 hours, whereby the polyester resins were dried, and crystallization treatment was performed.

Subsequently, the PET pellets and PCT pellets that had finished drying and crystallization treatment were made to move from the upper part toward the lower part of a cylindrical reaction vessel heated at 200° C. over 24 hours in a nitrogen gas atmosphere, to finish the solid phase polymerization. In this process, by changing the retention time and temperature, various PET pellets and PCT pellets, in which the IV and AV after film formation and the crystallization degree were adjusted to the desired values, were obtained.

—3. Preparation of Polyester Fine Particle Having High Crystallization Degree—

Regarding the PET pellets and PCT pellets that had finished the above solid phase polymerization, some of the pellets were taken out and crushed, and the resultants were put through a sieve to select fine particles having a size of from 100 μm to 1 mm. Further, the fine particles thus obtained were heat-treated at 200° C. in a vacuum for a period of from 12 hours to 72 hours, thereby obtaining polyester fine particles having a high crystallization degree.

<Crystallization Degree>

The crystallization degree of the polyester fine particle before and after the heat treatment at 200° C. in a vacuum was measured by the method described below. The crystallization degree before heat treatment indicates the crystallization degree of the PET pellet after the above solid phase polymerization.

Next, by subtracting the crystallization degree of the polyester fine particle before heat treatment (after solid phase polymerization) from the crystallization degree of the polyester fine particle after heat treatment, the difference in crystallization degree was determined. The obtained value is shown in Table 1 below.

—4. Extrusion and Casting—

The PET pellets and PCT pellets, which had finished the solid phase polymerization as described above, and the polyester fine particle having a high crystallization degree were compounded at a ratio (addition amount [on the basis of mass]) shown in Table 1 below.

In the case of a laminate structure, the addition ratio in the respective layers was made to be the same. In this case, the difference in crystallization degree between the polyester fine particle having a high crystallization degree and the pellet was adjusted so as to be the same in PET and PCT.

Further, in some Examples, a master pellet containing the following end cap agent in an amount of 10% by weight of was prepared, and this master pellet was added such that the concentration (% by weight with respect to the polyester) described in Table 3 was obtained.

End cap agent A: polycarbodiimide (trade name: STABAXOL P400, manufactured by Rhein Chemie Corporation)

End cap agent B: Compound 51 in JP-A No. 2011-153209 (monocycle type cyclic carbodiimide)

End cap agent C: Compound 52 in JP-A No. 2011-153209 (bicycle type cyclic carbodiimide)

End cap agent D: Compound 37 in JP-A No. 2011-153209 (tetracycle type cyclic carbodiimide)

End cap agent E: Compound 36 in JP-A No. 2011-153209 (bicycle type cyclic carbodiimide)

End cap agent F: Compound 29 in JP-A No. 2011-153209 (bicycle type cyclic carbodiimide)

After compounding, the resultant was dried such that the moisture content was 50 ppm or less. After drying, melt kneading was carried out by using either of a monoaxial extruder or a biaxial extruder as shown in Table 1 below. Melt kneading by using a monoaxial extruder or a biaxial extruder was carried out in a manner as described below. Subsequently, the molten material (melt) of polyester that had been melt-kneaded by the respective extruder was put through a gear pump and a filter (pore diameter: 50 μm). Thereafter, the resultant was extruded from a die having a width of 0.8 m, and casted on a casting roll (cooling roll) having a diameter of 1.5 m, whose temperature had been adjusted to 10° C.

a) Monoaxial Extruder

The PET pellet, PCT pellet, and polyester fine particle were introduced into a hopper of a monoaxial kneading extruder having a diameter of 250 mm, and melted under an $N_2$ gas flow, at an outlet temperature of 285° C., and then extruded at 3 t/hr. In this process, the temperature of the inlet portion of the extruder was lowered by the quantity of temperature shown in Table 1 below.

b) Biaxial Extruder

The PET pellet, PCT pellet, and polyester fine particle were introduced into a hopper of a biaxial kneading extruder having a diameter of 200 mm, and melted under an $N_2$ gas flow, at an outlet temperature of 285° C., and then extruded at 3 t/hr. In this process, the inlet portion of the extruder was lowered by the quantity of temperature shown in Table 1 below. Note that, the rotational direction of the screws was made to be the same rotational direction.

The resin thus kneaded was extruded through a gear pump, a filter, and a die, and was solidified on a cooling drum to prepare an unstretched film, and this unstretched film was subjected to longitudinal stretching. In some Examples (described in Table 3 below), the kneaded resin was extruded through a feed block die, to obtain an unstretched film having a laminate structure.

The laminate structure had three layers, in which the upper layer and the lower layer were a PCT layer, and the center layer was a PET layer. The thicknesses of the respective layers are shown in Table 3. The upper and lower PCT layers were the same layer, and the CHDM content thereof is shown in Table 3. Regarding PET, the PET described above was used. Extrusion and casting were carried out under the same conditions (described in Table 3) in both PCT and PET.

—5. Longitudinal Stretching—

Using two pairs of nip rolls, longitudinal stretching was carried out, by applying circumferential speed difference between one of the nip roll pairs and the other pair. The temperature of the stretch initiation point was set at 90° C., and the temperature of the outlet side was made higher than the temperature of the inlet side by the quantity of temperature shown in Table 1 below. Such a temperature gradient (outlet temperature−inlet temperature>0° C.), in which the temperature rises from the inlet side toward the outlet side, was achieved by providing three light-concentration type radiation heaters between the two pairs of nip rollers and adjusting the output.

By performing adjustment of the distance between the nip rolls, the neck-in length shown in Table 1 below was adjusted. The longitudinal stretch ratio was as shown in Table 1 below.

—6. Horizontal Stretching and Heat Setting—

After the longitudinal stretching, horizontal stretching was performed at 100° C. and at a stretch ratio shown in Table 1 below. Thereafter, heat setting was carried out at an average temperature shown in Table 1, and desired biaxially stretched PET and PCT films were prepared. In this process, temperature modulation in a temperature difference shown in Table 1 below was applied. This temperature modulation was achieved by providing hot air blow-out ports at five points in the heat setting zone for carrying out heat setting, and changing the temperature. In Examples of the invention, as an example, the temperature of the second point and the fourth point, when counted from the inlet side of the heat setting zone, was made higher by the quantity of temperature shown in Table 1 than the temperature of the first point, the third point, and the fifth point.

The temperature modulation in the heat setting zone is not limited to the above embodiment. For example, the temperature of the second point and the fourth point, when counted from the inlet side of the heat setting zone, may be set lower than the temperature of the first point, the third point, and the fifth point. Alternatively, the heat setting zone is configured such that the temperature is gradually raised from the first point to the third point, when counted from the inlet side, and the temperature is lowered from the third point toward the fifth point. Further, even in an embodiment in which the heat setting zone is configured such that the temperature is gradually lowered from the first point to the third point, when counted from the inlet side of the heat setting zone, and the temperature is raised from the third point toward the fifth, the same results are obtained.

In the heat setting as described above, 5% relaxation treatment was carried out in the width direction.

After the heat setting had finished, the two ends of the film in the width direction were cut, and subjected to thickness adjustment processing. Then, the biaxially stretched PET film having a length of 2000 m was wound.

—7. Evaluation of Film—

With regard to the biaxially stretched PET film prepared as described above, the following measurement and evaluation were performed. The results of the measurement and evaluation are shown in Table 1 below.

(1) Stress Heat Resistant Coefficient a) A biaxially stretched PET film was cut such that the size in the longitudinal direction (MD) and the transverse direction (TD) was 2.5 cm in width×25 cm in length.

b) The film piece obtained by cutting was subjected to humidification for 2 days in an environment of 23° C. and 55% RH, and then subjected to pre-thermo processing for 48 hours (hr) at 150° C. and 0% RH.

c) Plural sheets of this film piece were prepared, and were again subjected to humidification for 2 days in an environment of 23° C. and 55% RH. Thereafter, the film pieces were each put in an oven with the thermo temperature being set at 150° C., 160° C., 170° C., and 180° C., respectively.

d) In this process, the film piece was taken out every 1000 hours in the case of 150° C., every 500 hours in the case of 160° C., every 200 hours in the case of 170° C., and every 100 hours in the case of 180° C., and the tensile stress was measured under the conditions described below. Regarding the film piece that had only been subjected to the pre-thermo processing, the tensile stress was measured as blank. For the tensile stress, stretching was carried out under the measurement conditions of a distance between chucks of 12.5 cm, a film width of 2.5 cm, and a tensile rate of 1.25 cm/min, thereby determining the maximum stress in the tensile test. The measurement was carried out five times, n=5, and the average value was determined, which was designated as the tensile stress.

e) With regard to the respective film pieces that had been thermo-treated at a temperature of 150° C., 160° C., 170° C., and 180° C., respectively, using thermo time to enter the horizontal axis, the values of maximum stress retention, which were determined from the following formula, were plotted on the vertical axis.

Maximum stress retention(%)=100×(Maximum stress at each thermo time)/(Maximum stress after pre-thermo processing)

f) The time at which the maximum stress retention reaches 50% at the thermo temperature t (t=150° C., 160° C., 170° C., or 180° C.) is taken as time T (t), and T(150), T(160), T(170), and T(180) were determined.

g) Using thermo time (t) to enter the horizontal axis, log T(t) was plotted on the vertical axis, and the values thus plotted were linearly approximated (approximation: f(t)) by using the least squares method.

h) The values obtained by substituting t=125° C. in f(t) were determined for MD and TD, respectively, and the lower value was designated as the stress heat resistant coefficient.

(2) Wet Thermo Retention

A sample piece having a size of 1 cm×20 cm was cut out from the biaxially stretched PET film and this sample piece was subjected to aging at 120° C. and 100% RH for 100 hours. With regard to this sample piece, each of the sample piece before aging and the sample piece after aging was stretched under the conditions of a distance between chucks of 5 cm and a tensile rate of 20%/min, to determine the elongation degree at break (elongation percentage; %), which is designated as the breaking elongation (%). The breaking elongation S(0) before aging and the breaking elongation S(120) after aging were determined, and the wet thermo retention was calculated according to the following equation.

Wet thermo retention(%)=100×S(120)/S(0)　　　Equation (2)

(3) Maximum Stress after Dry Thermo Processing at 150° C. for 48 Hours (hr)

a) The biaxially stretched PET film obtained was cut in both directions of MD direction and TD direction into a size of 25 mm×250 mm to prepare a sample piece, and this sample piece was subjected to humidification for 2 days in an environment of 23° C. and 55% RH.

b) This sample piece was subjected to heat treatment under non-tensile force for 48 hours in a dry thermo environment at 150° C., and then subjected to humidification for 2 days under the environment conditions of 23° C. and 55% RH.

c) The sample piece that had been subjected to humidification was stretched until the sample piece broke, under the conditions of a distance between chucks of 12.5 cm and a tensile rate of 1.25 cm/min, and the maximum stress at break in the tensile test was determined.

d) This operation was performed five times for each of the MD direction and TD direction, and the average values of the measured values were determined. The smaller value of the average values was designated as the "maximum stress in the tensile test after dry thermo processing at 150° C. for 48 hr".

(4) Yield Stress after Dry Thermo Processing at 180° C. for 100 Hours (hr)

a) The biaxially stretched PET film obtained was cut in both directions of MD direction and TD direction into a size of 25 mm×250 mm to prepare a sample piece, and this sample piece was subjected to humidification for 2 days in an environment of 23° C. and 55% RH.

b) This sample piece was subjected to heat treatment under non-tensile force for 100 hours in a dry thermo environment at 180° C., and then subjected to humidification for 2 days under the environment conditions of 23° C. and 55% RH.

c) The sample piece that had been subjected to humidification was stretched until the sample piece broke, under the conditions of a distance between chucks of 12.5 cm and a tensile rate of 1.25 cm/min, and the elongation degree at break and stress were determined. A relational line (curve)

was drawn on a two-dimensional graph which shows elongation degree on the horizontal axis and stress on the vertical axis. Then, the stress at the point (where the stress curve becomes flat) where the differential value of the elongation degree-stress curve is 0 (zero) in the region between the elongation degree=1% to 10% was determined.

d) This operation was performed five times for each of the MD direction and TD direction, and the average values of the measured values were determined. The smaller value of the average values was designated as the "yield stress after dry thermo processing at 180° C. for 100 hr".

(5) IV and AV a) Intrinsic Viscosity (IV; unit: dL/g)

The biaxially stretched PET film obtained was dissolved in a mixed solvent of 1,1,2,2-tetrachloroethane/phenol (=2/3 [mass ratio]), and the intrinsic viscosity was determined from the solution viscosity at 25° C. in the mixed solvent.

b) Terminal COOH Amount (AV; unit: eq (equivalent)/ton)

The biaxially stretched PET film obtained was completely dissolved in a mixed solution of benzyl alcohol/chloroform (=2/3; volume ratio), and the solution was titrated with a standard solution (0.025 N KOH-methanol mixed solution), using phenol red as an indicator, and the terminal carboxyl group amount was calculated from the titer.

In the case of a laminated film, all the layers therein were dissolved, and IV and AV were measured according to the above methods.

(6) Crystallization Degree

The crystallization degree was determined as follows. Namely, a density gradient tube containing carbon tetrachloride and n-hexane was prepared, and floats with a known specific gravity were introduced into this tube, to prepare a calibration curve. Then, the biaxially stretched PET film obtained was introduced and the specific gravity was measured. Taking the specific gravity of complete non-crystal as 1.335, and the specific gravity of complete crystal as 1.501, the crystallization degree was determined from Equation (IX) described above. Here, the "float" is a substance obtained by placing a weight inside a hollow glass ball, to have a predetermined specific gravity (density).

(7) Neck-In Length

The width of the polyester sheet (original sheet) before longitudinal stretching was measured (the value is taken as A), and subsequently, the width of the polyester film after longitudinal stretching was measured (the value is taken as B). Substituting the obtained A and B in the following equation, the neck-in length was calculated. The amount obtained by calculation is shown in Table 1 below.

Neck-in length(%)=100×{(A−B)/A}

(8) Thickness

The thickness of the biaxially stretched PET film obtained was determined as follows.

The thickness of the biaxially stretched PET film was measured using a contact-type film thickness measuring instrument (manufactured by Anritsu Corporation). 50 points were sampled at regular intervals over 0.5 m in the longitudinally stretched direction (longitudinal direction) and further, 50 points were sampled at regular intervals (dividing into 50 equal divisions in the width direction) over the entire width of film in the film width direction (the direction perpendicular to the longitudinal direction). Thereafter, the thicknesses of these 100 points were measured. The average thickness of these 100 points was calculated, which was designated as the thickness of the polyester film. The obtained thickness is shown in Table 1 below.

(9) Half-Value Stress Period

The biaxially stretched PET film obtained was subjected to dry thermo processing under the conditions of 180° C. and 0% RH, and the PET film after processing was stretched under the measurement conditions of a distance between chucks of 12.5 cm, a film width of 2.5 cm, and a tensile rate of 1.25 cm/min. The maximum stress (tensile stress) in the tensile test was determined, and the half-value stress period was calculated.

(10) Solar Cell Characteristic

The biaxially stretched PET film obtained as described above was integrated into a solar cell, and disconnection of wiring was evaluated according to the following method.

Namely, according to Example 1 described in paragraphs [0088] to [0095] of JP-A No. 2010-141206, after the preparation of a solar cell module, this module was left for 1,000 hours in a temperature environment of 100° C. Thereafter, the number of disconnected points in the wiring which was wired inside the solar cell was counted, and the number of occurrence per unit area (1 m$^2$) was counted. The number of occurrence is shown in Table 1 below.

TABLE 1

| | Solid PP | | Pellet | AdFPHCD | | Extruder | | O. Sh | L. Stretch | | | | |
|---|---|---|---|---|---|---|---|---|---|---|---|---|---|
| | Temp ° C. | Time hrs | Cryst % | Ad. A % | D. Cr % | D. T ° C. | M or B | Cryst % | NIL % | D. T ° C. | S. R | HSt. S. R |
| E. 1 | 200 | 24 | 40 | 0.02 | 10 | 25 | B | 3 | 22 | 6 | 3.5 | 4– |
| CE. 1 | 210 | 15 | 39 | 0 | — | 15 | B | 0.8 | 15 | 4 | 3.4 | 4.2 |
| E. 2 | 210 | 15 | 39 | 0.001 | 10 | 15 | B | 1.2 | 15 | 4 | 3.4 | 4.2 |
| E. 3 | 210 | 15 | 39 | 0.002 | 10 | 15 | B | 2.5 | 15 | 4 | 3.4 | 4.2 |
| E. 4 | 210 | 15 | 39 | 0.01 | 10 | 15 | B | 4.5 | 15 | 4 | 3.4 | 4.2 |
| E. 5 | 210 | 15 | 39 | 0.05 | 10 | 15 | B | 6 | 15 | 4 | 3.4 | 4.2 |
| E. 6 | 210 | 15 | 39 | 0.1 | 10 | 15 | B | 7 | 15 | 4 | 3.4 | 4.2 |
| CE. 2 | 210 | 15 | 39 | 0.11 | 10 | 15 | B | 9 | 15 | 4 | 3.4 | 4.2 |
| CE. 3 | 210 | 15 | 39 | 0.005 | 4 | 15 | B | 1.4 | 15 | 4 | 3.4 | 4.3 |
| E. 7 | 210 | 15 | 39 | 0.005 | 5 | 15 | B | 2 | 15 | 4 | 3.4 | 4.3 |
| E. 8 | 210 | 15 | 39 | 0.005 | 20 | 15 | B | 4 | 15 | 4 | 3.4 | 4.3 |
| CE. 4 | 210 | 15 | 39 | 0.005 | 21 | 15 | B | 7.5 | 15 | 4 | 3.4 | 4.3 |
| E. 9 | 190 | 50 | 38 | 0.007 | 7 | 4 | M | 0 | 25 | 6 | 3.6 | 4.1 |
| E. 10 | 190 | 50 | 38 | 0.007 | 7 | 5 | M | 0.5 | 25 | 6 | 3.6 | 4.1 |
| E. 11 | 190 | 50 | 38 | 0.007 | 7 | 7 | M | 1 | 25 | 6 | 3.6 | 4.1 |
| E. 12 | 190 | 50 | 38 | 0.007 | 7 | 25 | M | 3 | 25 | 6 | 3.6 | 4.1 |
| E. 13 | 190 | 50 | 38 | 0.007 | 7 | 42 | M | 6 | 25 | 6 | 3.6 | 4.1 |
| E. 14 | 190 | 50 | 38 | 0.007 | 7 | 50 | M | 10 | 25 | 6 | 3.6 | 4.1 |

TABLE 1-continued

| | | | | | | | | | | | | |
|---|---|---|---|---|---|---|---|---|---|---|---|---|
| E. 15 | 190 | 50 | 38 | 0.007 | 7 | 55 | M | 12 | 25 | 6 | 3.6 | 4.1 |
| E. 16 | 230 | 10 | 36 | 0.028 | 7 | 10 | B | 2 | 8 | 0 | 3.2 | 3.7 |
| E. 17 | 230 | 10 | 36 | 0.028 | 7 | 10 | B | 2 | 10 | 1 | 3.2 | 3.7 |
| E. 18 | 230 | 10 | 36 | 0.028 | 7 | 10 | B | 2 | 12 | 1.5 | 3.2 | 3.7 |
| E. 19 | 230 | 10 | 36 | 0.028 | 7 | 10 | B | 2 | 21 | 5 | 3.2 | 3.7 |
| E. 20 | 230 | 10 | 36 | 0.028 | 7 | 10 | B | 2 | 32 | 8 | 3.2 | 3.7 |
| E. 21 | 230 | 10 | 36 | 0.028 | 7 | 10 | B | 2 | 35 | 10 | 3.2 | 3.7 |
| E. 22 | 230 | 10 | 36 | 0.028 | 7 | 10 | B | 2 | 36 | 11 | 3.2 | 3.7 |
| E. 23 | 180 | 100 | 43 | 0.01 | 18 | 35 | M | 5 | 20 | 6 | 3.5 | 3.9 |
| E. 24 | 180 | 100 | 43 | 0.01 | 18 | 35 | M | 5 | 20 | 6 | 3.5 | 3.9 |
| E. 25 | 180 | 100 | 43 | 0.01 | 18 | 35 | M | 5 | 20 | 6 | 3.5 | 3.9 |
| E. 26 | 180 | 100 | 43 | 0.01 | 18 | 35 | M | 5 | 20 | 6 | 3.5 | 3.9 |
| E. 27 | 180 | 100 | 43 | 0.01 | 18 | 35 | M | 5 | 20 | 6 | 3.5 | 3.9 |
| E. 28 | 180 | 100 | 43 | 0.01 | 18 | 35 | M | 5 | 20 | 6 | 3.5 | 3.9 |
| E. 29 | 180 | 100 | 43 | 0.01 | 18 | 35 | M | 5 | 20 | 6 | 3.5 | 3.9 |
| E. 30 | 185 | 70 | 37 | 0.01 | 18 | 35 | B | 5 | 20 | 6 | 3.5 | 3.9 |
| E. 31 | 185 | 70 | 37 | 0.01 | 18 | 35 | B | 5 | 20 | 6 | 3.5 | 3.9 |
| E. 32 | 185 | 70 | 37 | 0.01 | 18 | 35 | B | 5 | 20 | 6 | 3.5 | 3.9 |
| E. 33 | 185 | 70 | 37 | 0.01 | 18 | 35 | B | 5 | 20 | 6 | 3.5 | 3.9 |
| E. 34 | 215 | 20 | 42 | 0.007 | 12 | 20 | B | 4 | 28 | 8 | 3.3 | 3.9 |
| E. 35 | 215 | 20 | 42 | 0.007 | 12 | 20 | M | 2 | 28 | 8 | 3.3 | 3.9 |
| CE. 5 | 220 | 30 | 35 | 0 | — | 0 | M | 0.2 | 5 | 0 | 3.3 | 4 |
| E. 36 | 220 | 30 | 35 | 0.02 | 10 | 25 | B | 3 | 21 | 6 | 3.3 | 4 |
| CE. 6 | 210 | 12 | 37 | 0 | — | 0 | M | 0.3 | 7 | 0 | 3.3 | 3.6 |
| E. 37 | 210 | 12 | 37 | 0.02 | 10 | 25 | B | 3 | 23 | 6 | 3.3 | 3.6 |
| E. 38 | 180 | 12 | 28 | 0.015 | 8 | 20 | B | 4 | 20 | 5 | 3.4 | 4.1 |
| E. 39 | 180 | 15 | 30 | 0.015 | 8 | 20 | B | 4 | 20 | 5 | 3.4 | 4.1 |
| E. 40 | 210 | 80 | 48 | 0.015 | 8 | 20 | B | 4 | 20 | 5 | 3.4 | 4.1 |
| E. 41 | 210 | 70 | 52 | 0.015 | 8 | 20 | B | 4 | 20 | 5 | 3.4 | 4.1 |

| | H. Set | | Physical Properties after Film Formation | | | | | | | B. Sht |
|---|---|---|---|---|---|---|---|---|---|---|
| | A. T. °C. | T. M. °C. | SHR | WTR % | M. S MPa | Y. S MPa | HVS hrs | IV dl/g | AV eq/t | Thk μm | NDP/m² |
| E. 1 | 195 | 8 | 4 | 95 | 215 | 108 | 3000 | 0.75 | 8 | 100 | 0 |
| CE. 1 | 190 | 5 | 2.8 | 25 | 170 | 90 | 400 | 0.64 | 21 | 75 | 128 |
| E. 2 | 190 | 5 | 3.1 | 35 | 180 | 95 | 500 | 0.65 | 20 | 75 | 38 |
| E. 3 | 190 | 5 | 3.2 | 45 | 185 | 100 | 600 | 0.68 | 17 | 75 | 18 |
| E. 4 | 190 | 5 | 4 | 80 | 210 | 112 | 2000 | 0.75 | 15 | 75 | 10 |
| E. 5 | 190 | 5 | 3.3 | 80 | 225 | 117 | 1000 | 0.75 | 15 | 75 | 19 |
| E. 6 | 190 | 5 | 3 | 80 | 130 | 120 | 700 | 0.75 | 15 | 75 | 35 |
| CE. 2 | 190 | 5 | 2.7 | 80 | 240 | 125 | 350 | 0.75 | 15 | 75 | 115 |
| CE. 3 | 200 | 5 | 2.7 | 25 | 170 | 85 | 400 | 0.63 | 22 | 125 | 108 |
| E. 7 | 200 | 5 | 3.1 | 35 | 185 | 95 | 600 | 0.67 | 19 | 125 | 28 |
| E. 8 | 200 | 5 | 5 | 85 | 225 | 115 | 600 | 0.78 | 12 | 125 | 29 |
| CE. 4 | 200 | 5 | 6 | 85 | 245 | 135 | 400 | 0.78 | 12 | 125 | 110 |
| E. 9 | 195 | 12 | 3.1 | 40 | 180 | 98 | 550 | 0.68 | 18 | 200 | 45 |
| E. 10 | 195 | 12 | 3.2 | 50 | 185 | 100 | 650 | 0.71 | 16 | 200 | 37 |
| E. 11 | 195 | 12 | 3.4 | 85 | 190 | 103 | 800 | 0.73 | 14 | 200 | 21 |
| E. 12 | 195 | 12 | 3.6 | 90 | 205 | 108 | 1200 | 0.76 | 12 | 200 | 12 |
| E. 13 | 195 | 12 | 3.8 | 85 | 220 | 112 | 750 | 0.73 | 14 | 200 | 22 |
| E. 14 | 195 | 12 | 4 | 65 | 225 | 116 | 600 | 0.70 | 16 | 200 | 31 |
| E. 15 | 195 | 12 | 5 | 40 | 230 | 118 | 500 | 0.68 | 18 | 200 | 49 |
| E. 16 | 205 | 8 | 3.1 | 40 | 185 | 100 | 550 | 0.88 | 18 | 250 | 45 |
| E. 17 | 205 | 8 | 3.2 | 42 | 190 | 105 | 650 | 0.88 | 18 | 250 | 35 |
| E. 18 | 205 | 8 | 3.4 | 44 | 200 | 110 | 1100 | 0.88 | 18 | 250 | 27 |
| E. 19 | 205 | 8 | 3.8 | 46 | 220 | 115 | 1750 | 0.88 | 18 | 250 | 18 |
| E. 20 | 205 | 8 | 3.3 | 43 | 205 | 111 | 1000 | 0.88 | 18 | 250 | 28 |
| E. 21 | 205 | 8 | 3.2 | 41 | 195 | 108 | 650 | 0.88 | 18 | 250 | 34 |
| E. 22 | 205 | 8 | 3.1 | 40 | 185 | 102 | 550 | 0.88 | 18 | 250 | 43 |
| E. 23 | 185 | 0 | 3.1 | 100 | 185 | 100 | 580 | 0.8 | 4 | 50 | 41 |
| E. 24 | 185 | 1 | 3.2 | 100 | 190 | 102 | 620 | 0.8 | 4 | 50 | 26 |
| E. 25 | 185 | 2 | 3.5 | 100 | 200 | 105 | 680 | 0.8 | 4 | 50 | 12 |
| E. 26 | 185 | 10 | 4.2 | 100 | 215 | 110 | 960 | 0.8 | 4 | 50 | 5 |
| E. 27 | 185 | 18 | 3.7 | 100 | 205 | 106 | 750 | 0.8 | 4 | 50 | 12 |
| E. 28 | 185 | 20 | 3.3 | 100 | 192 | 103 | 680 | 0.8 | 4 | 50 | 25 |
| E. 29 | 185 | 22 | 3.1 | 100 | 188 | 100 | 560 | 0.8 | 4 | 50 | 39 |
| E. 30 | 170 | 6 | 3.1 | 95 | 185 | 98 | 550 | 0.8 | 8 | 350 | 32 |
| E. 31 | 180 | 6 | 3.3 | 96 | 190 | 102 | 650 | 0.8 | 8 | 350 | 16 |
| E. 32 | 210 | 6 | 3.2 | 96 | 195 | 100 | 600 | 0.8 | 8 | 350 | 17 |
| E. 33 | 215 | 6 | 3 | 95 | 180 | 95 | 500 | 0.8 | 8 | 350 | 34 |
| E. 34 | 200 | 10 | 3.5 | 80 | 220 | 105 | 1500 | 0.77 | 16 | 150 | 15 |
| E. 35 | 200 | 10 | 3.1 | 65 | 185 | 98 | 700 | 0.72 | 20 | 150 | 22 |
| CE. 5 | 230 | 0 | 2.5 | 65 | 165 | 85 | 400 | 0.69 | 10 | 50 | 187 |
| E. 36 | 205 | 8 | 3.6 | 70 | 200 | 105 | 950 | 0.69 | 10 | 50 | 5 |
| CE. 6 | 220 | 0 | 2.2 | 45 | 160 | 80 | 370 | 0.71 | 25 | 250 | 195 |
| E. 37 | 205 | 8 | 3.6 | 50 | 195 | 107 | 1000 | 0.71 | 20 | 250 | 8 |
| E. 38 | 200 | 6 | 3.1 | 35 | 175 | 90 | 450 | 0.68 | 19 | 100 | 57 |
| E. 39 | 200 | 6 | 3.5 | 40 | 185 | 95 | 550 | 0.69 | 18 | 100 | 17 |

TABLE 1-continued

| E. 40 | 200 | 6 | 3.4 | 45 | 225 | 115 | 550 | 0.87 | 16 | 100 | 19 |
| E. 41 | 200 | 6 | 3.1 | 40 | 235 | 125 | 400 | 0.89 | 17 | 100 | 50 |

In Table 1, the abbreviation "E." denotes "Example Number", the abbreviation "CE." denotes "Comparative Example Number", the abbreviation "Solid PP" denotes "Solid Phase Polymerization", the abbreviation "Temp" denotes "Temperature", the abbreviation "Time" denotes "Retention Time", the abbreviation "Cryst" denotes "Crystallization Degree", the abbreviation "AdFPHCD" denotes "Addition of Fine Particle Having High Crystallization Degree", the abbreviation "Ad.A" denotes "Addition Amount", the abbreviation "D.Cr." denotes "Difference in crystallization degree between the polyester fine particle having a high crystallization degree and the pellet", the abbreviation "M" denotes "Monoaxial Extruder", the abbreviation "B" denotes "Biaxial Extruder", the abbreviation "O.Sh" denotes "Original Sheet", the abbreviation "L. Stretch" denotes "Longitudinal Stretching", the abbreviation "NIL" denotes "Neck-in Length", the abbreviation "D.T." denotes "Difference between Outlet Temperature with Inlet Temperature (outlet temperature–inlet temperature)", the abbreviation "S.R" denotes "Stretch Ratio", the abbreviation "HSt." denotes "Horizontal Stretching", the abbreviation "H.Set" denotes "Heat Setting", the abbreviation "A.T." denotes "Average Temperature", the abbreviation "T.M." denotes "Temperature Modulation", the abbreviation "SHR" denotes "Stress Heat Resistant Coefficient", the abbreviation "WTR" denotes "Wet Thermo Retention", the abbreviation "M.S." denotes "Maximum Stress after Dry Thermo Processing at 150° C. for 48 Hours", the abbreviation "Y.S." denotes "Yield Stress after Dry Thermo Processing at 180° C. for 100 Hours", and the abbreviation "HVS" denotes "Half-Value Stress Period", the abbreviation "Thk" denotes "Thickness", the abbreviation "B.Sht" denotes "Back Sheet" and the abbreviation "NDP" denotes "Number of Disconnected Points in the Wiring".

As shown in Table 1 above, in Examples, the maximum stress in the tensile test of the polyester film was high and a favorable mechanical strength was stably exhibited even after dry thermo processing or after wet thermo processing. Further, in the case of being prepared into a solar cell, it was possible to reduce the number of disconnected points in the internal wiring to a small number.

In contrast, in a case in which a polyester fine particle was not used, or in a case in which the amount of polyester fine particles was too much, the breaking elongation that represents the wet heat resistance was lowered, as well as reduction of the stress that represents the heat resistance was significant. Further, in the case of being prepared into a solar cell, disconnection of internal wiring occurred significantly.

Examples obtained by adding an end cap agent to Example 1 are shown in Table 2.

The end cap agent was selected from the following end cap agents, and was added to the raw material pellets as a master pellet. (In Table 2, the following abbreviation a) to f) are described.)

a) Carbodiimide: STABILIZER 9000 (trade name, manufactures by Raschig GmbH); Mw=23,000 b) Carbodiimide: STABAXOL P (trade name, manufactured by Rhein Chemie Corporation); Mw=2,600 c) Carbodiimide: N,N'-dicyclohexylcarbodiimide; Mw=206 d) Carbodiimide: cyclic carbodiimide compound (2) described in JP-A No. 2011-153209 [0174-5]); Mw=516 e) Epoxy: chain lengthening agent 1 described in JP-A No. 2010-116560 [0115]; Mw=3,300 f) Oxazoline: EPOCROS RPS-1005 (trade name, manufactured by Nippon Shokubai Co., Ltd.); Mw=5000

Example 101 showed the best mode. In Examples 102 to 106, examples in which the amount of the end cap agent is increased with respect to Example 3 are shown. By the addition amount according to the invention, a favorable result was obtained. In Examples 107 to 112, the effects of the kind of the end cap agent are shown. Among the polycarbodiimide type end cap agents, a) which has a high molecular weight and d) which is a cyclic end cap agent gave favorable results. It is guessed that these end cap agents are less likely to evaporate during film formation, and the end cap agents acted effectively. Further, regarding the kind of the end cap agent, favorable results were obtained in the order of (favorable) carbodiimide>epoxy>oxazoline. It is guessed that the end cap ability (reactivity) was higher in this order.

TABLE 2

| | Solid PP | | Pelt | AdFPHCD | | ECA | | Extruder | | O. Sh | L. Stretch | | |
|---|---|---|---|---|---|---|---|---|---|---|---|---|---|
| | Tem °C. | Tim hrs | Crt % | Ad. A % | D. Cr % | Kd | At wt % | D. T °C. | M or B | Crt % | NIL % | D. T °C. | S. R |
| E. 101 | 200 | 24 | 40 | 0.02 | 10 | a | 1 | 25 | B | 3 | 22 | 6 | 3.5 |
| E. 102 | 210 | 15 | 39 | 0.002 | 10 | a | 0.1 | 15 | B | 2.5 | 15 | 4 | 3.4 |
| E. 103 | 210 | 15 | 39 | 0.002 | 10 | a | 0.2 | 15 | B | 2.5 | 15 | 4 | 3.4 |
| E. 104 | 210 | 15 | 39 | 0.002 | 10 | a | 1 | 15 | B | 2.5 | 15 | 4 | 3.4 |
| E. 105 | 210 | 15 | 39 | 0.002 | 10 | a | 5 | 15 | B | 2.5 | 15 | 4 | 3.4 |
| E. 106 | 210 | 15 | 39 | 0.002 | 10 | a | 10 | 15 | B | 2.5 | 15 | 4 | 3.4 |
| E. 107 | 210 | 15 | 39 | 0.002 | 10 | a | 0.8 | 15 | B | 2.5 | 15 | 4 | 3.4 |
| E. 108 | 210 | 15 | 39 | 0.002 | 10 | b | 0.8 | 15 | B | 2.5 | 15 | 4 | 3.4 |
| E. 109 | 210 | 15 | 39 | 0.002 | 10 | c | 0.8 | 15 | B | 2.5 | 15 | 4 | 3.4 |
| E. 110 | 210 | 15 | 39 | 0.002 | 10 | d | 0.8 | 15 | B | 2.5 | 15 | 4 | 3.4 |
| E. 111 | 210 | 15 | 39 | 0.002 | 10 | e | 0.8 | 15 | B | 2.5 | 15 | 4 | 3.4 |
| E. 112 | 210 | 15 | 39 | 0.002 | 10 | f | 0.8 | 15 | B | 2.5 | 15 | 4 | 3.4 |

TABLE 2-continued

|   | H. Set | | | Physical Properties after Film Formation | | | | | | | | B. Sht |
|---|---|---|---|---|---|---|---|---|---|---|---|---|
|   | HSt. S. R | A. T. °C. | T. M. °C. | SHR | WTR % | M. S MPa | Y. S MPa | HVS hrs | IV dl/g | AV eq/t | Thk μm | NDP/ m² |
| E. 101 | 4 | 195 | 8 | 4 | 98 | 210 | 105 | 3000 | 0.76 | 5 | 100 | 0 |
| E. 102 | 4.2 | 190 | 5 | 3.4 | 60 | 185 | 105 | 1000 | 0.71 | 12 | 75 | 8 |
| E. 103 | 4.2 | 190 | 5 | 3.5 | 65 | 180 | 105 | 1500 | 0.73 | 10 | 75 | 4 |
| E. 104 | 4.2 | 190 | 5 | 3.8 | 79 | 180 | 110 | 2500 | 0.75 | 7 | 75 | 0 |
| E. 105 | 4.2 | 190 | 5 | 3.5 | 66 | 183 | 105 | 1800 | 0.73 | 9 | 75 | 3 |
| E. 106 | 4.2 | 190 | 5 | 3.4 | 62 | 185 | 105 | 1200 | 0.72 | 11 | 75 | 5 |
| E. 107 | 4.2 | 190 | 5 | 3.8 | 79 | 180 | 110 | 2500 | 0.74 | 7 | 200 | 0 |
| E. 108 | 4.2 | 190 | 5 | 3.6 | 76 | 180 | 105 | 2100 | 0.73 | 9 | 200 | 2 |
| E. 109 | 4.2 | 190 | 5 | 3.5 | 73 | 185 | 105 | 1700 | 0.72 | 11 | 200 | 5 |
| E. 110 | 4.2 | 190 | 5 | 3.8 | 79 | 180 | 110 | 2400 | 0.73 | 7 | 200 | 0 |
| E. 111 | 4.2 | 190 | 5 | 3.4 | 71 | 185 | 105 | 1300 | 0.74 | 13 | 200 | 7 |
| E. 112 | 4.2 | 190 | 5 | 3.3 | 69 | 185 | 103 | 1000 | 0.73 | 15 | 200 | 8 |

In Table 2, the abbreviation "E." denotes "Example Number", the abbreviation "Solid PP" denotes "Solid Phase Polymerization", the abbreviation "Tem" denotes "Temperature", the abbreviation "Tim" denotes "Retention Time", the abbreviation "Pelt" denotes "Pellet", the abbreviation "Crt" denotes "Crystallization Degree", the abbreviation "AdFPHCD" denotes "Addition of Fine Particle Having High Crystallization Degree", the abbreviation "Ad.A" denotes "Addition Amount", the abbreviation "D.Cr." denotes "Difference in crystallization degree between the polyester fine particle having a high crystallization degree and the pellet", the abbreviation "ECA" denotes "End Cap Agent", the abbreviation "Kd" denotes "Kind", the abbreviation "At" denotes "Amount", the abbreviation "M" denotes "Monoaxial Extruder", the abbreviation "B" denotes "Biaxial Extruder", the abbreviation "O.Sh" denotes "Original Sheet", the abbreviation "L. Stretch" denotes "Longitudinal Stretching", the abbreviation "NIL" denotes "Neck-in Length", the abbreviation "D.T." denotes "Difference between Outlet Temperature with Inlet Temperature (outlet temperature−inlet temperature)", the abbreviation "S.R" denotes "Stretch Ratio", the abbreviation "HSt." denotes "Horizontal Stretching", the abbreviation "H.Set" denotes "Heat Setting", the abbreviation "A.T." denotes "Average Temperature", the abbreviation "T.M." denotes "Temperature Modulation", the abbreviation "SHR" denotes "Stress Heat Resistant Coefficient", the abbreviation "WTR" denotes "Wet Thermo Retention", the abbreviation "M.S." denotes "Maximum Stress after Dry Thermo Processing at 150° C. for 48 Hours", the abbreviation "Y.S." denotes "Yield Stress after Dry Thermo Processing at 180° C. for 100 Hours", and the abbreviation "HVS" denotes "Half-Value Stress Period", the abbreviation "Thk" denotes "Thickness", the abbreviation "B.Sht" denotes "Back Sheet" and the abbreviation "NDP" denotes "Number of Disconnected Points in the Wiring".

The folding strength measured by the method described below is shown in Table 3. When the CHDM content increases, brittleness is increased and, as a result, the folding strength property is lowered. However, by introducing a laminate structure, the bending resistance is improved.

(Evaluation Method of Folding Strength Property)
Using an MIT folding resistance strength tester according to ISO 08776/2-1988, the film after film formation (before thermo processing) was folded 100 times.
The folded portion of this film was observed at 10 magnifications with an optical microscope, and the number of generated crazes (cracks) was counted and is shown in Table 3. A smaller number of crazes indicates that the folding resistance is better.
As the higher the brittleness is, craze is more liable to occur and, in a case in which, after pasting the film to a solar cell, nonconformity has occurred and the film is peeled and reused (reworked), insulating property may be easily deteriorated because of the craze, which is not preferred. (Therefore, this evaluation is carried out with respect to the film before thermo test.)

TABLE 3

| | Resin | | | AdFPHCD | | ECA | | Extruder | | O. | | L. Stretch | | | | H. Set | |
|---|---|---|---|---|---|---|---|---|---|---|---|---|---|---|---|---|---|
| | CHDM Cont. mol % | Solid PP Tem °C. | Tim hrs | Pelt Crt % | Ad. A % | D. Cr % | At Kd | At wt % | D. T °C. | M or B | Sh Crt % | Layer Configuration | NIL TnkREL | D. T % | S. R °C. | HSt. S. R | A. T. T. °C. | T. M. °C. |
| E. 201 | 0.1 | 200 | 24 | 36 | 0.01 | 5 | — | 0 | 15 | B | 3 | PCT M. L | — | 18 | 3 | 3.5 | 4 | 195 | 5 |
| E. 202 | 10 | 200 | 24 | 36 | 0.01 | 5 | — | 0 | 15 | B | 3 | PCT M. L | — | 18 | 3 | 3.5 | 4 | 195 | 5 |
| E. 202-2 | 10 | 200 | 24 | 36 | 0.01 | 5 | a | 1 | 15 | B | 3 | PCT M. L | — | 18 | 3 | 3.5 | 4 | 195 | 5 |
| E. 203 | 20 | 200 | 24 | 36 | 0.01 | 5 | — | 0 | 15 | B | 3 | PCT M. L | — | 18 | 3 | 3.5 | 4 | 195 | 5 |
| E. 203-2 | 25 | 200 | 24 | 36 | 0.01 | 5 | — | 0 | 15 | B | 3 | PCT M. L | — | 18 | 3 | 3.5 | 4 | 195 | 5 |
| E. 203-3 | 50 | 200 | 24 | 36 | 0.01 | 5 | — | 0 | 15 | B | 3 | PCT M. L | — | 18 | 3 | 3.5 | 4 | 195 | 5 |
| E. 203-4 | 75 | 200 | 24 | 36 | 0.01 | 5 | — | 0 | 15 | B | 3 | PCT M. L | — | 18 | 3 | 3.5 | 4 | 195 | 5 |
| E. 204 | 80 | 200 | 24 | 36 | 0.01 | 5 | — | 0 | 15 | B | 3 | PCT M. L | — | 18 | 3 | 3.5 | 4 | 195 | 5 |
| E. 205 | 100 | 200 | 24 | 36 | 0.01 | 5 | — | 0 | 15 | B | 3 | PCT M. L | — | 18 | 3 | 3.5 | 4 | 195 | 5 |
| E. 206 | 90 | 200 | 24 | 36 | 0.01 | 5 | — | 0 | 15 | B | 3 | PCT/PET/PCT | 5/90/5 | 18 | 3 | 3.5 | 4 | 195 | 5 |
| E. 207 | 90 | 200 | 24 | 36 | 0.01 | 5 | — | 0 | 15 | B | 3 | PCT/PET/PCT | 15/70/15 | 18 | 3 | 3.5 | 4 | 195 | 5 |

TABLE 3-continued

| | | | | | | | | | | | | | | | | | | | | |
|---|---|---|---|---|---|---|---|---|---|---|---|---|---|---|---|---|---|---|---|---|
| E. 207-2 | 90 | 200 | 24 | 36 | 0.01 | 5 | a | 0.5 | 15 | B | 3 | PCT/PET/PCT | 15/70/15 | 18 | 3 | 3.5 | 4 | | 195 | 5 |
| E. 208 | 90 | 200 | 24 | 36 | 0.01 | 5 | — | 0 | 15 | B | 3 | PCT/PET/PCT | 25/50/25 | 18 | 3 | 3.5 | 4 | | 195 | 5 |
| E. 209 | 0 | 210 | 15 | 37 | 0.01 | 15 | a | 1 | 15 | B | 2 | PET M. L | — | 17 | 4 | 3.6 | 4.2 | | 200 | 5 |
| E. 210 | 0 | 210 | 15 | 37 | 0.01 | 15 | c | 1 | 15 | B | 2 | PET M. L | — | 17 | 4 | 3.6 | 4.2 | | 200 | 5 |
| E. 210-2 | 0 | 210 | 15 | 37 | 0.01 | 15 | d | 1 | 15 | B | 2 | PET M. L | — | 17 | 4 | 3.6 | 4.2 | | 200 | 5 |
| E. 210-3 | 0 | 210 | 15 | 37 | 0.01 | 15 | e | 1 | 15 | B | 2 | PET M. L | — | 17 | 4 | 3.6 | 4.2 | | 200 | 5 |
| E. 210-4 | 0 | 210 | 15 | 37 | 0.01 | 15 | f | 1 | 15 | B | 2 | PET M. L | — | 17 | 4 | 3.6 | 4.2 | | 200 | 5 |
| E. 211 | 0 | 210 | 15 | 37 | 0.01 | 15 | b | 1 | 15 | B | 2 | PET M. L | — | 17 | 4 | 3.6 | 4.2 | | 200 | 5 |
| E. 212 | 0 | 210 | 15 | 37 | 0.01 | 15 | b | 2 | 15 | B | 2 | PET M. L | — | 17 | 4 | 3.6 | 4.2 | | 200 | 5 |
| E. 213 | 0 | 210 | 15 | 37 | 0.01 | 15 | b | 0.4 | 15 | B | 2 | PET M. L | — | 17 | 4 | 3.6 | 4.2 | | 200 | 5 |

| | Physical Properties after Film Formation | | | | | | | | B. |
|---|---|---|---|---|---|---|---|---|---|
| | F. S. | SHR | WTR % | M. S. MPa | Y. S. MPa | HVS hrs | IV dl/g | AV eq/t | Thk μm | Sht NDP/m$^2$ |
| E. 201 | 0 | 3.5 | 87 | 210 | 105 | 1700 | 0.79 | 10 | 100 | 2 |
| E. 202 | 0 | 3.8 | 94 | 215 | 110 | 2000 | 0.81 | 8 | 100 | 0 |
| E. 202-2 | 0 | 3.9 | 99 | 220 | 115 | 2300 | 0.83 | 7 | 100 | 0 |
| E. 203 | 0 | 3.5 | 88 | 205 | 105 | 1700 | 0.81 | 9 | 100 | 2 |
| E. 203-2 | 0 | 3.3 | 78 | 185 | 100 | 900 | 0.72 | 12 | 100 | 4 |
| E. 203-3 | 2 | 3.1 | 68 | 180 | 98 | 600 | 0.68 | 16 | 100 | 6 |
| E. 203-4 | 4 | 3.4 | 82 | 185 | 100 | 900 | 0.73 | 12 | 100 | 4 |
| E. 204 | 6 | 3.7 | 91 | 210 | 108 | 1900 | 0.82 | 8 | 100 | 1 |
| E. 205 | 6 | 3.7 | 91 | 215 | 110 | 1900 | 0.83 | 8 | 100 | 1 |
| E. 206 | 1 | 3.8 | 93 | 205 | 107 | 1950 | 0.78 | 9 | 100 | 1 |
| E. 207 | 0 | 3.9 | 96 | 210 | 109 | 2000 | 0.79 | 8 | 100 | 0 |
| E. 207-2 | 0 | 3.9 | 99 | 225 | 115 | 2250 | 0.82 | 7 | 100 | 0 |
| E. 208 | 0 | 3.8 | 93 | 215 | 111 | 1900 | 0.80 | 8 | 100 | 1 |
| E. 209 | 0 | 3.4 | 91 | 200 | 103 | 1700 | 0.79 | 10 | 200 | 3 |
| E. 210 | 0 | 3.6 | 93 | 205 | 106 | 1800 | 0.81 | 8 | 200 | 2 |
| E. 210-2 | 0 | 3.2 | 89 | 200 | 100 | 1600 | 0.77 | 11 | 200 | 4 |
| E. 210-3 | 0 | 3.2 | 88 | 195 | 100 | 1600 | 0.77 | 12 | 200 | 4 |
| E. 210-4 | 0 | 3.2 | 87 | 195 | 100 | 1550 | 0.76 | 12 | 200 | 4 |
| E. 211 | 0 | 3.8 | 95 | 210 | 110 | 2000 | 0.82 | 6 | 200 | 0 |
| E. 212 | 0 | 3.6 | 94 | 205 | 108 | 1800 | 0.84 | 7 | 200 | 1 |
| E. 213 | 0 | 3.5 | 92 | 200 | 106 | 1700 | 0.80 | 9 | 200 | 2 |

In Table 3, the abbreviation "E." denotes "Example Number", the abbreviation "CHDM Cont." denotes "Content of CHDM in PCT", the abbreviation "Solid PP" denotes "Solid Phase Polymerization", the abbreviation "Tem" denotes "Temperature", the abbreviation "Tim" denotes "Retention Time", the abbreviation "Pelt" denotes "Pellet", the abbreviation "Crt" denotes "Crystallization Degree", the abbreviation "AdFPHCD" denotes "Addition of Fine Particle Having High Crystallization Degree", the abbreviation "Ad.A" denotes "Addition Amount", the abbreviation "D.Cr." denotes "Difference in crystallization degree between the polyester fine particle having a high crystallization degree and the pellet", the abbreviation "ECA" denotes "End Cap Agent", the abbreviation "Kd" denotes "Kind", the abbreviation "At" denotes "Amount", the abbreviation "M" denotes "Monoaxial Extruder", the abbreviation "B" denotes "Biaxial Extruder", the abbreviation "O.Sh" denotes "Original Sheet", the abbreviation "PCT M.L" denotes "Monolayer of PCT", the abbreviation "ThkREL" denotes "Thickness Ratio of Each Layer", the abbreviation "L. Stretch" denotes "Longitudinal Stretching", the abbreviation "NIL" denotes "Neck-in Length", the abbreviation "D.T." denotes "Difference between Outlet Temperature with Inlet Temperature (outlet temperature–inlet temperature)", the abbreviation "S.R" denotes "Stretch Ratio", the abbreviation "HSt." denotes "Horizontal Stretching", the abbreviation "H.Set" denotes "Heat Setting", the abbreviation "A.T." denotes "Average Temperature", the abbreviation "T.M." denotes "Temperature Modulation", the abbreviation "F.S." denotes "Folding Strength (number of generated crazes)", the abbreviation "SHR" denotes "Stress Heat Resistant Coefficient", the abbreviation "WTR" denotes "Wet Thermo Retention", the abbreviation "M.S." denotes "Maximum Stress after Dry Thermo Processing at 150° C. for 48 Hours", the abbreviation "YS." denotes "Yield Stress after Dry Thermo Processing at 180° C. for 100 Hours", and the abbreviation "HVS" denotes "Half-Value Stress Period", the abbreviation "Thk" denotes "Thickness", the abbreviation "B.Sht" denotes "Back Sheet" and the abbreviation "NDP" denotes "Number of Disconnected Points in the Wiring".

As is evident from Table 3, in Examples 204 and 205, in which the CHDM ratio was raised, the half-value stress period (heat resistance) was remarkably improved as compared with Examples 203 and 204, but the number of crazes was increased. In contrast, as in Examples 206, 207 and 208, by introducing a laminate form, folding resistance was improved while maintaining the half-value stress period (heat resistance).

INDUSTRIAL APPLICABILITY

The polyester film of the invention can be suitably used for applications such as a back face protective sheet (a so-called back sheet which is provided on the side opposite to the side from which sunlight directly enters) that constitutes a solar cell module.

The foregoing description of the exemplary embodiments of the present invention has been provided for the purposes of illustration and description. It is not intended to be exhaustive or to limit the invention to the precise forms disclosed. The embodiments were chosen and described in order to best explain the principles of the invention and its practical applications, thereby enabling others skilled in the art to understand the invention for various embodiments and with the various modifications as are suited to the particular use contemplated.

This application claims priority from Japanese Patent Application Nos. 2011-184150 filed on Aug. 25, 2011, 20121-021456 filed on Feb. 3, 2012, and 2012-153763 filed on Jul. 9, 2012, the disclosures of which are incorporated by reference herein. All publications, patent applications, and technical standards mentioned in this specification are herein incorporated by reference to the same extent as if such individual publication, patent application, or technical standard was specifically and individually indicated to be incorporated by reference. It will be obvious to those having skill in the art that many changes may be made in the above-described details of the preferred embodiments of the present invention. It is intended that the scope of the invention be defined by the following claims and their equivalents.

What is claimed is:

1. A polyester film, having a stress heat resistant coefficient f(125) that satisfies the following Equation (1) and a wet thermo retention represented by the following Equation (2) of 30% or higher:

[A] stress heat resistant coefficient $5 \geq f(125) \geq 3$      Equation (1)

[B] wet thermo retention (%)=100×S(120)/S(0)      Equation (2)

wherein, in Equation (1), f(125) is a value obtained by substituting t=125° C. in an approximation represented by f(t); t represents a temperature (° C.) at a time of heat treatment (thermo processing); f(t) represents a stress heat resistant coefficient f at a thermo temperature t and represents an approximation to a straight line obtained by linear approximation by a least squares method of values plotted from a relationship between the thermo temperature t and a logarithm (log T(t)) of time T at which a rupture stress is 50% when the thermo temperature t is 150° C., 160° C., 170° C., or 180° C.;

T(150) is a time (hr) at which the maximum stress in a tensile test after thermo processing at 150° C. and 0% RH is 50% of the maximum stress in a tensile test before thermo processing;

T(160) is a time (hr) at which the maximum stress in a tensile test after thermo processing at 160° C. and 0% RH is 50% of the maximum stress in a tensile test before thermo processing;

T(170) is a time (hr) at which the maximum stress in a tensile test after thermo processing at 170° C. and 0% RH is 50% of the maximum stress in a tensile test before thermo processing;

T(180) is a time (hr) at which the maximum stress in a tensile test after thermo processing at 180° C. and 0% RH is 50% of the maximum stress in a tensile test before thermo processing; and S(120) represents a breaking elongation (%) after aging for 100 hours at 120° C. and 100% RH, and S(0) represents a breaking elongation (%) before aging at 120° C. and 100% RH.

2. The polyester film according to claim 1, wherein the maximum stress in a tensile test after dry thermo processing for 48 hours at 150° C. and 0% RH is in a range of from 180 MPa to 230 MPa.

3. The polyester film according to claim 2, wherein a yield stress in a tensile test after dry thermo processing for 100 hours at 180° C. and 0% RH is in a range of from 95 MPa to 120 MPa, and a half-value stress period, at which the maximum stress in the tensile test after dry thermo processing at 180° C. and 0% RH reaches 50% of the maximum stress in the tensile test before dry thermo processing, is 500 hours or more.

4. The polyester film according to claim 3, wherein an intrinsic viscosity (IV) is in a range of from 0.65 dL/g to 0.9 dL/g, and a terminal carboxyl group content (AV) is 20 eq/ton or less.

5. The polyester film according to claim 1, wherein a yield stress in a tensile test after dry thermo processing for 100 hours at 180° C. and 0% RH is in a range of from 95 MPa to 120 MPa.

6. The polyester film according to claim 1, wherein a half-value stress period, at which the maximum stress in the tensile test after dry thermo processing at 180° C. and 0% RH reaches 50% of the maximum stress in the tensile test before dry thermo processing, is 500 hours or more.

7. The polyester film according to claim 1, wherein the polyester film comprises a polyester having an intrinsic viscosity (IV) in a range of from 0.65 dL/g to 0.9 dL/g and a terminal carboxyl group content (AV) of 20 eq/ton or less.

8. A back sheet for a solar cell, comprising the polyester film according to claim 1.

9. A solar cell module, comprising: a transparent front substrate through which sunlight enters; a cell structural portion comprising a solar cell element and a sealing material that seals the solar cell element, the cell structural portion being disposed on the front substrate; and the back sheet for a solar cell according to claim 8, the back sheet being disposed at an opposite side from a side at which the front substrate is disposed with respect to the cell structural portion.

* * * * *